United States Patent
Girard et al.

(10) Patent No.: US 11,124,876 B2
(45) Date of Patent: *Sep. 21, 2021

(54) SI-CONTAINING FILM FORMING PRECURSORS AND METHODS OF USING THE SAME

(71) Applicant: L'Air Liquide, Société Anonyme pour l'Etude et l'Exploitation des Procédés Georges Claude, Paris (FR)

(72) Inventors: Jean-Marc Girard, Versailles (FR); Peng Zhang, Montvale, NJ (US); Antonio Sanchez, Tsukuba (JP); Manish Khandelwal, Somerset, NJ (US); Gennadiy Itov, Flemington, NJ (US); Reno Pesaresi, Easton, PA (US); Grigory Nikiforov, Bridgewater, NJ (US); David Orban, Hampton, NJ (US)

(73) Assignee: L'Air Liquide, Société Anonyme pour l'Etude et l'Exploitation des Procédés Georges Claude, Paris (FR)

(*) Notice: Subject to any disclaimer, the term of this patent is extended or adjusted under 35 U.S.C. 154(b) by 0 days.

This patent is subject to a terminal disclaimer.

(21) Appl. No.: 16/449,070

(22) Filed: Jun. 21, 2019

(65) Prior Publication Data
US 2019/0311894 A1 Oct. 10, 2019

Related U.S. Application Data

(63) Continuation-in-part of application No. 15/692,544, filed on Aug. 31, 2017, now Pat. No. 10,403,494, which is a continuation of application No. 14/738,039, filed on Jun. 12, 2015, now Pat. No. 9,777,025.

(60) Provisional application No. 62/140,248, filed on Mar. 30, 2015.

(51) Int. Cl.
| | | |
|---|---|---|
| *C23C 16/455* | (2006.01) | |
| *H01L 21/02* | (2006.01) | |
| *C01B 21/088* | (2006.01) | |
| *C23C 16/515* | (2006.01) | |
| *C23C 16/40* | (2006.01) | |
| *C23C 16/34* | (2006.01) | |
| *C23C 16/30* | (2006.01) | |
| *C01B 21/087* | (2006.01) | |
| *C07F 7/02* | (2006.01) | |

(52) U.S. Cl.
CPC ...... *C23C 16/45553* (2013.01); *C01B 21/087* (2013.01); *C01B 21/088* (2013.01); *C07F 7/025* (2013.01); *C23C 16/308* (2013.01); *C23C 16/345* (2013.01); *C23C 16/402* (2013.01); *C23C 16/515* (2013.01); *H01L 21/0228* (2013.01); *H01L 21/02222* (2013.01); *C23C 16/45542* (2013.01); *H01L 21/02164* (2013.01)

(58) Field of Classification Search
CPC .................................................. C01B 21/088
See application file for complete search history.

(56) References Cited

U.S. PATENT DOCUMENTS

| | | | |
|---|---|---|---|
| 4,200,666 | A | 4/1980 | Reinberg |
| 4,397,828 | A | 8/1983 | Seyferth et al. |
| 4,675,424 | A | 6/1987 | King, III |
| 4,720,395 | A | 1/1988 | Foster |
| 5,332,853 | A | 7/1994 | Morrison et al. |
| 5,340,507 | A | 8/1994 | Morrison et al. |
| 5,413,813 | A | 5/1995 | Cruse et al. |
| 5,618,579 | A | 4/1997 | Boire et al. |
| 5,663,398 | A | 9/1997 | Schwindeman et al. |

(Continued)

FOREIGN PATENT DOCUMENTS

| | | |
|---|---|---|
| CN | 102173398 | 9/2011 |
| DE | 1 1158 972 | 12/1963 |

(Continued)

OTHER PUBLICATIONS

Abel, E.W. et al., Reactions of aminosilanes and disilazanes with halogeno-compounds of phosphorus and arsenic, Journal of the Chemical Society, Jan. 1965, 57-61.

Abel, E.W. et al., The reactions of some aminosilanes and disilazanes with disulfur dichloride, sulfur dichloride, thionyl chloride, sulfuryl chloride, and sulfonyl chlorides, Journal of the Chemical Society, 1964, 7, 3122-3126.

(Continued)

*Primary Examiner* — Marc S Zimmer

(74) *Attorney, Agent, or Firm* — Yan Jiang

(57) ABSTRACT

Methods for halogenation of a hydrosilazane include contacting the hydrosilazane with a halogenating agent in a liquid phase to produce the halosilazane having a formula $$(SiH_a(NR_2)_bX_c)_{(n+2)}N_n(SiH_{(2-d)}X_d)_{(n-1)},$$

wherein each a, b, c is independently 0 to 3; a+b+c=3; d is 0 to 2 and n≥1; wherein X is selected from a halogen atom selected from F, Cl, Br or I; each R is selected from H, a $C_1$-$C_6$ linear or branched, saturated or unsaturated hydrocarbyl group, or a silyl group [$SiR'_3$]; further wherein each R' of the [$SiR'_3$] is independently selected from H, a halogen atom selected from F, Cl, Br or I, a $C_1$-$C_4$ saturated or unsaturated hydrocarbyl group, a $C_1$-$C_4$ saturated or unsaturated alkoxy group, or an amino group [—$NR^1R^2$] with each $R^1$ and $R^2$ being further selected from H or a $C_1$-$C_6$ linear or branched, saturated or unsaturated hydrocarbyl group.

16 Claims, 9 Drawing Sheets

(56) References Cited

U.S. PATENT DOCUMENTS

| | | |
|---|---|---|
| 5,874,368 A | 2/1999 | Laxman et al. |
| 5,888,579 A | 3/1999 | Lun |
| 5,968,611 A | 10/1999 | Kaloyeros et al. |
| 6,365,231 B2 | 4/2002 | Sato et al. |
| 6,566,281 B1 | 5/2003 | Buchanan et al. |
| 6,630,413 B2 | 10/2003 | Todd |
| 6,645,884 B1 | 11/2003 | Yang et al. |
| 6,821,825 B2 | 11/2004 | Todd et al. |
| 6,936,548 B2 | 8/2005 | Dussarrat et al. |
| 7,122,222 B2 | 10/2006 | Xiao et al. |
| 7,192,626 B2 | 3/2007 | Dussarrat et al. |
| 7,638,645 B2 | 12/2009 | Gordon et al. |
| 7,838,329 B2 | 11/2010 | Hunks et al. |
| 7,875,312 B2 | 1/2011 | Thridandam et al. |
| 8,173,554 B2 | 5/2012 | Lee et al. |
| 8,318,584 B2 | 11/2012 | Li et al. |
| 8,357,430 B2 | 1/2013 | Dussarrat et al. |
| 8,409,513 B2 | 4/2013 | Miller |
| 8,846,536 B2 | 9/2014 | Draeger et al. |
| 9,777,025 B2 | 10/2017 | Girard et al. |
| 2001/0048973 A1 | 12/2001 | Sato et al. |
| 2002/0016084 A1 | 2/2002 | Todd |
| 2003/0040196 A1 | 2/2003 | Lim et al. |
| 2005/0070717 A1 | 3/2005 | Wasserscheid et al. |
| 2005/0085098 A1 | 4/2005 | Timmermans et al. |
| 2005/0136693 A1 | 6/2005 | Hasebe et al. |
| 2005/0142716 A1 | 6/2005 | Nakajima et al. |
| 2005/0181633 A1 | 8/2005 | Hochberg et al. |
| 2006/0222583 A1 | 10/2006 | Hazeltine |
| 2006/0286820 A1 | 12/2006 | Singh et al. |
| 2007/0010072 A1 | 1/2007 | Bailey et al. |
| 2007/0031598 A1 | 2/2007 | Okuyama et al. |
| 2007/0275166 A1 | 11/2007 | Thridandam et al. |
| 2008/0045723 A1 | 2/2008 | Cassol et al. |
| 2008/0241575 A1 | 10/2008 | Lavoie et al. |
| 2008/0268642 A1 | 10/2008 | Yanagita et al. |
| 2009/0075490 A1 | 3/2009 | Dussarrat |
| 2009/0137100 A1 | 5/2009 | Xiao et al. |
| 2009/0256127 A1 | 10/2009 | Feist et al. |
| 2009/0291872 A1 | 11/2009 | Bara et al. |
| 2009/0291874 A1 | 11/2009 | Bara et al. |
| 2009/0299084 A1 | 12/2009 | Okubo et al. |
| 2010/0221428 A1 | 9/2010 | Dussarrat |
| 2011/0129616 A1 | 6/2011 | Ingle et al. |
| 2012/0017934 A1 | 1/2012 | Kumon et al. |
| 2012/0058282 A1 | 3/2012 | Hong et al. |
| 2012/0213940 A1 | 8/2012 | Mallick |
| 2012/0220139 A1 | 8/2012 | Lee et al. |
| 2013/0089487 A1 | 4/2013 | Ritter, III |
| 2013/0129940 A1 | 5/2013 | Xiao et al. |
| 2013/0143018 A1 | 6/2013 | Tan et al. |
| 2013/0189854 A1 | 7/2013 | Hausmann et al. |
| 2013/0209343 A1 | 8/2013 | Korolev |
| 2013/0224097 A1 | 8/2013 | Miller |
| 2013/0319290 A1 | 12/2013 | Xiao et al. |
| 2013/0323435 A1 | 12/2013 | Xiao et al. |
| 2014/0051264 A1 | 2/2014 | Mallick et al. |
| 2014/0193983 A1 | 7/2014 | Lavoie |
| 2014/0363985 A1 | 12/2014 | Jang et al. |
| 2015/0004806 A1 | 1/2015 | Ndiege et al. |
| 2016/0049293 A1 | 2/2016 | Li et al. |
| 2016/0225616 A1 | 8/2016 | Li et al. |
| 2016/0237099 A1 | 8/2016 | Sanchez et al. |
| 2016/0333030 A1 | 11/2016 | Jang et al. |
| 2017/0051405 A1* | 2/2017 | Fukazawa ............ C23C 16/345 |
| 2017/0323783 A1 | 11/2017 | Sanchez et al. |
| 2018/0072571 A1 | 3/2018 | Sanchez et al. |
| 2018/0099872 A1 | 4/2018 | Ritter et al. |
| 2019/0085452 A1* | 3/2019 | Lei ..................... C23C 16/345 |
| 2019/0088474 A1* | 3/2019 | MacDonald ........ H01L 21/0217 |

FOREIGN PATENT DOCUMENTS

| | | |
|---|---|---|
| EP | 0 423 884 | 10/1990 |
| EP | 2 000 561 | 12/2008 |
| JP | S61 72607 | 4/1986 |
| JP | S61 72614 | 4/1986 |
| JP | H06 338497 | 12/1994 |
| JP | H10 46108 | 2/1998 |
| KR | 10 2007 0113113 | 11/2007 |
| KR | 2013 0135794 | 12/2013 |
| KR | 2014 0057908 | 5/2014 |
| WO | WO 91 19688 | 12/1991 |
| WO | WO 2006 136584 | 12/2006 |
| WO | WO 2007 008705 | 1/2007 |
| WO | WO 2009 087609 | 7/2009 |
| WO | WO 2011 056519 | 5/2011 |
| WO | WO 2011 123792 | 10/2011 |
| WO | WO 2015 047914 | 4/2015 |
| WO | WO 2015 105337 | 7/2015 |
| WO | WO 2015 135698 | 9/2015 |
| WO | WO 2015 190749 | 12/2015 |
| WO | WO 2016 065219 | 4/2016 |
| WO | WO 2016 065221 | 4/2016 |
| WO | WO 2017 070192 | 4/2017 |
| WO | WO 2017 147150 | 8/2017 |
| WO | WO 2018 182305 | 10/2018 |

OTHER PUBLICATIONS

Anderson, H.H., Reactions of triethylsilane and diethylsilane with inorganic halides and acids, J. Am. Chem. Soc, 1958, 80, 19, 5083-5085.

Andreev, A.A. et al., Direct electrophilic silylation of terminal alkynes, Organic Letters 2004, vol. 6, No. 3, 421-424, S11-S15.

Anonymous, Synthesis methods for TSA, IP,com No. IPCOM000224804D, Jan. 4, 2013, 2 pages.

Austin, J.D. et al., Organisilicon compounds. Part XXIX. The stereochemical course of the reaction of a silicon hydride with chlorotripheylmethane, J. Chem. Soc., 1964, 2279-.

Aylett, B.J. et al., Silicon-nitrogen compounds. Part VI. The preparation and properties of disilazane, J. Chem. Soc. (A), 1969, 639-642.

Bacque, E. et al., Synthesis and chemical properties of 1,3-dichloro-1,3-dihydridodisilazanes, J. Organomet. Chem., 481, 2, Nov. 15, 1994, 167-172.

Breed, L.W. et al., Functionally substituted trisilylamine derivatives, J. Organometal. Chem., 11 (1968), 447-457.

Chulsky, K. et al., $B(C_6F_5)_3$-catalyzed selective chlorination of hydrosilanes, Angew. Chem. Int. Ed., 2017, 56, 4744-47448.

Copel, M. et al., Nucleation of chemical vapor deposited silicon nitride on silicon dioxide, Aplied Physics Letters, vol. 74, No. 13, Mar. 29, 1999, 1830-1832.

Corey, J.Y. et al., Hydrogen-halogen exchange between silanes and triphenylmethyl halides, J. Am. Chem. Soc., 1963, 85 (16), 2430-2433.

Cradock, S. et al., Reactions of tin(IV) chloride with silyl compounds. I. Reactions with inorganic silyl compounds, Journal of the Chemical Society Dalton Transactions, Jan. 1975, 1624-1628.

Felch, S.B. et al., Plasma doping for the fabrication of ultra-shallow junctions, Surface and Coatings Technology 156 (2002), 229-236.

Gamboa, J.M., Chlorinated and nitrogenated derivatives of the silanes, Anales de la Real. Sociedad Espanola de Fisica y Quimica, Serie B: Quimica (1950), 46B, 699-714 & PatBase English abstract.

Godleski, S.A., et al., MNDO study of phosphine- and amine-substituted silicenium ions, Tetrahedron Letter (1982), 23(43), 4453-3356.

Iida, A. et al., Anilinosilanes/TBAG catalyst: mild and powerful agent for the silylations of sterically hindered alcohols, Synthesis 2005, No. 16, 2677-2682.

Ishii, K. et al., Growth of polycrystalline hexagonal-close-packed Co films on glass substrates from low kinetic energy vapor, Journal of Vacuum Science & Technology A 16 (1998), 759-762.

Königs, C.D.F. et al., Catalytic dehydrogenative Si—N coupling of pyrroles, indoles, carbazoles as well as anilines with hydrosilanes without added base, Chem. Commun., 2013, 49, 1506-1508.

Kunai, A. et al., Selective synthesis of halosilanes from hydrosilanes and utilization for organic synthesis, Journal of Organometallic Chemistry, 2003, 686, 3-15.

(56) References Cited

OTHER PUBLICATIONS

Lee, J. et al., A hydrogen gas sensor employing vertically aligned $TiO_2$ nanotube arrays, Sensors and Actuators B 160 (2011), 1494-1498.

Marcus, L.H. et al., Formation of fluorosilylamines by interaction of trisilylamine with phosphorus pentafluoride. Synthesis of 1,1'-difluorotrisilylamine, Inorg. Chem. 1975, 14(12), 3124-3125.

Miura, K. et al., Indium-catalyzed radical reductions of organic halides with hydrosilanes, J. Org. Chem., 2007, 72 (3), 787-792.

Moedritzer, K. et al., The redistribution equilibria of silanic hydrogen with chlorine on methylsilicon moieties, J. Organomet. Chem., 12 (1968), 69-77.

Neilson, R.H., Reactions of boron trichlorides with silylamines containing silicon-hydrogen bonds, Inorganic Chemistry, 1980, 19(3), 755-758.

Norman, A.D. et al., Reaction of silylphosphine with ammonia, Inorganic Chemistry, vol., 18, No. 6, 1979, 1594-1597.

Pflugmacher, A. et al., Über die Bildung von Silicium-Stickstoffverbindungen in der Glimmentladung. I. Das Tris-trichlorsilylamin $(SiCl_3)_3N$, Zeitschrift für Anorganische and Allgemeine Chemie, Band 290, 1957, 184-190 & PatBase English abstract.

Pongkittiphan, V. et al., Hexachloroethane: a highly efficient reagent for the synthesis of chlorosilanes from hydrosilanes, Tetrahedron Letters 2009, 50(36), 5080-5082.

Prat, D. et al., Solvent selection guide and ranking: A survey of solvent selection guides, Green Chem., 2014, 16, 4546-4551.

Richetto, K.C.S. et al., Qualitative analysis of silicon nitride synthesized by ammonolysis of silicon tetrachloride, Materials Science Forum (2003), 416-418 (Advanced Powder Technology III), 688-693.

Scantlin, W.M., et al., The borane-catalyzed condensation of trisilazane and N-methyldisilazane, Inorganic Chemistry (1972), 11(12), 3028-2084.

Scantlin, W.M. et al., Pentaborane(9)-catalyzed condensation of silylamines, Journal of the Chemical Society D: Chemical Communications (1971), (20), 1246.

Schmidbauer, H. et al., Difference in reactivity of 1,4-disilabutane and n-tetrasilane towards secondary amines, Z. Naturforsch. 45b, 1990, 1679-1863.

Silbiger, J. et al., The preparation of chlorodisilazanes and some of their derivatives, Inorg.Chem., 1965, 4 (9), 1371-1372.

Simarek, A. et al., $B(C_6F_5)_3$ catalysis accelerates the hydrosilane chlorination by $Ph_3CCl$, Appl. Organometal. Chem. 2018, 32:e4442, 7 pages.

Sommer, L.H. et al, Stereochemistry of asymmetric silicon. XVI. Transition metal catalyzed substitution reactions of optically active organosilicon hydrides, J. Am. Chem. Soc., 91:25, Dec. 3, 1969, 7061-7067.

Sommer, L.H. et al, Stereochemistry of asymmetric silicon. XVIII. Hydrogen-halogen exchange of $R_3Si*H$ with trityl halides, J. Am. Chem. Soc., 91:25, Dec. 3, 1969, 7076-7078.

Stock, A. et al., Siliconhydrides X. Nitrogen-containing compounds, Ber, B: Abhandlungen (1921), 54B, 740-758.

Stock, A., Hydrides of boron and silicon, Ch. II, Investigation of the hydrides of silicon, Cornell University Press, Ithaca, NY, 1933, 20-37 & 209-211.

Stöhr, F. et al., C—Cl/Si—H exchange catalyzed by P,N-chelated Pt(u) complexes, Chem. Commun. 2002, 2222-2223.

Toh, C.K. et al., Ruthenium carbonyl-catalysed Si-heteroatom X coupling (X=S, O, N), Journal of Organometallic Chemistry 717 (2012), 9-13.

Whitmore, F.C. et al., Hydrogen-halogen exchange reactions of triethylsilane. A new rearrangement of neopentyl chloride, J. Am. Chem. Soc., 1947, 69, 2108-2110.

Yang, J. et al., Iridium-catalyzed reduction of alkyl halides by triethylsilane, J. Am. Chem. Soc. (2007), 129(42), 12656-12657.

Yang, J. et al., Reduction of alkyl halides by triethylsilane based on a cationic iridium bis(phosphinite) pincer catalyst: scope, selectivity, and mechanism, Adv. Synth. Catal. 2009, 351, 175-187.

International Search Report and Written Opinion for related PCT/US2016/025010, dated Jul. 15, 2016.

International Search Report and Written Opinion for related PCT/US2016/037006, Sep. 12, 2016.

International Search Report and Written Opinion for related PCT/US2016/037013, dated Sep. 12, 2016.

International Search Report and Written Opinion for related PCT/US2014/056618, dated Dec. 12, 2014.

International Search Report and Written Opinion for related PCT/US2017/065506, dated Mar. 7, 2018.

International Search Report for related PCT/EP2003/012395, dated Feb. 18, 2004.

\* cited by examiner

SI-CONTAINING FILM FORMING PRECURSORS AND METHODS OF USING THE SAME

CROSS REFERENCE TO RELATED APPLICATIONS

The present application is a continuation-in-part application of U.S. patent application Ser. No. 15/692,544 filed Aug. 31, 2017, which is a continuation of Ser. No. 14/738,039 filed Jun. 12, 2015, now issued as U.S. Pat. No. 9,777,025, which claims the benefit of U.S. Provisional Patent Application No. 62/140,248, filed Mar. 30, 2015, all applications being incorporated by reference herein in their entireties for all purposes.

TECHNICAL FIELD

Disclosed are Si-containing film forming compositions comprising halosilazanes or halogenated hydrosilazanes and mono-substituted trisilylamine precursors, methods of synthesizing the same, and methods of using the same to deposit Si-containing films using vapor deposition processes for manufacturing semiconductors, photovoltaics, LCD-TFT, flat panel-type devices, refractory materials, or aeronautics.

BACKGROUND

A variety of silicon containing precursor have been used to deposit Si-containing thin films on various substrates by vapor deposition processes. The choice of the suitable silicon precursor and, when applicable, of the co-reactant are generally driven by the target film composition and properties, as well as by the constraints brought by the substrate on which the film is to be deposited. Some substrates may require low temperature deposition processes. For instance, deposition on plastic substrates or Si substrates coated with organic films may require deposition temperatures below 100° C. (i.e., 20° C.-100° C.), while maintaining a reasonable deposition rate to be of industrial interest. Such films may be used as spacer-defined lithography application in semiconductor fabrication, but also for sealing organic light-emitting diode (OLED) devices or creating moisture diffusion barriers on films. Similar constraints at different temperature ranges appear in the different steps of semiconductor manufacturing, such as, capping layers over metals, gate spacers, etc.

Trisilylamine (TSA) is a molecule with a high Si content and has the formula of $N(SiH_3)_3$. TSA may be used as a low temperature (T) silicon nitride precursor (see, e.g., U.S. Pat. No. 7,192,626), as well as a precursor for flowable CVD (see, e.g., U.S. Pat. No. 8,846,536, US 2014/0057458 or U.S. Pat. No. 8,318,584). However, while TSA appears as a versatile precursor (Carbon-free and low T capability) for a variety of thin film deposition processes, it's applicability to thermal ALD has been limited (see, e.g., U.S. Pat. No. 8,173,554, indicating that plasma activation is necessary to obtain a meaningful growth per cycle).

US2014/0363985 A1 discloses amino-silylamines used for forming a silicon-containing thin-film having a generic formula of $R^1R^2R^3Si$—$N(SiR^4R^5$—$NR^6R^7)_2$, wherein $R^1$ to $R^5$ are each independently hydrogen, halogen, (C1-C7)alkyl, (C2-C7)alkenyl, (C2-C7)alkynyl, (C3-C7)cycloalkyl or (C6-C12)aryl. US2014/0158580A describes an alkoxysilylamine having a TSA-like structure. U.S. Pat. No. 7,122,222 uses a Si—C bond free hydrazinosilane precursor $[R^1{}_2N$—$NH]_nSi(R^2)_{4-n}]$ to depist SiN, $SiO_2$ and SiON films.

Silazane compounds N—$(SiR^1R^2R^3)_mR^4{}_{3-m}$ disclosed in WO2013/058061 are used as a coating gas. $(RR^1R^2M^a)_yA(R^3)_x$ disclosed in U.S. Pat. No. 5,332,853 is used as a catalytic compound to produce a functionalized alkylalkali metal compound. Similar patents include U.S. Pat. Nos. 5,663,398A, 5,332,853A, 5,340,507A, EP 525881 A1, etc.

Methods for preparation of inorganic halogenated silazanes or halosilazane have been experimentally demonstrated but are limited in various ways.

Marcus et al. ("Formation of fluorosilylamines by the interaction of trisilylamine with phosphorus pentafluoride. Synthesis of 1,1'-difluorotrisilylamine", Inorg. Chem. (1975), 14(12), 3124-5) disclosed TSA-Fx (x=1-3) which were prepared non-selectively from TSA and $PF_5$ between −50° C. and 0° C. The reaction is

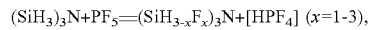

$(SiH_3)_3N+PF_5=(SiH_{3-x}F_x)_3N+[HPF_4]$ (x=1-3), which produced a polymeric solid and mixture of fluorinated compounds. Mono- and trifluorinated compounds were not isolated in pure form but were observed only on chromatogram, while difluorinated compound $(SiH_3)N(SiH_2F)_2$ was isolated by fractional distillation in a pure form. The yield of fluorosilylamines produced in the reactions did not exceed 5-10% overall.

Cradock et al. ("Reactions of Tin(iv) Chloride with Silyl Compounds. Part 1. Reactions with Inorganic Silyl Compounds", Stephen Cradock, E. A. V. Ebsworth, and Narayan Hosmane, Dalt. Trans.: Inorg. Chem. (1975) p. 1624-8) disclosed $TSA-Cl_x$ (x=1-3) compounds that were prepared from $SnCl_4$ and TSA:

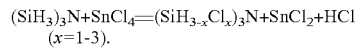

$(SiH_3)_3N+SnCl_4=(SiH_{3-x}Cl_x)_3N+SnCl_2+HCl$
(x=1-3).

However, as the HCl byproduct cleaved Si—N bonds, the reaction suffered from the lack of selectivity and the major product was found to be MCS. The yields of mono-, bis- and tris-chlorinated TSA were 20, 15 and 10%, respectively.

Bacqué et al. ("Synthesis and chemical properties of 1,3-dichloro-1,3-dihydridodisilazanes", Eric Bacqué, Jean-Paul Pillot, M. Birot, J. Dunoguès, M. Pétraud, J. Organomet. Chem. V.481, 2, 15 Nov. 1994, p. 167-172) disclosed a method for preparation of chlorinated aminosilanes and silazanes by displacement reactions by chlorosilanes:

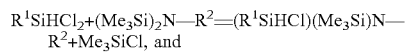

$R^1SiHCl_2+(Me_3Si)_2N$—$R^2=(R^1SiHCl)(Me_3Si)N$—$R^2+Me_3SiCl$, and

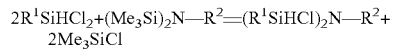

$2R^1SiHCl_2+(Me_3Si)_2N$—$R^2=(R^1SiHCl)_2N$—$R^2+2Me_3SiCl$ ($R^1$=Me, Et, Ph, $R^2$=H, Me) catalyzed by [$^nBu_4N$]F. Silbiger et al. ("The Preparation of Chlorodisilazanes and Some of Their Derivatives", J. Silbiger, and J. Fuchs, Inorg. Chem., 1965, 4 (9), pp 1371-1372) disclosed a method for preparation of the same molecules as Bacqué et al. synthesized but catalyzed by $AlCl_3$. Compounds ($R^1SiHCl$)($Me_3Si$)N—$R^2$ and ($R^1SiHCl$)$_2$—$R^2$ having only Si—C and Si—Cl bonds are thermally stable, according to Silbiger et al., while those possessing both Si—H and Si—Cl bonds slowly decompose after several days at room temperature, under inert gas producing $NH_4Cl$, oligomers, and $MeHSiCl_2$, according to Bacqué et al. While the given method is widely applied for preparation of organic aminosilanes, only one example reported for the carbon free homologue $(SiH_2Cl)_2NH$, that is, $2SiH_2Cl_2+(MeSi)_2NH=(SiH_2Cl)_2NH+2Me_3SiCl$.

Reaction proceeded in the presence of $AlCl_3$ catalyst and was used for synthesis of aminosilanes $(SiH_2NR_2)_2NH$ according to Gi et al. to WO2018182305 A1. However, no evidence was provided for the $(SiH_2Cl)_2NH$ and the proton resonance of N—H group as well as FT-IR evidence of N—H was not provided for any aminosilane $(SiH_2NR_2)_2NH$ prepared from $(SiH_2Cl)_2NH$ by aminolysis reaction as disclosed in patent. The reaction apparently has low selectivity as the reported yield of bis(ethylmethylaminosilyl)amine prepared from $(SiH_2Cl)_2NH$ intermediate is 33%. In addition, according to WO 2015135698 to Hoppe et al., disilylamine $(SiH_3)_2NH$ is reported to be unstable itself, producing TSA and ammonia or reactive toward the $SiH_3Cl$ used in the synthesis above.

U.S. Pat. No. 9,777,025 B2 to Girard et al. disclosed preparation of monohalogenated TSA derivatives. The invention proposes that halogenated aminosilanes TSA-Hal (Hal=Cl, Br, I) might be synthesized from mixture of dihalosilane $SIH_2X_2$ with monohalosilane $SiH_3X$ (wherein X is Cl, Br, or I) and $NH_3$ in a flow-through tubular reactor. However neither examples of the synthesis for production of TSA-Hal nor any optimization of conditions were provided in the given patent precluding any judgement about yield and selectivity of process. The proposed method might afford a high amount of side products because all earlier references, for example, Stock et al. ("Siliconhydrides X. Nitrogen-containing compounds", Stock, Alfred; Somieski, Karl; Ber, B: Abhandlungen (1921), 54B, 740-58), Zhang et al. to CN 102173398 A, JP1917728 C3 to Matsumoto et al., JP1777774 C3 to Matsumoto et al., JP3516815 B2 to Nakajima et al., U.S. Pat. No. 4,397,828 A to Seyferth et al., WO 9119688 A1 to Delaet, state that interaction of $SiH_2X_2$ and ammonia produces a solid chlorine free polymer and proceeds according to the reaction: $3NH_3 + H_2SiCl_2 \rightarrow 2NH_4Cl + [SiH_2(NH)]_x$.

US 2013/0209343 A1 to Korolev discloses that higher purity monochlorosilane produces larger quantities of TSA by reaction of monochlorosilane and ammonia and application of impure $SiH_3Cl$ leads to formation of mixture containing TSA-Cl, TSA-Cl$_2$ and TSA-oligomers, but what impurity triggers formation of chlorinated compounds was not reported.

Gamboa ("Chlorinated and nitrogenated derivatives of the silanes", Anales de la Real Sociedad Espanola de Fisica y Quimica, Serie B: Quimica (1950), 46B, 699-714) attempted to prepare $(SiH_3SiH_2)_3N$ by reaction of monochlorinated $(SiH_3SiH_2Cl)$ and dichlorinated $(Si_2H_4Cl_2)$ disilane and ammonia ($NH_3$). The reaction produced large amounts of polymeric material contaminated with $NH_4Cl$ from which the desired amine $(SiH_3SiH_2)_3N$ or any isolable low molecular weight compound was not recovered.

Pflugmacher et al. ("Formation of silicon-nitrogen compounds in the glow dischargeD.", Zeitschrift fuer Anorganische und Allgemeine Chemie (1957), 290, 184-90) disclosed the fully chlorinated homologue $(Cl_3Si)_3N$ is a volatile solid and can be obtained by reacting a $SiCl_4$ and $N_2$ in a glow discharge tube. Alternatively, Anon (IP.com Journal (2013), 13(1B), 8, IP.COM DISCLOSURE NUMBER: IPCOM000224804D) proposed to synthesize $(Cl_3Si)_3N$ directly from tetrachlorosilane and ammonia. However, A. Stock (Hydrides of Boron and Silicon, Cornell University Press, Ithaca, N.Y., 1933) and Richetto et al. ("Qualitative analysis of silicon nitride synthesized by ammonolysis of silicon tetrachloride", Richetto, K. C. S.; Silva, C. R. M.; Baldacin, S. A., Materials Science Forum (2003), 416-418 (Advanced Powder Technology III), 688-692) stated that interaction of $SiCl_4$ and ammonia produces only polymeric solids.

All these disclosures notwithstanding, halogenated aminosilanes are not prepared and utilized commercially at the time.

Catalysts have been apply to the halogenated aminosilanes to try to increase yields. Organic silanes were chlorinated with various chlorocarbons in presence of applying highly acidic catalysts such as HCl, $B(C_6F_5)_3$, $AlCl_3$, (refer to J. Am. Chem. Soc., 1963, 85 (16), pp 2430-2433; J. Am. Chem. Soc., 1969, vol. 91, p. 7076; Appl. Organometal. Chem., 2018; 32:e4442). These substrates are known to cleave Si—N bond or triggering disilylative coupling of carbon free hydrosilazanes such as TSA (see U.S. Pat. Appl. Publ. (2018), US 20180072571).

One example of catalysis by Palladium on carbon was reported to promote chlorination of $^iPr_3SiH$ by $C_2Cl_6$ as disclosed by Pongkittiphan et al. ("Hexachloroethane: a Highly Efficient Reagent for the Synthesis of Chlorosilanes from Hydrosilanes"; Veerachai Pongkittiphan, Emmanuel A. Theodorakis, Warinthorn Chavasiri; Tetrahedron Letters (2009), 50(36), 5080-5082). Comparative examples below for TSA chlorination with $C_2Cl_6$ and Pd/C reveal that this method is not applicable for hydrosilazanes disclosed herein: the yield of halosilazanes is below 5% in all comparative examples.

Yang et al., ("Reduction of Alkyl Halides by Triethylsilane Based on a Cationic Iridium Bis(phosphinite) Pincer Catalyst": Scope, Selectivity and Mechanism; by Jian Yang and Maurice Brookhart; from Adv. Synth. Catal., 2009, 351, p. 175-187) and ("Iridium-Catalyzed Reduction of Alkyl Halides by Triethylsilane", by Yang, Jian; Brookhart, Maurice, from Journal of the American Chemical Society (2007), 129(42), 12656-12657) and Stöhr et al. ("C—Cl/Si—H Exchange catalysed by P,N-chelated Pt(l) complexes", by Frank Stöhr, Dietmar Sturmayr, Ulrich Schubert, from Chem. Commun., 2002, 2222-2223) report application of cationic iridium hydride complexes and P,N-chelated Pt(II) complexes for chlorination of organic silanes by chlorocarbons. Cationic complexes may trigger the polymerization of inorganic silazanes. In addition, all these complexes of noble metals are made by multi-step synthesis and not available commercially, thus precluding their utilization in an industrial scale process.

$In(OAc)_3$ and other Indium complexes with related ligands disclosed by Miura et al. ("Indium-Catalyzed Radical Reductions of Organic Halides with Hydrosilanes", by Katsukiyo Miura, Mitsuru Tomita, Yusuke Yamada, Akira Hosomi; from J. Org. Chem., 2007, 72 (3), pp 787-792) performed a catalyzed reaction of bromo- and iodoalkanes with $PhSiH_3$ in THF at 70° C. to produce dehalogenated alkanes, while halogenated silane was not isolated from the reported reaction, precluding any judgement about the yield and selectivity of reaction.

Stock ("Hydrides of Boron and Silicon" by A. Stock, Cornell University Press, Ithaca, N.Y., 1933) discloses Halogens $Hal_2$ would violently oxidize inorganic hydrosilazanes with formation of H-Hal that also cleaves Si—N bond. Stock also discloses H-Hal itself or in presence of catalysts ("Hydrides of Boron and Silicon", by A. Stock, Cornell University Press, Ithaca, N.Y., 1933) would cleave Si—N bonds of hydrosilazanes.

Transition metal halogenides $SnCl_4$, $CuCl_2$, $HgBr_2$, $PdCl_2$ etc. (e.g., Dalt. Trans.: Inorg. Chem. (1975), p. 1624-8; Journal of organometallic chemistry, 2003, vol. 686, p. 3; J. Am. Chem. Soc., v.80 (1958), p. 5083.) would lead to Si—N bond cleavage and/or formation of polymeric products.

Halogenides of P, As, B, S and other non-metals disclosed by Cradock et al. ("Reactions of Tin(iv) Chloride with Silyl Compounds. Part 1. Reactions with Inorganic Silyl Compounds"; Stephen Cradock, E. A. V. Ebsworth, and Narayan Hosmane; Journal of the Chemical Society, Dalton Transactions: Inorganic Chemistry (1975), p. 1624-8), Kunai et al. ("Selective synthesis of halosilanes from hydrosilanes and utilization for organic synthesis", A Kunai, J Ohshita, Journal of organometallic chemistry, 2003, vol. 686, 3) and Herbert et al. ("Reactions of Triethylsilane and Diethylsilane with Inorganic Halides and Acids"; Herbert H. Anderson; J. Am. Chem. Soc., 1958, vol. 80, p. 5083) cause cleavage of S—N bonds in aminosilanes and disilazanes as stated in the prior art and shown in the comparative examples.

"Hydrogen-Halogen" redistribution between various Si compounds in the presence of Lewis acid/base catalysts is disclosed by Moedritzer et al. ("The Redistribution Equilibria of Silanic Hydrogen with Chlorine on Methylsilicon Moieties", K. Moedritzer, J. Van Wazer, J. Organomet. Chem., v.12 (1968), p. 69-77) and by Whitmore ("Hydrogen-Halogen Exchange Reactions of Triethylsilane. A New Rearrangement of Neopentyl Chloride", F. C. Whitmore, E. W. Pietrusza, and L. H. Sommer, J. Am. Chem. Soc., 1947, vol. 69, p. 2108). These catalysts would trigger desilylative coupling as shown in the comparative examples.

Industries using vapor-based deposition processes such as CVD or ALD (in all possible meanings, such as LPCVD, SACVD, PECVD, PEALD, etc.) are still looking for precursors that are ideal for their applications, i.e. having the highest possible deposition rates within the constraints of their processes, substrates and film targets. As such, there is a demand to discover a simple, selective and economical process for preparing of halogenated derivatives of silicon-nitrogen compounds, such as trisilylamine, that offers advantages both in terms of economics and commercial use.

SUMMARY

Disclosed are Si-containing film forming compositions comprising a halosilazane precursor having a formula:

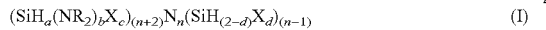

$$(SiH_a(NR_2)_b X_c)_{(n+2)} N_n (SiH_{(2-d)} X_d)_{(n-1)} \quad (I)$$

where X is selected from a halogen atom selected from F, Cl, Br or I; R each is selected from H, a $C_1$-$C_6$ linear or branched, saturated or unsaturated hydrocarbyl group, or a silyl group [$SiR'_3$]; and each a, b, c is independently 0 to 3; a+b+c=3; d is 0 to 2 and n≥1. In the subgenus comprising a silyl group [$SiR'_3$], each R' is independently selected from H, a halogen atom selected from F, Cl, Br or I, a $C_1$-$C_4$ saturated or unsaturated hydrocarbyl group, a $C_1$-$C_4$ saturated or unsaturated alkoxy group, or an amino group [—$NR^1R^2$] with each $R^1$ and $R^2$ being further selected from H or a $C_1$-$C_6$ linear or branched, saturated or unsaturated hydrocarbyl group. Also disclosed are Si-containing film forming compositions comprising a mono-substituted TSA precursor having the formula $(SiH_3)_2NSiH_2$—X, wherein X is a halogen atom selected from Cl, Br or I; an isocyanato group [—NCO]; an amino group [—$NR^1R^2$]; a N-containing $C_4$-$C_{10}$ saturated or unsaturated heterocycle; or an alkoxy group [—O—R]; $R^1$, $R^2$ and R is selected from H; a silyl group [—$SiR'_3$]; or a $C_1$-$C_6$ linear or saturated branched, or unsaturated hydrocarbyl group; with each R' being independently selected from H; a halogen atom selected from Cl, Br, or I; a $C_1$-$C_4$ saturated or unsaturated hydrocarbyl group; a $C_1$-$C_4$ saturated or unsaturated alkoxy group; or an amino group [—$NR^3R^4$] with each $R^3$ and $R^4$ being independently selected from H and a $C_1$-$C_6$ linear or branched, saturated or unsaturated hydrocarbyl group, provided that if $R^1$=H, then $R^2$≠H, Me or Et. The disclosed Si-containing film forming compositions may include one or more of the following aspects:

- the mono-substituted TSA precursor wherein X is a halogen atom;
- the mono-substituted TSA precursor being $(SiH_3)_2N$—$SiH_2$—Cl;
- the mono-substituted TSA precursor being $(SiH_3)_2N$—$SiH_2$—Br;
- the mono-substituted TSA precursor being $(SiH_3)_2N$—$SiH_2$—I;
- the mono-substituted TSA precursor wherein X is a isocyanate —NCO (i.e., being $(SiH_3)_2N$—$SiH_2$—NCO);
- the mono-substituted TSA precursor wherein X is an amino group [—$NR^1R^2$];
- the mono-substituted TSA precursor being $(SiH_3)_2N$—$SiH_2$—$NiPr_2$;
- the mono-substituted TSA precursor being $(SiH_3)_2N$—$SiH_2$—NHiPr;
- the mono-substituted TSA precursor being $(SiH_3)_2N$—$SiH_2$—NHtBu;
- the mono-substituted TSA precursor not being $(SiH_3)_2$—N—$SiH_2$—$N(SiH_3)(SiH_2(NHEt))$ (i.e., when X=$NR^1R^2$ and $R^1$ is $SiH_3$ and $R^2$ is NHEt);
- the mono-substituted TSA precursor being $(SiH_3)_2N$—$SiH_2$ $NEt_2$;
- the mono-substituted TSA precursor being $(SiH_3)_2N$—$SiH_2$ NEtMe;
- the mono-substituted TSA precursor being $(SiH_3)_2N$—$SiH_2$ $NMe_2$;
- the mono-substituted TSA precursor being $(SiH_3)_2N$—$SiH_2$ NMeiPr;
- the mono-substituted TSA precursor being $(SiH_3)_2N$—$SiH_2$ NEtiPr;
- the mono-substituted TSA precursor wherein X is —$N(SiR_3)_2$, wherein each R is independently selected from a halogen, H, or a $C_1$-$C_4$ alkyl group;
- the mono-substituted TSA precursor being $(SiH_3)_2N$—$SiH_2$—$N(SiCl_3)_2$;
- the mono-substituted TSA precursor being $(SiH_3)_2N$—$SiH_2$—$N(SiBr_3)_2$;
- the mono-substituted TSA precursor being $(SiH_3)_2N$—$SiH_2$—$N(SiI_3)_2$;
- the mono-substituted TSA precursor being $(SiH_3)_2N$—$SiH_2$—$N(SiH_3)_2$;
- the mono-substituted TSA precursor being $(SiH_3)_2$—N—$SiH_2$—$N(SiH_3)(SiH_2Cl)$;
- the mono-substituted TSA precursor being $(SiH_3)_2$—N—$SiH_2$—$N(SiH_3)(SiH_2(NEt_2)$;
- the mono-substituted TSA precursor being $(SiH_3)_2$—N—$SiH_2$—$N(SiH_3)(SiH_2(NiPr_2)$;
- the mono-substituted TSA precursor being $(SiH_3)_2$—N—$SiH_2$—$N(SiH_3)(SiH_2(NHtBu)$;
- the mono-substituted TSA precursor being $(SiH_3)_2$—N—$SiH_2$—$N(SiH_3)(SiH_2OEt)$;
- the mono-substituted TSA precursor being $(SiH_3)_2$—N—$SiH_2$—$N(SiH_3)(SiH_2OiPr)$;
- the mono-substituted TSA precursor being $(SiH_3)_2N$—$SiH_2$—$N(SiMe_3)_2$;
- the mono-substituted TSA precursor being $(SiH_3)_2N$—$SiH_2$—$NH(SiMe_3)$;
- the mono-substituted TSA precursor being $(SiH_3)_2N$—$SiH_2$—$N(SiEt_3)_2$;
- the mono-substituted TSA precursor being $(SiH_3)_2$—N—$SiH_2$—$N(SiMe_2Et)_2$;
- the mono-substituted TSA precursor being $(SiH_3)_2$—N—$SiH_2$—$N(SiMe_2iPr)_2$;

the mono-substituted TSA precursor being $(SiH_3)_2$—N—$SiH_2$—$N(SiMe_2nPr)_2$;
the mono-substituted TSA precursor wherein X is a N-containing $C_4$-$C_{10}$ heterocycle;
the mono-substituted TSA precursor wherein the N-containing $C_4$-$C_{10}$ heterocycle is selected from pyrrolidine, pyrrole, and piperidine;
the mono-substituted TSA precursor being $(SiH_3)_2N$—$SiH_2$-(pyrrolidine);
the mono-substituted TSA precursor being $(SiH_3)_2N$—$SiH_2$-(pyrrole);
the mono-substituted TSA precursor being $(SiH_3)_2N$—$SiH_2$-(piperidine);
the mono-substituted TSA precursor wherein X is an alkoxy group [—O—R];
the mono-substituted TSA precursor being $(SiH_3)_2N$—$SiH_2$—(OH);
the mono-substituted TSA precursor being $(SiH_3)_2N$—$SiH_2$—(OMe);
the mono-substituted TSA precursor being $(SiH_3)_2N$—$SiH_2$—(OEt);
the mono-substituted TSA precursor being $(SiH_3)_2N$—$SiH_2$—(OiPr);
the mono-substituted TSA precursor being $(SiH_3)_2N$—$SiH_2$—(OnPr);
the mono-substituted TSA precursor being $(SiH_3)_2N$—$SiH_2$—(OtBu);
the mono-substituted TSA precursor wherein X is —O—$SiR_3$ and each R is independently selected from H, a halogen, or a $C_1$-$C_4$ hydrocarbyl group;
the mono-substituted TSA precursor being $(SiH_3)_2N$—$SiH_2$—$(OSiH_3)$;
the mono-substituted TSA precursor being $(SiH_3)_2N$—$SiH_2$—$(OSiCl_3)$;
the mono-substituted TSA precursor being $(SiH_3)_2N$—$SiH_2$—$(OSiBr_3)$;
the mono-substituted TSA precursor being $(SiH_3)_2N$—$SiH_2$—$(OSiI_3)$;
the mono-substituted TSA precursor being $(SiH_3)_2N$—$SiH_2$—$(OSiMe_3)$;
R being an alkyl group selected from Me, Et, Pr, $^iPr$, Bu, $^iBu$, or $^tBu$;
X being selected from a halogen atom selected from F, Cl, Br, or I;
the halosilazane or halogenated hydrosilazane precursor being selected from $(H_3Si)_2N(SiH_2Cl)$, $(H_3Si)_2N(SiH_2Br)$, $(H_3Si)N(SiH_2Br)_2$, $(H_3Si)_2N(SiH_2I)$, $(H_3Si)N(SiH_2Cl)_2$, $(H_3Si)(H_2SiCl)N(SiH_2(N_iPr_2))$, $(H_3Si)(H_2SiBr)N(SiH_2(N^iPr_2))$, $(H_3Si)(H_2SiI)N(SiH_2(N^iPr_2))$, $(H_3Si)(H_2SiCl)N(SiH_2(NEt_2))$, $(H_3Si)(H_2SiBr)N(SiH_2(NEt_2))$, $(H_3Si)(H_2SiI)N(SiH_2(NEt_2))$, $(H_2SiCl)_2N(SiH_2(N_iPr_2))$, $(H_3SiCl)N(SiH_2(N^iPr_2))_2$, $(H_2SiCl)N(SiH_2(NEt_2))_2$;
the halosilazane or halogenated hydrosilazane precursor being selected from $(H_3Si)_2N(SiH_3)N(SiH_3)(SiH_2Cl)$, $(H_3Si)_2N(SiH_2)N(SiH_3)(SiH_2Br)$, $(H_3Si)_2N(SiH_2)N(SiH_3)(SiH_2I)$;
the halosilazane or halogenated hydrosilazane precursor is $(H_3Si)(H_2SiCl)N(SiH_2(N^iPr_2))$;
the halosilazane or halogenated hydrosilazane precursor is $(H_2SiCl)_2N(S H_2(N^iPr_2))$;
the halosilazane or halogenated hydrosilazane precursor is $(H_2SiCl)_2N(SiH_2(N^iPr_2))$;
the halosilazane or halogenated hydrosilazane precursor is $(H_3Si)(H_2SiCl)N(SiH_2(NEt_2))$;
the halosilazane or halogenated hydrosilazane precursor is $(H_2SiCl)N(S H_2(NEt_2))_2$;

the halosilazanes being produced by halogenation of

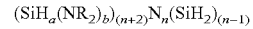

wherein n≥1, each a, b is independently 0 to 3, a+b=3, R each is selected from H, a $C_1$-$C_6$ linear or branched, saturated or unsaturated hydrocarbyl group, or a silyl group [$SiR'_3$]. For the subgenus comprising a silyl group [$SiR'_3$] each R' is independently selected from H, a halogen atom selected from F, Cl, Br or I, a $C_1$-$C_4$ saturated or unsaturated hydrocarbyl group, a $C_1$-$C_4$ saturated or unsaturated alkoxy group, or an amino group [—$NR^1R^2$] with each $R^1$ and $R^2$ further being selected from H or a $C_1$-$C_6$ linear or branched, saturated or unsaturated hydrocarbyl group;
the halosilazanes being produced by selective halogenation of

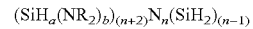

wherein n≥1, each a, b is independently 0 to 3, a+b=3, R each is selected from H, a $C_1$-$C_6$ linear or branched, saturated or unsaturated hydrocarbyl group, or a silyl group [$SiR'_3$]. For the subgenus comprising a silyl group [$SiR'_3$] each R' is independently selected from H, a halogen atom selected from F, Cl, Br or I, a $C_1$-$C_4$ saturated or unsaturated hydrocarbyl group, a $C_1$-$C_4$ saturated or unsaturated alkoxy group, or an amino group [—$NR^1R^2$] with each $R^1$ and $R^2$ further being selected from H or a $C_1$-$C_6$ linear or branched, saturated or unsaturated hydrocarbyl group;
when R is H, the halosilazanes precursors being carbon-free halosilazanes precursors have a formula

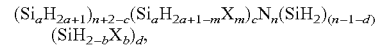

where X is selected from a halogen atom selected from F, Cl, Br or I; a, n≥1, 0<m<2a+1 and b=0-2, 0<c<n+2 and 0≤d<n−1;
the carbon-free halosilazanes being produced by halogenation of hydrosilanes having a general formula $(Si_aH_{2a+1})_{(n+2)}N_n(SiH_2)_{(n-1)}$, where a, n≥1;
the carbon-free halosilazanes being produced by selective halogenation of hydrosilanes having a general formula $(Si_aH_{2a+1})_{(n+2)}N_n(SiH_2)_{(n-1)}$, where a, n≥1;
the Si-containing film forming composition comprising between approximately 95% w/w and approximately 100% w/w of the precursor;
the Si-containing film forming composition comprising between approximately 5% w/w and approximately 50% w/w of the precursor;
the Si-containing film forming composition comprising between approximately 0 ppbw and approximately 500 ppbw Al;
the Si-containing film forming composition comprising between approximately 0 ppbw and approximately 500 ppbw As;
the Si-containing film forming composition comprising between approximately 0 ppbw and approximately 500 ppbw Ba;
the Si-containing film forming composition comprising between approximately 0 ppbw and approximately 500 ppbw Be;
the Si-containing film forming composition comprising between approximately 0 ppbw and approximately 500 ppbw Bi;
the Si-containing film forming composition comprising between approximately 0 ppbw and approximately 500 ppbw Cd;

the Si-containing film forming composition comprising between approximately 0 ppbw and approximately 500 ppbw Ca;
the Si-containing film forming composition comprising between approximately 0 ppbw and approximately 500 ppbw Cr;
the Si-containing film forming composition comprising between approximately 0 ppbw and approximately 500 ppbw Co;
the Si-containing film forming composition comprising between approximately 0 ppbw and approximately 500 ppbw Cu;
the Si-containing film forming composition comprising between approximately 0 ppbw and approximately 500 ppbw Ga;
the Si-containing film forming composition comprising between approximately 0 ppbw and approximately 500 ppbw Ge;
the Si-containing film forming composition comprising between approximately 0 ppbw and approximately 500 ppbw Hf;
the Si-containing film forming composition comprising between approximately 0 ppbw and approximately 500 ppbw Zr;
the Si-containing film forming composition comprising between approximately 0 ppbw and approximately 500 ppbw In;
the Si-containing film forming composition comprising between approximately 0 ppbw and approximately 500 ppbw Fe;
the Si-containing film forming composition comprising between approximately 0 ppbw and approximately 500 ppbw Pb;
the Si-containing film forming composition comprising between approximately 0 ppbw and approximately 500 ppbw Li;
the Si-containing film forming composition comprising between approximately 0 ppbw and approximately 500 ppbw Mg;
the Si-containing film forming composition comprising between approximately 0 ppbw and approximately 500 ppbw Mn;
the Si-containing film forming composition comprising between approximately 0 ppbw and approximately 500 ppbw W;
the Si-containing film forming composition comprising between approximately 0 ppbw and approximately 500 ppbw Ni;
the Si-containing film forming composition comprising between approximately 0 ppbw and approximately 500 ppbw K;
the o Si-containing film forming composition comprising between approximately 0 ppbw and approximately 500 ppbw Na;
the Si-containing film forming composition comprising between approximately 0 ppbw and approximately 500 ppbw Sr;
the Si-containing film forming composition comprising between approximately 0 ppbw and approximately 500 ppbw Th;
the Si-containing film forming composition comprising between approximately 0 ppbw and approximately 500 ppbw Sn;
the Si-containing film forming composition comprising between approximately 0 ppbw and approximately 500 ppbw Ti;
the Si-containing film forming composition comprising between approximately 0 ppbw and approximately 500 ppbw U;
the Si-containing film forming composition comprising between approximately 0 ppbw and approximately 500 ppbw V;
the Si-containing film forming composition comprising between approximately 0 ppbw and approximately 500 ppbw Zn;
the Si-containing film forming organosilane composition comprising between approximately 0 ppmw and approximately 500 ppmw Cl;
the Si-containing film forming composition comprising between approximately 0 ppmw and approximately 500 ppmw Br;
the Si-containing film forming composition comprising between approximately 0 ppmw and approximately 500 ppmw I;
the Si-containing film forming composition comprising between approximately 0.0% w/w and 0.1% w/w TSA;
the Si-containing film forming composition comprising between approximately 0.0% w/w and 0.1% w/w $(SiH_3)_2$—N—$SiH_2X$, wherein X is Cl, Br, or I;
the Si-containing film forming composition comprising between approximately 0.0% w/w and 0.1% w/w $(SiH_3)_2$—N—$SiHX_2$, wherein X is Cl, Br, or I;
the Si-containing film forming composition comprising between approximately 0.0% w/w and 0.1% w/w $SiH_4$;
the Si-containing film forming composition comprising between approximately 0.0% w/w and 0.1% w/w $SiH_3X$, wherein X is Cl, Br, or I;
the Si-containing film forming composition comprising between approximately 0.0% w/w and 0.1% w/w $SiH_2X_2$, wherein X is Cl, Br, or I;
the Si-containing film forming composition comprising between approximately 0.0% w/w and 0.1% w/w $SnX_2$, wherein X is Cl, Br, or I;
the Si-containing film forming composition comprising between approximately 0.0% w/w and 0.1% w/w $SnX_4$, wherein X is Cl, Br, or I;
the Si-containing film forming composition comprising between approximately 0.0% w/w and 0.1% w/w HX, wherein X is Cl, Br, or I;
the Si-containing film forming composition comprising between approximately 0.0% w/w and 0.1% w/w $NH_3$;
the Si-containing film forming composition comprising between approximately 0.0% w/w and 0.1% w/w $NH_4X$, wherein X is Cl, Br, or I;
the Si-containing film forming composition comprising between approximately 0.0% w/w and 0.1% w/w ROH, wherein R is $C_1$-$C_4$ alkyl group;
the Si-containing film forming composition comprising between approximately 0.0% w/w and 0.1% w/w $NH_2R$, wherein R is a $C_1$-$C_4$ alkyl group;
the Si-containing film forming composition comprising between approximately 0.0% w/w and 0.1% w/w $NR_2H$, wherein R is a $C_1$-$C_4$ alkyl group;
the Si-containing film forming composition comprising between approximately 0.0% w/w and 0.1% w/w HN=R, wherein R is a $C_1$-$C_4$ alkyl group;
the Si-containing film forming composition comprising between approximately 0.0% w/w and 0.1% w/w tetrahydrofuran (THF);
the Si-containing film forming composition comprising between approximately 0.0% w/w and 0.1% w/w ether;

the Si-containing film forming composition comprising between approximately 0.0% w/w and 0.1% w/w pentane;

the Si-containing film forming composition comprising between approximately 0.0% w/w and 0.1% w/w cyclohexane;

the Si-containing film forming composition comprising between approximately 0.0% w/w and 0.1% w/w heptane; or the Si-containing film forming composition comprising between approximately 0.0% w/w and 0.1% w/w toluene.

Also disclosed are methods of depositing a Si-containing layer on a substrate. The composition disclosed above is introduced into a reactor having a substrate disposed therein. At least part of the mono-substituted TSA precursor is deposited onto the substrate to form the Si-containing layer using a vapor deposition method. Also disclosed are methods for forming a Si-containing film, the method comprising the steps of introducing into a reactor containing a substrate a vapor including a halosilazane or halogenated hydrosilazane precursor having a formula $$(SiH_a(NR_2)_bX_c)_{(n+2)}N_n(SiH_{(2-d)}X_d)_{(n-1)}$$

where X is selected from a halogen atom selected from F, Cl, Br or I; R each is selected from H, a $C_1$-$C_6$ linear or branched, saturated or unsaturated hydrocarbyl group, or a silyl group [$SiR'_3$]. For the subgenus comprising a silyl group [$SiR'_3$] each R' is independently selected from H, a halogen atom selected from F, Cl, Br or 1, a $C_1$-$C_4$ saturated or unsaturated hydrocarbyl group, a $C_1$-$C_4$ saturated or unsaturated alkoxy group, or an amino group [—$NR^1R^2$] with each $R^1$ and $R^2$ being further selected from H or a $C_1$-$C_6$ linear or branched, saturated or unsaturated hydrocarbyl group; each a, b, c is independently 0 to 3; a+b+c=3; d is 0 to 2 and n≥1, and depositing at least part of the halosilazane or halogenated hydrosilazane precursor onto the substrate to form the silicon-containing film on the substrate using a vapor deposition process. The disclosed methods may have one or more of the following aspects:

introducing into the reactor a vapor comprising a second precursor;

an element of the second precursor being selected from the group consisting of group 2, group 13, group 14, transition metal, lanthanides, and combinations thereof;

the element of the second precursor being selected from As, B, P, Si, Ge, Al, Zr, Hf, Ti, Nb, Ta, or lanthanides;

the element of the second precursor being selected from the group consisting of Ti, Hf, Zr, Ta, Nb, V, Al, Sr, Y, Ba, Ca, As, B, P, Sb, Bi, Sn, Ge, and combinations thereof;

introducing a reactant into the reactor;

the reactant being selected from the group consisting of $O_2$, $O_3$, $H_2O$, $H_2O_2$, NO, $NO_2$, $N_2O$, alcohols, diols, carboxylic acids, ketones, ethers, O atoms, O radicals, O ions, ammonia, $N_2$, N atoms, N radicals, N ions, saturated or unsaturated hydrazine, amines, diamines, ethanolamine, $H_2$, H atoms, H radicals, H ions, and combinations thereof;

the reactant being selected from the group consisting of $O_2$, $O_3$, $H_2O$, $H_2O_2$, NO, $NO_2$, a carboxylic acid, an alcohol, a diol, radicals thereof, and combinations thereof;

the reactant being plasma treated oxygen;

the Si-containing layer being a silicon oxide containing layer;

the reactant being selected from the group consisting of $N_2$,$H_2$, $NH_3$, hydrazines (such as $N_2H_4$, $MeHNNH_2$, MeHNNHMe), organic amines (such as $NMeH_2$, $NEtH_2$, $NMe_2H$, $NEt_2H$, $NMe_3$, $NEt_3$, $(SiMe_3)_2NH$), pyrazoline, pyridine, diamines (such as ethylene diamine), radical species thereof, and mixtures thereof;

the vapor deposition method being a chemical vapor deposition process;

the vapor deposition method being an ALD process;

the vapor deposition method being a spatial ALD process;

the vapor deposition process being a flowable CVD process;

the silicon-containing layer being Si;

the silicon-containing layer being $SiO_2$;

the silicon-containing layer being SiN;

the silicon-containing layer being SiON;

the silicon-containing layer being SiOC;

the silicon-containing layer being SiOCN;

the silicon-containing layer being SiCN;

thermal annealing the Si-containing layer;

thermal annealing the Si-containing layer under a reactive atmosphere;

UV curing the Si-containing layer; and

Electron beam curing the Si-containing layer.

Also disclosed are methods for halogenation of a hydrosilazane to produce a halosilazane, the methods comprising the step of contacting the hydrosilazane with a halogenating agent in a liquid phase to produce the halosilazane, the halosilazane having a formula $$(SiH_a(NR^2)_bX_c)_{(n+2)}N_n(SiH_{(2-d)}X_d)_{(n-1)},$$

where X is selected from a halogen atom selected from F, Cl, Br or I; R each is selected from H, a $C_1$-$C_6$ linear or branched, saturated or unsaturated hydrocarbyl group, or a silyl group [$SiR'_3$]; and each a, b, c is independently 0 to 3; a+b+c=3; d is 0 to 2 and n≥1. For the subgenus comprising a silyl group [$SiR'_3$] each R' is independently selected from H, a halogen atom selected from F, Cl, Br or I, a $C_1$-$C_4$ saturated or unsaturated hydrocarbyl group, a $C_1$-$C_4$ saturated or unsaturated alkoxy group, or an amino group [—$NR^1R^2$] with each $R^1$ and $R^2$ further being selected from H or a $C_1$-$C_6$ linear or branched, saturated or unsaturated hydrocarbyl group. The disclosed methods may have one or more of the following aspects:

adding the halogenating agent into a solvent to form a solution of the halogenating agent;

mixing the solution of the halogenating agent with the hydrosilazane to form a mixture;

separating the halosilazane from the mixture;

adding a catalyst to the solution of the halogenation agent;

stirring the mixture while monitoring the halogenation;

the catalyst being a homogeneous catalyst;

the homogeneous catalyst being selected from $BPh_3$, $B(SiMe_3)_3$ or the like;

the catalyst being a heterogeneous catalyst;

the heterogeneous catalyst being selected from Ru, Pt or Pd in elemental form;

the heterogeneous catalyst being selected from Ru, Pt or Pd deposited on an inert surface;

the inert surface being a surface of carbon, silica, alumina, molecular sieves, or the like;

the catalyst not possessing strong electro- or nucleophilicity;- the catalyst not forming acids as strong electro- or nucleophilic byproducts by interaction with hydrosilanzanes;

the catalysts being thermally stable;

the catalyst accelerating the halogenation reactions in hydrocarbon solvents such as toluene, xylene or the like;

the halogenation agent being a trityl halide selected from Ph$_3$CX (X=Cl, Br, I);

a selection of the halogenation reagents, catalysts, ratio of starting compounds and the reaction conditions (e.g., type of solvents, concentrations, temperature, pressure) for achieving the best selectivity of halogenation of hydrosilazanes being highly preferred;

the ratio of the amount of the halogenated agent relative to the hydrosilazane being from approximately 1 to 100% for selective synthesis of the halosilazane;

the ratio of the amount of the halogenated agent relative to the hydrosilazane being from approximately 20% to approximately 40% for selective synthesis of the halosilazane;

the ratio of the amount of the halogenated agent relative to the hydrosilazane being from approximately 1 to 100% for selective synthesis of mono-halogenated compound $(Si_aH_{2a+1})_{n+1}(Si_aH_{2a}(X))N_n(SiH_2)_{(n-1)}$ or $(SiH_a(NR_2)_b(X))_{(n+2)}N_n(SiH_2)_{(n-1)}$ (X, R, a, b and n refer to formula I to IV);

the ratio of the amount of the halogenated agent relative to the hydrosilazane being from approximately 20% to approximately 40% for selective synthesis of mono-halogenated compound $(Si_aH_{2a+1})_{n+1}(Si_aH_{2a}(X))N_n(SiH_2)_{(n-1)}$ or $(SiH_a(NR_2)_b(X))_{(n+2)}N_n(SiH_2)_{(n-1)}$ (X, R, a, b and n refer to formula I to IV);

the ratio of the amount of a trityl halides relative to $(Si_aH_{2a+1})_{(n+2)}N_n(SiH_2)_{(n-1)}$ or $(SiH_a(NR_2)_b)_{(n+2)}N_n(SiH_2)_{(n-1)}$ being from approximately 1 to 100% for selective preparation of monohalogenated compound $(Si_aH_{2a+1})_{n+1}(Si_aH_{2a}(X))N_n(SiH_2)_{(n-1)}$ or $(SiH_a(NR_2)_b(X))_{(n+2)}N(SiH_2)_{(n-1)}$ (X, R, a, b and n refer to formula I to IV);

the ratio of the amount of trityl halides relative to $(Si_aH_{2a+1})_{(n+2)}N_n(SiH_2)_{(n-1)}$ or $(SiH_a(NR_2)_b)_{(n+2)}N_n(SiH_2)_{(n-1)}$ being from approximately 20% to approximately 40% for selective preparation of monohalogenated compound $(Si_aH_{2a+1})_{n+1}(Si_aH_{2a}(X))N_n(SiH_2)_{(n-1)}$ or $(SiH_a(NR_2)_b(X))_{(n+2)}N_n(SiH_2)_{(n-1)}$ (X, R, a, b and n refer to formula I to IV);

approximately 1.5 to approximately 10 molar excess of hydrosilazanes relative to the halogenated agent for selective preparation of monohalogenated compounds $(Si_aH_{2a+1})_{n+1}(Si_aH_{2a}(X))N_n(SiH_2)_{(n-1)}$ or $(SiH_a(NR_2)_b(X))_{(n+2)}N_n(SiH_2)_{(n-1)}$ (X, R, a, b and n refer to formula I to IV);

approximately 1.5 to approximately 10 molar excess of hydrosilazanes relative to trityl halides for selective preparation of monohalogenated compounds $(Si_aH_{2a+1})_{n+1}(Si_aH_{2a}(X))N_n(SiH_2)_{(n-1)}$ or $(SiH_a(NR_2)_b(X))_{(n+2)}N_n(SiH_2)_{(n-1)}$ (X, R, a, b and n refer to formula I to IV);

the approximate amount of catalyst varying from approximately 0.1 mol % to approximately 10 mol % relative to the halogenating agent;

the approximate amount of catalyst varying from 2 mol % to 6 mol % relative to the halogenating agent;

the selectivity of halogenation of the hydrosilazane ranging from approximately 30% to approximately 100%;

the selectivity of halogenation of the hydrosilazane ranging from approximately 70% to approximately 97%;

the selectivity of halogenation of the hydrosilazane ranging from approximately 80% to approximately 91%;

the yield of halogenation of the hydrosilazane ranging from approximately 30% to approximately 100%;

the yield of halogenation of the hydrosilazane ranging from approximately 30% to approximately 90%;

the yield of halogenation of the hydrosilazane ranging from approximately 40% to approximately 80%;

the yield of halogenation of the hydrosilazane ranging from approximately 50% to approximately 80%;

the yield of halogenation of the hydrosilazane ranging from approximately 60% to approximately 80%;

the solvents being a hydrocarbon solvent;

the hydrocarbon solvents being selected from toluene, xylene, mesitylene, anisole, pentane, hexane, heptane, octane) and mixtures thereof;

the solvents being a halogen-containing hydrocarbon solvent;

the halogen-containing hydrocarbon solvents being selected from methylene chloride, chloroform, chloroethanes, chlorobenzenes or mixtures thereof;

the trityl halides being reacted in a halogenated aliphatic or aromatic solvent;

the halogenated aliphatic or aromatic hydrocarbons including methylene chloride, chloroform, chloroethanes, chlorobenzenes;

the halogenated aliphatic or aromatic hydrocarbons being recycled and reused;

applying trityl halides when a reaction is performed in a non-halogenated aliphatic or aromatic solvent $C_xH_y$;

the halogenation reaction being performed in a temperature range from approximately 20° C. to approximately 200° C.;

the halogenation reaction being performed in a temperature range from room temperature to approximately 200° C.;

the halogenation reaction being performed in a temperature from approximately 20° C. to approximately 150° C.;

the halogenation reaction being performed in a temperature from approximately 20° C. to approximately 120° C.;

the halogenation reaction being performed in a temperature from approximately 200° C. to approximately 100° C.;

the halogenation reaction being performed in a temperature from approximately 25° C. to approximately 150° C.;

the halogenation reaction being performed in a temperature from approximately 25° C. to approximately 120° C.;

the halogenation reaction being performed in a temperature from approximately 25° C. to approximately 100° C.;

the halogenation reaction being performed in a temperature from approximately 25° C. to approximately 65° C.;

the halogenation reaction being performed in a temperature from approximately 50° C. to approximately 120° C.;

the halogenation reaction being performed in a temperature from approximately 70° C. to approximately 120° C. in the presence of catalyst;

the halogenation reaction being performed in a temperature from approximately 40° C. to approximately 70° C. in the presence of catalyst;

the halogenation process being performed in a batch reactor or in a flow reactor with or without catalyst;

a batch process being applied for syntheses of the halosilazanes;

the batch process being performed in a batch reactor comprising of the steps of:
a. preparing a solution of a halogenation agent in a suitable solvent with or without a catalyst in the reactor;
b. adding the solution into the reactor;
c. charging the reactor with the hydrosilazane with or without a solvent;
d. stirring the obtained mixture with or without heating while monitoring the reaction progress;
e. isolating the product by distillation straight from the reactor or directing the reaction mix (with optional filtration) into a separate distillation unit that allows:
 i. isolating of the unreacted starting material(s);
 ii. isolating of the chlorinated silazane product(s);
 iii. isolating of the byproducts (optional);
 iv. recovering the solvent (optional);
f. directing the isolated starting material, the recovered solvent and the catalyst (optional) into the steps a and b.
a flow process being applied for syntheses of the halosilazanes;
the flow process being performed in a flow reactor comprising of the steps of:
a. preparing a solution of the halogenation agent (e.g., $Ph_3C(X)$ in a suitable solvent;
b. adding the hydrosilazane (e.g., TSA) and the solution of the halogenation agent in a suitable solvent into the flow reactor;
c. recirculation of reaction mixture consisting of TSA and the solution of the halogenation agent in the suitable solvent through the flow reactor, while monitoring degree of conversion to TSA-X (X=F, Cl, Br or I) by means of Raman Spectroscopy;
d. delivering the reaction mixture into the receiver, cooling the reaction mixture for precipitation of unreacted halogenation agent ($Ph_3C(X)$);
e. filtration of the unreacted halogenation agent;
f. delivering the reaction mixture in a crude distillation setup;
g. isolating the product halosilazanes by distillation that allows:
 1) isolating of the unreacted starting material(s) (e.g., TSA);
 2) isolating of the product halosilazanes, (e.g., TSA-X);
 3) isolating of byproducts (e.g., $TSA-X_2$), and/or other aminosilanes; and
 4) recovering the solvent;
h. directing the products (TSA-X) into UHP distillation setup that allows isolation of UHP products; and
i. alternatively, directing the products (TSA-X) into reactor for synthesis of aminosilanes from the product halosilazanes, (e.g., TSA-X) and a suitable amine.
approximately 5% to approximately 80% of the starting inorganic hydrosilazanes being converted to the halogenated counterpart.
approximately 10% to approximately 50% of the starting inorganic hydrosilazanes being converted to the halogenated counterpart.
the pressure of the halogenation process ranging from approximately 0 to approximately 50 psig;
the pressure of the halogenation process ranging from approximately 0 to approximately 20 psig;
monitoring the reaction progress by Raman spectroscopy using an internal or an external Raman probe;
the produced halosilazanes being isolated from the reaction mixture by a distillation, crystallization or filtration processes;
the produced halosilazanes being isolated from the reaction mixture by a fractional distillation;
the pressure during the fractional distillation being from approximately 0.1 torr to approximately 760 torr;
the pressure during the fractional distillation being from approximately 1 torr to approximately 100 torr;
the temperature during the fractional distillation being from approximately 20° C. to approximately 100° C.;
the temperature during the fractional distillation being from approximately 25° C. to approximately 65° C.;
the solvent and unreacted starting compounds being used for the next batch;
the produced halosilazanes being used with or without isolation or deep purification for further syntheses;
the halogenation process being monitored by Raman spectroscopy, Gas chromatography or any other suitable means;
in a flow process, the degree of conversion of hydrosilazanes to halosilazanes being monitored by on-line Raman spectroscopy and the reaction mixture being recirculated through the flow reactor until the desired degree of conversion is achieved; and
the flow process being performed under an inert atmosphere, such as $N_2$, a noble gas (i.e., He, Ne, Ar, Kr, Xe), or combinations thereof.

Also disclosed are nitrogen-doped silicon oxide films formed by the process of introducing into a reactor containing a substrate a vapor including a mono-substituted TSA precursor to form a silicon-containing layer on the substrate; reacting an oxidizing agent with the silicon-containing layer to form an oxidized silicon-containing layer by introducing the oxidizing agent into the reactor; reacting the mono-substituted TSA precursor with the oxidized silicon-containing layer to form a silicon-rich oxidized silicon-containing layer by introducing the mono-substituted TSA precursor into the reactor; and reacting a nitrogen-containing reactant with the silicon-containing layer to form the nitrogen-doped silicon oxide film by introducing the nitrogen-containing reactant into the reactor. The mono-substituted TSA precursors have a formula $(SiH_3)_2N—SiH_2—X$, wherein X is selected from a halogen atom selected from Cl, Br or I; an isocyanato group [—NCO]; an amino group [—$NR^1R^2$]; a N-containing $C_4$-$C_{10}$ saturated or unsaturated heterocycle; or an alkoxy group [—O—R]; $R^1$, $R^2$ and R each is selected from H; a $C_1$-$C_6$ linear or branched, saturated or unsaturated hydrocarbyl group; or a silyl group $SiR'_3$ with each R' being independently selected from H; a halogen atom selected from Cl, Br, or I; a $C_1$-$C_4$ saturated or unsaturated hydrocarbyl group: a $C_1$-$C_4$ saturated or unsaturated alkoxy group; or an amino group —$NR^3R^4$ with each $R^3$ and $R^4$ being selected from H or a $C_1$-$C_6$ linear or branched, saturated or unsaturated hydrocarbyl group, provided that if $R^1$=H, then $R^2 \neq$ H or Me. The process to produce the disclosed nitrogen-doped silicon oxide films may include one or more of the following aspects:
purging the reactor with an inert gas between each introduction step;
the mono-substituted TSA precursor wherein X is a halogen atom;
the mono-substituted TSA precursor being $(SiH_3)_2N—SiH_2—Cl$;
the mono-substituted TSA precursor being $(SiH_3)_2N—SiH_2—Br$;

the mono-substituted TSA precursor being $(SiH_3)_2N—SiH_2—$;
the mono-substituted TSA precursor wherein X is a isocyanate —NCO (i.e., being $(SiH_3)_2N—SiH_2—NCO$);
the mono-substituted TSA precursor wherein X is an amino group [—NR$^1$R$^2$];
the mono-substituted TSA precursor being $(SiH_3)_2N—SiH_2—NiPr_2$;
the mono-substituted TSA precursor being $(SiH_3)_2N—SiH_2—NHiPr$;
the mono-substituted TSA precursor being $(SiH_3)_2N—SiH_2—NHtBu$;
the mono-substituted TSA precursor not being $(SiH_3)_2—N—SiH_2—N(SiH_3)(SiH_2(NHEt))$ (i.e., when X=NR$^1$R$^2$ and R$^1$ is SiH$_3$ and R$^2$ is NHEt);
the mono-substituted TSA precursor being $(SiH_3)_2N—SiH_2—NEt_2$;
the mono-substituted TSA precursor being $(SiH_3)_2N—SiH_2\,NEtMe$;
the mono-substituted TSA precursor being $(SiH_3)_2N—SiH_2\,NMe_2$;
the mono-substituted TSA precursor being $(SiH_3)_2N—SiH_2\,NMeiPr$;
the mono-substituted TSA precursor being $(SiH_3)_2N—SiH_2\,NEtiPr$;
the mono-substituted TSA precursor wherein X is —N(SiR$_3$)$_2$, wherein each R is independently selected from a halogen, H, or a C$_1$-C$_4$ alkyl group;
the mono-substituted TSA precursor being $(SiH_3)_2N—SiH_2—N(SiCl_3)_2$;
the mono-substituted TSA precursor being $(SiH_3)_2N—SiH_2—N(SiBr_3)_2$;
the mono-substituted TSA precursor being $(SiH_3)_2N—SiH_2—N(SiI_3)_2$;
the mono-substituted TSA precursor being $(SiH_3)_2N—SiH_2—N(SiH_3)_2$;
the mono-substituted TSA precursor being $(SiH_3)_2—N—SiH_2—N(SiH_3)(SiH_2Cl)$;
the mono-substituted TSA precursor being $(SiH_3)_2—N—SiH_2—N(SiH_3)(SiH_2(NEt_2))$;
the mono-substituted TSA precursor being $(SiH_3)_2—N—SiH_2—N(SiH_3)(SiH_2(NiPr_2))$;
the mono-substituted TSA precursor being $(SiH_3)_2—N—SiH_2—N(SiH_3)(SiH_2(NHtBu))$;
the mono-substituted TSA precursor being $(SiH_3)_2—N—SiH_2—N(SiH_3)(SiH_2OEt)$;
the mono-substituted TSA precursor being $(SiH_3)_2—N—SiH_2—N(SiH_3)(SiH_2OiPr)$;
the mono-substituted TSA precursor being $(SiH_3)_2N—SiH_2—N(SiMe_3)_2$;
the mono-substituted TSA precursor being $(SiH_3)_2N—SiH_2—NH(SiMe_3)$;
the mono-substituted TSA precursor being $(SiH_3)_2N—SiH_2—N(SiEt_3)_2$;
the mono-substituted TSA precursor being $(SiH_3)_2—N—SiH_2—N(SiMe_2Et)_2$;
the mono-substituted TSA precursor being $(SiH_3)_2—N—SiH_2—N(SiMe_2iPr)_2$;
the mono-substituted TSA precursor being $(SiH_3)_2—N—SiH_2—N(SiMe_2nPr)_2$;
the mono-substituted TSA precursor wherein X is a N-containing C$_4$-C$_{10}$ heterocycle;
the mono-substituted TSA precursor wherein the N-containing C$_4$-C$_{10}$ heterocycle is selected from pyrrolidine, pyrrole, and piperidine;
the mono-substituted TSA precursor being $(SiH_3)_2N—SiH_2$-(pyrrolidine);
the mono-substituted TSA precursor being $(SiH_3)_2N—SiH_2$-(pyrrole);
the mono-substituted TSA precursor being $(SiH_3)_2N—SiH_2$-(piperidine);
the mono-substituted TSA precursor wherein X is an alkoxy group [—O—R];
the mono-substituted TSA precursor being $(SiH_3)_2N—SiH_2—(OH)$;
the mono-substituted TSA precursor being $(SiH_3)_2N—SiH_2—(OMe)$;
the mono-substituted TSA precursor being $(SiH_3)_2N—SiH_2—(OEt)$;
the mono-substituted TSA precursor being $(SiH_3)_2N—SiH_2—(OiPr)$;
the mono-substituted TSA precursor being $(SiH_3)_2N—SiH_2—(OnPr)$;
the mono-substituted TSA precursor being $(SiH_3)_2N—SiH_2—(OtBu)$;
the mono-substituted TSA precursor wherein X is —O—SiR$_3$ and each R is independently selected from H, a halogen, or a C$_1$-C$_4$ hydrocarbyl group;
the mono-substituted TSA precursor being $(SiH_3)_2N—SiH_2—(OSiH_3)$;
the mono-substituted TSA precursor being $(SiH_3)_2N—SiH_2—(OSiCl_3)$;
the mono-substituted TSA precursor being $(SiH_3)_2N—SiH_2—(OSiBr_3)$;
the mono-substituted TSA precursor being $(SiH_3)_2N—SiH_2—(OSiI_3)$;
the mono-substituted TSA precursor being $(SiH_3)_2N—SiH_2—(OSiMe_3)$;
the reactant being selected from the group consisting of O$_2$, O$_3$, H$_2$O, H$_2$O$_2$, NO, NO$_2$, a carboxylic acid, an alcohol, a diol, radicals thereof, and combinations thereof; and
the reactant being selected from the group consisting of N$_2$,H$_2$, NH$_3$, hydrazines (such as N$_2$H$_4$, MeHNNH$_2$, MeHNNHMe), organic amines (such as NMeH$_2$, NEtH$_2$, NMe$_2$H, NEt$_2$H, NMe$_3$, NEt$_3$, (SiMe$_3$)$_2$NH), pyrazoline, pyridine, diamines (such as ethylene diamine), radical species thereof, and mixtures thereof.

Notation and Nomenclature

The following detailed description and claims utilize a number of abbreviations, symbols, and terms, which are generally well known in the art. While definitions are typically provided with the first instance of each acronym, for convenience, Table 1 provides a list of the abbreviations, symbols, and terms used along with their respective definitions.

TABLE 1

| | |
|---|---|
| a or an | One or more than one |
| Approximately or about | ±10% of the value stated |
| LCD-TFT | liquid-crystal display-thin-film transistor |
| MIM | Metal-insulator-metal |
| DRAM | dynamic random-access memory |
| FeRam | Ferroelectric random-access memory |
| OLED | organic light-emitting diode |
| CVD | chemical vapor deposition |
| LPCVD | low pressure chemical vapor deposition |
| PCVD | pulsed chemical vapor deposition |
| SACVD | sub-atmospheric chemical vapor deposition |
| PECVD | plasma enhanced chemical vapor deposition |
| APCVD | atmospheric pressure chemical vapor deposition |
| HWCVD | hot-wire chemical vapor deposition |

TABLE 1-continued

| | |
|---|---|
| FCVD | flowable chemical vapor deposition |
| MOCVD | metal organic chemical vapor deposition |
| ALD | atomic layer deposition |
| spatial ALD | spatial atomic layer deposition |
| HWALD | hot-wire atomic layer deposition |
| PEALD | plasma enhanced atomic layer deposition |
| sccm | standard cubic centimeters per minute |
| MP | melting point |
| TGA | thermogravimetric analysis |
| SDTA | simultaneous differential thermal analysis |
| GCMS | gas chromatography-mass spectrometry |
| TSA | trisilylamine |
| SRO | strontium ruthenium oxide |
| HCDS | hexachlorodisilane |
| PCDS | pentachlorodisilane |
| OCTS | n-octyltrimethoxysilane |
| MCS | monochlorosilane |
| DCS | dichlorosilane |
| TSA | Trisilylamine |
| DSA | disilylamine |
| TriDMAS or TDMAS | tris(dimethylamino)silane or SiH(NMe$_2$)$_3$ |
| BDMAS | bis(dimethylamino)silane or SiH$_2$(NMe$_2$)$_2$ |
| BDEAS | bis(diethylamino)silane or SiH$_2$(NEt$_2$)$_2$ |
| TDEAS | tris(diethylamino)silane or SiH(NEt$_2$)$_3$ |
| TEMAS | tris(ethylmethylamino)silane or SiH(NEtMe)$_3$ |
| TMA | trimethyl aluminum or AlMe$_3$ |
| PET | polyethylene terephthalate |
| TBTDEN | (tert-butylimido)bis(dimethylamino)niobium or Nb(=NtBu)(NMe$_2$)$_2$ |
| PEN | polyethylene naphthalate |
| PEDOT:PSS | poly(3,4-ethylenedioxythiophene)poly(styrenesulfonate) |
| Alkyl group | saturated functional groups containing exclusively carbon and hydrogen atoms, including linear, branched, or cyclic alkyl groups |
| Me | Methyl |
| Et | Ethyl |
| iPr | isopropyl |
| aryl | aromatic ring compounds where one hydrogen atom has been removed from the ring |
| heterocycle | cyclic compounds that has atoms of at least two different elements as members of its ring |
| PTFE | Polytetrafluoroethylene |

As used herein, hydrosilazanes refer to linear or branched analogs of a general formulae (Si$_a$H$_{2a+1}$)$_{(n+2)}$N$_n$(SiH$_2$)$_{(n-1)}$ (where a, n≥1). For example, TSA (n=1, a=1), bis(disilylamino)silane (BDSASi, (SiH$_3$)$_2$—N—SiH$_2$—N—(SiH$_3$)$_2$) (n=2, a=1), tris(disilanyl)amine (n=1, a=2), cyclic silazanes {(SiH$_3$)N(SiH$_2$)}n (with n>2) (e.g., N,N', N''trisilylcyclotrisilazane {(H$_3$Si)N(SiH$_2$)}3 (n=3)). The hydrosilazanes are silazanes containing combinations of a and n in the above formulae as well as silazanes containing catenated Si atoms.

As used herein, inorganic hydrosilazanes of general formula (SiH$_a$(NR$_2$)$_b$)$_{(n+2)}$N$_n$(SiH$_2$)$_{(n-1)}$ (n≥1, each a, b is independently 0 to 3, a+b=3, R=alkyl group) include TSA (n=1, a=3, b=0), bis(disilylamino)silane (n=2, a=3, b=0), diethylaminotrisilylamine (n=1, a=3, b=0 and a=2, b=1, R=Et), diisopropylaminotrisilylamine (n=1, a=3, b=0 and a=2, b=1, R=$^i$Pr), diisobutylaminotrisilylamine (n=1, a=3, b=0 and a=2, b=1, R=$^i$Bu), tertbutylaminotrisilylamine or silanediamine, N'-(1,1-dimethylethyl)-N,N-disilyl- (n=1, a=3, b=0 and a=2, b=1, R=$^t$Bu and H). The term "inorganic hydrosilazanes" is used because silicon atoms are connected to at least one hydrogen atom and nitrogen atom, the silicon atoms may be connected to halogen atom but are not connected to carbon atoms.

Throughout the present context, "X" is used to represent halogen elements, F, Cl, Br or I.

In the present context, a heterogeneous catalyst is understood to mean a catalyst that is present in a different phase from the reactants. It can be combined with a substrate, which is intrinsically inert or less active (compared to the catalyst material) for this chemical reaction (the "support"). A homogeneous catalyst is understood to mean a catalyst that is present in the same phase as the reactants.

As used herein, "room temperature" in the text or in a claim means from approximately 20° C. to approximately 25° C.

The term "wafer" or "patterned wafer" refers to a wafer having a stack of silicon-containing films on a substrate and a patterned hardmask layer on the stack of silicon-containing films formed for pattern etch.

The term "substrate" refers to a material or materials on which a process is conducted. The substrate may refer to a wafer having a material or materials on which a process is conducted. The substrates may be any suitable wafer used in semiconductor, photovoltaic, flat panel, or LCD-TFT device manufacturing. The substrate may also have one or more layers of differing materials already deposited upon it from a previous manufacturing step. For example, the wafers may include silicon layers (e.g., crystalline, amorphous, porous, etc.), silicon containing layers (e.g., SiO$_2$, SiN, SiON, SiCOH, etc.), metal containing layers (e.g., copper, cobalt, ruthenium, tungsten, platinum, palladium, nickel, ruthenium, gold, etc.) or combinations thereof. Furthermore, the substrate may be planar or patterned. The substrate may be an organic patterned photoresist film. The substrate may include layers of oxides which are used as dielectric materials in MEMS, 3D NAND, MIM, DRAM, or FeRam device applications (for example, ZrO$_2$ based materials, HfO$_2$ based materials, TiO$_2$ based materials, rare earth oxide based materials, ternary oxide based materials, etc.) or nitride-based films (for example, TaN, TiN, NbN) that are used as electrodes. One of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates.

The term of "deposit" or "deposition" refers to a series of processes where materials at atomic or molecular levels are deposited on a wafer surface or on a substrate from a gas state (vapor) to a solid state as a thin layer. Chemical reactions may be involved in the process, which may occur after creation of a plasma of the reacting gases. The plasma may be a CCP, as described above, generally created by radio frequency (RF) (alternating current (AC)) frequency or direct current (DC) discharge between two electrodes, the space between which is filled with the reacting gases. The deposition methods may include atomic layer deposition (ALD) and chemical vapor deposition (CVD).

The term "mask" refers to a layer that resists etching. The hardmask layer may be located above the layer to be etched.

The term "aspect ratio" refers to a ratio of the height of a trench (or aperture) to the width of the trench (or the diameter of the aperture).

The term "selectivity" means the relative selectivity of halogenation process (e.g., TSA-Cl as a halogenating agent) expressed as a selectivity coefficient (r) from GC chromatogram, wherein:

$$r(\%) = I_{TSA-Cl}/(I_{TSA-Cl} + \Sigma I_{(all\ side\ products)}),$$

where $I_{TSA-Cl}$ is the intensity of TSA-Cl signal in GC chromatogram of products, $\Sigma I_{(all\ side\ products)}$ is sum of the intensities of all side products, which may include SiH$_4$, MCS, DCS, (H$_3$Si)$_2$N(SiHCl$_2$), (H$_3$Si)N(SiH$_2$Cl)$_2$, (H$_3$Si)N(SiH$_2$)N(SiH$_3$)$_3$, other chlorinated and non-chlorinated TSA oligomers.

Note that herein, the terms "film" and "layer" may be used interchangeably. It is understood that a film may correspond to, or related to a layer, and that the layer may refer to the film. Furthermore, one of ordinary skill in the art will recognize that the terms "film" or "layer" used herein refer to a thickness of some material laid on or spread over a surface and that the surface may range from as large as the entire wafer to as small as a trench or a line.

The standard abbreviations of the elements and standard names of groups of elements from the periodic table of elements are used herein. It should be understood that elements may be referred to by these abbreviations (e.g., Si refers to silicon, N refers to nitrogen, O refers to oxygen, C refers to carbon, H refers to hydrogen, F refers to fluorine, Hal refers to halogens, which are F, Cl, Br or I, At, etc.).

The unique CAS registry numbers (i.e., "CAS") assigned by the Chemical Abstract Service are provided to identify the specific molecules disclosed.

Please note that the silicon-containing films, such as SiN and SiO, are listed throughout the specification and claims without reference to their proper stoichiometry. The silicon-containing films may include pure silicon (Si) layers, such as crystalline Si, poly-silicon (p-Si or polycrystalline Si), or amorphous silicon; silicon nitride ($Si_kN_l$) layers; or silicon oxide ($Si_nO_m$) layers; or mixtures thereof, wherein k, l, m, and n, inclusively range from 0.1 to 6. Preferably, silicon nitride is $Si_kN_l$, where k and l each range from 0.5 to 1.5. More preferably silicon nitride is $Si_3N_4$. Herein, SiN in the following description may be used to represent $Si_kN_l$ containing layers. Preferably silicon oxide is $Si_nO_m$, where n ranges from 0.5 to 1.5 and m ranges from 1.5 to 3.5. More preferably, silicon oxide is $SiO_2$. Herein, SiO in the following description may be used to represent $Si_nO_m$ containing layers. The silicon-containing film could also be a silicon oxide based dielectric material such as organic based or silicon oxide based low-k dielectric materials such as the Black Diamond II or III material by Applied Materials, Inc. with a formula of SiOCH. Silicon-containing film may also include $Si_aO_bN_c$ where a, b, c range from 0.1 to 6. The silicon-containing films may also include dopants, such as B, C, P, As and/or Ge.

Ranges may be expressed herein as from about one particular value, and/or to about another particular value. When such a range is expressed, it is to be understood that another embodiment is from the one particular value and/or to the other particular value, along with all combinations within said range.

Reference herein to "one embodiment" or "an embodiment" means that a particular feature, structure, or characteristic described in connection with the embodiment may be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

As used herein, the term "independently" when used in the context of describing R groups should be understood to denote that the subject R group is not only independently selected relative to other R groups bearing the same or different subscripts or superscripts, but is also independently selected relative to any additional species of that same R group. For example in the formula $MR^1_x(NR^2R^3)_{(4-x)}$, where x is 2 or 3, the two or three $R^1$ groups may, but need not be identical to each other or to $R^2$ or to $R^3$. Further, it should be understood that unless specifically stated otherwise, values of R groups are independent of each other when used in different formulas.

BRIEF DESCRIPTION OF THE FIGURES

For a further understanding of the nature and objects of the present invention, reference should be made to the following detailed description, taken in conjunction with the accompanying figure wherein.

DESCRIPTION OF PREFERRED EMBODIMENTS

Figure 1:
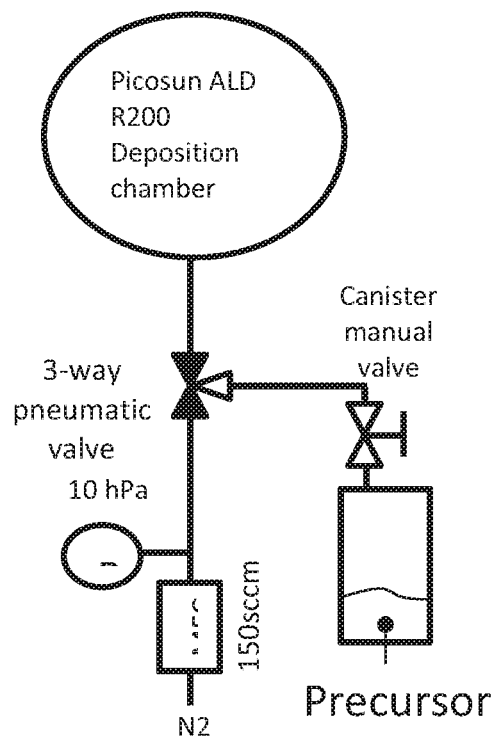
FIG. 1 is a diagram of the Picosun R200 PEALD 8" deposition tool used to perform the depositions in Examples 4-6.

Disclosed are Si-containing film forming compositions comprising halosilazane or inorganic halosilazane or halogenated hydrosilazane precursors having a general formula:

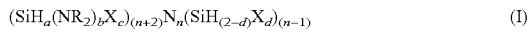

$$(SiH_a(NR_2)_bX_c)_{(n+2)}N_n(SiH_{(2-d)}X_d)_{(n-1)} \qquad (I)$$

where X is selected from a halogen atom selected from F, Cl, Br or I; R each is selected from, saturated or unsaturated hydrocarbyl group. Preferably, R is an alkyl group selected from Me, Et, Pr, $^iPr$, Bu, $^iBu$, or $^tBu$.

When the H, a $C_1$-$C_6$ linear or branched, saturated or unsaturated hydrocarbyl group, or a silyl group [$SiR'_3$]; and each a, b, c is independently 0 to 3; a+b+c=3; d is 0 to 2 and n≥1. In the subgenus comprising a silyl group [$SiR'_3$], each R' is independently selected from H, a halogen atom selected from F, Cl, Br or I, a $C_1$-$C_4$ saturated or unsaturated hydrocarbyl group, a $C_1$-$C_4$ saturated or unsaturated alkoxy group, or an amino group [—$NR^1R^2$] with each $R^1$ and $R^2$ being further selected from H or a $C_1$-$C_6$ linear or branched disclosed halosilazane or halogenated hydrosilazane precursors do not contain R, the disclosed halosilazane or halogenated hydrosilazane precursors are carbon-free halosilazanes having a general formula:

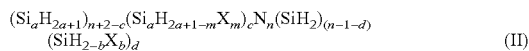
$$(Si_aH_{2a+1})_{n+2-c}(Si_aH_{2a+1-m}X_m)_cN_n(SiH_2)_{(n-1-d)}(SiH_{2-b}X_b)_d \quad (II)$$

where X is a halogen atom selected from F, Cl, Br or I; a, n≥1; 0<m<2a+1; b=0-2; 0<c<n+2 and 0≤d<n−1.

The disclosed Si-containing film forming compositions have a number of silicon atoms higher than 1, and preferably higher than 2, without a direct Si—C bond, and are polar molecules. Volatility and lack of Si—C bond in the structure of the disclosed halosilazane precursors result in suitability for use in applications for film deposition of high purity silicon oxide, silicon nitride, silicon oxinitride, or the like, by CVD and ALD and other deposition methods.

The disclosed Si-containing film forming compositions, when n=1, include $(H_3Si)_2N(SiH_2Cl)$, $(H_3Si)_2N(SiH_2Br)$, $(H_3Si)N(SiH_2Br)_2$, $(H_3Si)_2N(SiH_2I)$, $(H_3Si)N(SiH_2Cl)_2$, $(H_3Si)_2N(SiH_2Br)_2$, $(H_3Si)_2N(SiH_2)N(SiH_3)(SiH_2Cl)$, $(H_3Si)_2N(SiH_2)N(SiH_3)(SiH_2Br)$, $(H_3Si)_2N(SiH_2)N(SiH_3)(SiH_2I)$, $(H_3Si)(H_2SiC)N(SiH_2(N^iPr_2))$, $(H_3Si)(H_2SiBr)N(SiH_2(N^iPr_2))$, $(H_3Si)(H_2SiI)N(SiH_2(N^iPr_2))$, $(H_3Si)(H_2SiCl)N(SiH_2(NEt_2))$, $(H_3Si)(H_2SiBr)N(SiH_2(NEt_2))$, $(H_3SiI)(H_2Si)N(SiH_2(NEt_2))$, $(H_2SiCl)_2N(SiH_2(N^iPr_2))$, $(H_3SiCl)N(SiH_2(N^iPr_2))_2$, $(H_2SiCl)N(SiH_2(NEt_2))_2$, $(H_2SiCl)_2N(SiH_2(N^iPr_2))$, $(H_3SiCl)N(SiH_2(N^iPr_2))_2$ and $(H_2SiCl)N(SiH_2(NEt_2))_2$.

The disclosed Si-containing film forming compositions, when n=2, include $(H_3Si)_2N(SiH_2)N(SiH_3)(SiH_2Cl)$, $(H_3Si)_2N(SiH_2)N(SiH_3)(SiH_2Br)$ and $(H_3Si)_2N(SiH_2)N(SiH_3)(SiH_2I)$.

The disclosure also includes methods of preparation of the disclosed Si-containing film forming compositions, that is, methods of preparation of the disclosed halosilazanes or halosilazane precursors, which refer to methods of selective halogenation of hydrosilazanes (aminosilanes). The disclosed halosilazane precursors in formula (I) may be produced through the methods of selective halogenation of hydrosilazanes (aminosilanes) having a general formula

$$(SiH_a(NR_2)_b)_{(n+2)}N_n(SiH_2)_{(n-1)} \quad (III)$$

where R each is selected from H, a $C_1$-$C_6$ linear or branched, saturated or unsaturated hydrocarbyl group, or a silyl group [$SiR'_3$]; each a, b is independently 0 to 3; a+b=3. In the ated hydrocarbyl group, a $C_1$-$C_4$ saturated or unsaturated alkoxy group, or an amino gsubgenus comprising a silyl group [$SiR'_3$], each R' is independently selected from H, a halogen atom selected from F, Cl, Br or I, a $C_1$-$C_4$ saturated or unsaturroup [—$NR^1R^2$] with each $R^1$ and $R^2$ further being selected from H or a $C_1$-$C_6$ linear or branched, saturated or unsaturated hydrocarbyl group; n≥1. Preferably, R is an alkyl group selected from Me, Et, Pr, $^iPr$, Bu, $^iBu$, or $^tBu$.

The carbon-free halosilazanes may be produced through the methods of selective halogenation of hydrosilazanes (aminosilanes) having a general formula

$$(Si_aH_{2a+1})_{(n+2)}N_n(SiH_2)_{(n-1)} \quad (IV)$$

where a, n≥1.

The disclosed $(H_3Si)_2N(SiH_2Cl)$, $(H_3Si)_2N(SiH_2Br)$, $(H_3Si)_2N(SiH_2I)$ and $(H_3Si)N(SiH_2Cl)_2$ may be produced by selective halogenation of TSA.

The disclosed $(H_3Si)(H_2SiCl)N(SiH_2(N^iPr_2))$, $(H_3Si)(H_2SiBr)N(SiH_2(N^iPr_2))$ and $(H_3Si)(H_2SiI)N(SiH_2(N^iPr_2))$ may be produced by selective halogenation of diisopropylaminotrisilylamine.

The disclosed $(H_3Si)(H_2SiCl)N(SiH_2(NEt_2))$, $(H_3Si)(H_2SiBr)N(SiH_2(NEt_2))$ and $(H_3Si)(H_2SiI)N(SiH_2(NEt_2))$ may be produced by selective halogenation of diethylaminotrisilylamine.

The disclosed $(H_3Si)_2N(SiH_2)N(SiH_3)(SiH_2Cl)$, $(H_3Si)_2N(SiH_2)N(SiH_3)(SiH_2Br)$ and $(H_3Si)_2N(SiH_2)N(SiH_3)(SiH_2I)$ may be produced by selective halogenation of bis(disilylamino)silane.

Due to a high susceptibility of Si—N bond in inorganic hydrosilazanes of the general formula (I) and carbon-free halosilazanes of the general formula (II), various reagents may attack these compounds during halogenation process, thereby greatly reducing yield of these compounds (See, Advances in Inorganic Chemistry and Radiochemistry, Vol. 3, Academic Press, Inc., NY, 1961). The well-known halogenation methods/reagents suitable for silanes (See, Inorganic Reactions and Methods. Vol. 3, Part 1: Formation of Bonds to Halogens, VCHP, 1989, NY) turn out to be not industrially applicable for hydrosilazanes. The prior art described above discloses desilylative coupling trigged by Lewis acid/base and Si—N bond cleavages during the halogenation process of hydrosilazanes.

Thus, in order to halogenate inorganic hydrosilazanes $(SiH_a(NR_2)_b)_{(n+2)}N_n(SiH_2)_{(n-1)}$ (III) and carbon-free hydrosilazanes $(Si_aH_{2a+1})_{(n+2)}N_n(SiH_2)_{(n-1)}$ (IV), selectively and with a reasonable yield, the utilized chemical reagents (e.g., halogenating agents, catalysts and solvents) should not be strongly electro- or nucleophilic, should not form strongly electro- or nucleophilic byproducts by interaction with silane and should not form acids (such as HCl, HBr) by interaction with silane or reaction byproducts.

It is known halocarbons $C_xH_y(X)_z$ (X=F, Cl, Br or I) do not exhibit strong electro- or nucleophilic properties and may be utilized for halogenation of organic silanes. According to the prior art, halocarbons such as $CHCl_3$, $Ph_3CCl$, $Ph_3CBr$ have been utilized for halogenation of aryl-, alkyl-, alkoxy- and chlorosilanes. These silanes however are much more robust and less susceptible to side reactions comparing to hydrosilazanes disclosed therein. To our knowledge, no examples of selective halogenation of inorganic hydrosilazanes $(SiH_a(NR_2)_b)_{(n+2)}N_n(SiH_2)_{(n-1)}$ (III) and carbon-free hydrosilazanes $(Si_aH_{2a+1})_{(n+2)}N_n(SiH_2)_{(n-1)}$ (IV) by the above mentioned agents have been found in the prior art.

As shown in the comparative examples below, when applied to inorganic hydrosilazanes $(SiH_a(NR_2)_b)_{(n+2)}N_n(SiH_2)_{(n-1)}$ (III) and carbon-free hydrosilazanes $(Si_aH_{2a+1})_{(n+2)}N_n(SiH_2)_{(n-1)}$ (IV), the aforementioned halogenation procedures result in low yield (below 5% for cases with $C_2Cl_6$, $CH_2Cl_2$ and other chlorocarbons), irreproducible and low reaction rates (for $Ph_3CCl$ in toluene), and non-selective halogenation reaction (with $Ph_3CCl$, $C_2Cl_6$ in toluene and neat TSA).

Thus, a selection of the halogenation reagents, catalysts, ratio of starting compounds and the reaction conditions (e.g., type of solvent, concentrations, temperature, pressure) for achieving the best selectivity of halogenation of hydrosilazanes is important for achieving higher reaction yields.

In one embodiment, a halogenation reagent, trityl halides, $Ph_3C(X)$ (X=Cl, Br, I) is selected for selective halogenation of inorganic hydrosilazanes $(SiH_a(NR_2)_b)_{(n+2)}N_n(SiH_2)_{(n-1)}$ (III) and carbon-free hydrosilazanes $(Si_aH_{2a+1})_{(n+2)}N_n(SiH_2)_{(n-1)}$ (IV). In one embodiment, it is preferred to have 1.5-10 molar excess of hydrosilazanes relative to trityl halides for selective preparation of mono-halogenated compounds $(Si_aH_{2a+1})_{n+1}(Si_aH_{2a}(X))N_n(SiH_2)_{(n-1)}$ or $(SiH_a(NR_2)_b(X))_{(n+2)}N_n(SiH_2)_{(n-1)}$.

Solvent selection is also important for industrial processes. As reported in the prior art, halogenation proceeds could be faster in chlorinated media such as dichloromethane, chloroform or tetrachloroethane than other media. Due to hazardous natures of these solvents, their usage is highly regulated. In one embodiment, halogenated chlorocarbon solvents are utilized and then recycled after the reaction for next use, thereby leading to a process with the minimal amount of hazardous waste. Generally, less hazardous solvents such as toluene, anisole or heptane are highly recommended compared to chlorocarbons and benzene. (See "Solvent selection guide and ranking: A survey of solvent selection guides", Denis Prat, John Hayler, Andy Wells, Green Chem., 2014, 16, 4546-4551).

In one embodiment, the disclosed solvents include aromatic solvents such as toluene, xylene, mesitylene with or without a catalyst at certain conditions.

The disclosed methods of selective halogenation of hydrosilazanes provide practical/scalable synthesis methods of the aforementioned compounds, as shown in formula (III) and (IV), through tuning and optimizing reaction conditions that favor a product high yield and minimize effects of side reactions. In one embodiment, mono-halogenated TSA derivatives are selectively synthesized with a high yield in non-halogenated arene solvents such as toluene from TSA and trityl halides by using 1.5-4 molar excess of TSA and heating the reaction mixture for a certain time in a range of 80° C.-100° C. under a pressure of 10-20 psig. Alternatively, the selective halogenation with a high yield may be achieved at a certain time duration at room or moderate temperature up to 52° C. and atmospheric pressure applying a catalyst.

The disclosed catalysts include homogeneous catalysts, such as $BPh_3$, $B(SiMe_3)_3$ or the like and heterogeneous catalysts, such as, Ru, Pt, Pd in elemental form or on support deposited on an inert surface of carbon, silica, alumina, molecular sieves, or the like. The disclosed catalysts do not possess strong electro- or nucleophilicity, and do not form acids, or strong electro- or nucleophilic byproducts by interaction with hydrosilanzanes. The disclosed catalysts are thermally stable and accelerate the reactions in hydrocarbon solvents such as toluene or xylene as shown in examples that follow.

In one embodiment, the catalyst selectively accelerates transformation of hydrosilazanes into halogenated counterparts, where halogens are F, Cl, Br or I. The preferred selectivity of the process is achieved when the catalyst converts approximately 5% to approximately 70% halogenating agent (e.g., chlorinating agent), preferably approximately 10% to approximately 70% of halogenating agent, more preferably approximately 20 to approximately 60% of halogenating agent, even more preferably approximately 25% to approximately 60% of halogenating agent. After conversion, the catalyst, unreacted starting hydrosilazane, halogenating agent, and halogenated hydrosilazane are separated from a reaction mixture by distillation, crystallization or filtration processes. The approximate amount of catalyst generally varies from 0.1 to 10 mol % relative to the halogenating agent, preferably from 2 to 6 mol %.

The disclosed methods of selective halogenation of hydrosilazanes includes temperature ranges for optimizing the yield of halogenated silazane and the selectivity of process. A halogenation rate with a high selectivity for halogenation process without a catalyst is achieved in the temperature range from approximately 20° C. to approximately 200° C., preferably 50° C. to 120° C., more preferably from 70° C. to 90° C. The disclosed temperature ranges may be higher than boiling point of certain substrates (e.g. boiling point of TSA is 53° C.). Hence the process is performed at an above-atmospheric pressure in a closed system. The pressure in the process may vary from approximately 0 to approximately 50 psig, preferably from approximately 5 to approximately 20 psig. The temperature and pressure in the process are maintained by a proper selection of heating element, temperature control unit and pressure regulator.

In embodiments applying a catalyst, a halogenation rate with a high selectivity is achieved in a temperature range from approximately 200° C. to approximately 90° C., preferably from approximately 40° C. to 70° C.

The halogenation process may be performed in a batch reactor or in a flow reactor with or without catalyst. The preferred selectivity of the process is achieved when approximately 5% to approximately 80%, more preferably approximately 10% to approximately 50% of the starting inorganic hydrosilazanes are converted to the halogenated counterpart. The degree of conversion may be monitored in-situ by GC, Raman spectroscopy or any other suitable technique. When a required degree of conversion is achieved, the reaction mixture is separated by using common techniques, such as distillation, crystallization and filtration. The product(s) is (are) isolated while the unreacted starting material(s), solvent and catalyst may be recycled or reused.

The disclosed methods of selective halogenation of hydrosilazanes may have a selectivity of halogenation of the hydrosilazane ranging from approximately 30% to approximately 100%, preferably, a selectivity of halogenation of the hydrosilazane ranging from approximately 70% to approximately 97%, more preferably, a selectivity of halogenation of the hydrosilazane ranging from approximately 80% to approximately 91%.

The disclosed methods of selective halogenation of hydrosilazanes may provide a yield of halogenation of the hydrosilazane ranging from approximately 30% to approximately 90%, preferably, a yield of halogenation of the hydrosilazane ranging from approximately 40% to approximately 80%, more preferably, a yield of halogenation of the hydrosilazane ranging from approximately 50% to approximately 80%, even more preferably, a yield of halogenation of the hydrosilazane ranging from approximately 60% to approximately 80%. One skilled in the art may recognize that if providing enough excess of TSA in the above embodiment, a yield of halogenation of the hydrosilazane may approach 100%. Thus, the disclosed methods of selective halogenation of hydrosilazanes may provide a yield of halogenation of the hydrosilazane ranging from approximately 30% to 100%.

Fractional distillation may proceed at room temperature or by moderate heating in a temperature range from approximately 20° C. to approximately 100° C., preferably from approximately 25° C. to approximately 65° C. and at various pressure ranges. Ambient or reduced pressure from approximately 0.1 T to approximately 760 T or from approximately 1 T to approximately 100 T is preferred as it helps to reduce distillation temperature and suppress side reactions potentially. The side reactions lead to a lower yield of products.

Alternatively, the synthesized halogenated silazane(s) may be used without isolation or deep purification for further chemical transformations.

The disclosed methods of selective halogenation of hydrosilazanes include a catalytic or non-catalytic process for preparation of targeted halogenated hydrosilazanes (aminosilanes) by using commercially available starting materials and their further use with or without separation/purification for their intended applications.

In one preferred embodiment. the disclosed halogenation of hydrosilazanes shown in formula (III) and (IV) are conducted by their treatment with a solution of halogenating agent being trityl halides (Ph$_3$CX, X=F, Cl, Br or I) in a suitable solvent with or without a catalyst while performing the process in the temperature range from room temperature to approximately 200° C., preferably from room temperature to approximately 120° C., more preferably from approximately 60° C. to approximately 90° C., without the catalyst and in the temperature range from approximately 40° C. to approximately 70° C. in the presence of catalyst in the batch or flow reactor. Progress of the reaction may be monitored by Raman spectroscopy, Gas chromatography or any other suitable means. Thus in a flow process, the degree of conversion is monitored by on-line Raman spectroscopy and the reaction mixture is recirculated through a reactor until the desired degree of conversion is achieved. The process may be conducted at atmospheric and higher pressure up to approximately 50 psig, preferably up to approximately 20 psig and is regulated by proper equipment. The order of addition of reagents may vary, e.g. silazane may be added to a solution of chlorinating agent in the suitable solvent or vice versa; a stream of silazane may be added to a stream of chlorinating agent in a suitable solvent and vice versa. Moderate temperatures below approximately 120° C. and pressures below approximately 50 psig allow the usage of equipment with minimal capital investment. Separation of products is performed by distillation. Chlorinated silazanes may be obtained in a pure form, where the purity is more than 90% w/w, preferably more than 98% w/w, or alternatively less pure chlorinated silazanes having purity from 60% w/w, preferably from 80% w/w may be directed to the reactor for synthesis of other compounds, e.g. aminosilanes applying any suitable amine such as diisopropylamine, diethylamine, tert-butylamine.

In one embodiment, the synthesis and separation of the disclosed halosilazanes or halogenated silazanes may be performed in a batch reactor comprising of steps:
  a. preparing a solution of a halogenation agent in a suitable solvent with or without a catalyst in the reactor;
  b. adding the solution into the reactor;
  c. charging the reactor with the hydrosilazane with or without a solvent;
  d. stirring the obtained mixture with or without heating while monitoring the reaction progress;
  e. isolating the product by distillation straight from the reactor or directing the reaction mix (with optional filtration) into a separate distillation unit that allows:
    i. isolating of the unreacted starting material(s);
    ii. isolating of the halogenated silazane product(s);
    iii. isolating of the byproducts (optional);
    iv. recovering the solvent (optional);
  f. directing the isolated starting material, the recovered solvent and the catalyst (optional) into the steps a and b.

Figure 5:
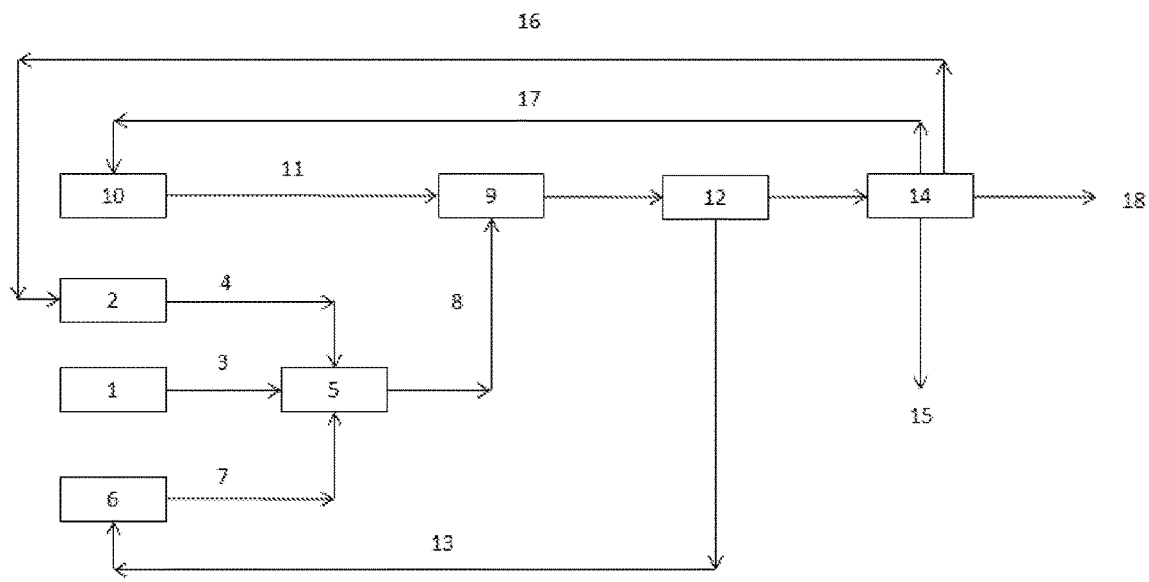
FIG. 5 is a diagram of the batch process for catalytic or non-catalytic preparation of TSA-X.

FIG. 5 is a diagram of a batch process for catalytic or non-catalytic preparation of TSA-X (X=F, Cl, Br or I), that is, a diagram of the batch process for catalytic or non-catalytic conversion of the silazane, particularly TSA, and Ph$_3$C(X) (X=F, Cl, Br or I) reactants to the halogenated silazanes, in particular to TSA-Cl, TSA-Br. All of contact components in the batch process need to be clean and air- and moisture-free. The batch process may be performed under an inert atmosphere, such as N$_2$, a noble gas (i.e., He, Ne, Ar, Kr, Xe), a combinations thereof or any other dry/inert environment. More specifically, halogenating agent Ph$_3$C(X) (X=F, Cl, Br or I) 1 and suitable solvent 2 are transferred via lines 3 and 4, respectively into mixing reactor 5 to prepare a halogenating agent solution. Optionally, catalyst 6 is added to mixing reactor 5 via line 7. Silazane (e.g., TSA (trisilylamine)) reactant 10 is added to batch reactor 9 via line 11. The halogenating agent solution formed in mixing reactor 5 is added to batch reactor 9 via line 8. Silazane reactant 10 and the halogenating agent solution formed in mixing reactor 5 (with or without a catalyst) may be added to batch reactor 9 by pump (not shown) or by pressure difference.

Batch reactor 9 may be a typical vessel with means of agitation, temperature/pressure control and monitoring the reaction. Batch reactor 9 is maintained at a temperature ranging from approximately room temperature or 25° C. to approximately 200° C., preferably from approximately room temperature or 25° C. to approximately 120° C., and the corresponding pressure ranging from approximately 0.1 atm to approximately 10 atm, preferably from approximately 1 atm to approximately 5 atm. The reaction monitoring is provided by chromatograhic (e.g. GC), spectroscopic (e.g. Raman) or any other suitable analytical techniques.

After the desired range of conversion is achieved, the reaction mixture in batch reactor 9 is filtered with filter 12 (optional) from where the separated heterogeneous catalyst is recycled via line 13. The filtrate is directed into distillation unit 14 to further isolate reaction product 15. Waste 18 is disposed while separated solvent 16 and unreacted silazane 17 may be recycled. Distillation unit 14 also separates light by-products such as SiH$_4$, SiH$_3$Cl, SiH$_2$Cl$_2$, heavier by-products such as (H$_3$Si)$_2$N(SiHCl$_2$), (H$_3$Si)N(SiHCl)$_2$, {(H$_3$Si)$_2$N}$_2$(SiH$_2$) and other oligomeric aminosilanes. The by-products may be disposed or purified and used. Alternatively, the crude reaction mixture may be distilled directly from reactor 9 if it is equipped with the appropriate distillation hardware (column, head, etc.).

Halogenated product 15 may be purified to any desirable level, e.g. up to 99.99% (ultra-high-purity (UHP)). The product of lower purity or even the crude reaction mixture without any purification may be utilized in the following chemical processes if such processes are tolerable to low purity raw materials. For example, the low purity halogenated silazane (or a halosilazane-containing crude reaction mixture) may be reacted with amines such as diethylamine, diisopropylamine, tert-butyl amine, dibutylamine, diisobutylamine, etc. to produce the corresponding aminosilanes. The solvents for this step may be selected from the above mentioned amines, toluene, hexane, heptane, etc.

In yet another embodiment, the synthesis and separation of the disclosed halosilazanes or halogenated silazanes may be performed in a flow reactor comprising of steps:
  a. preparing a solution of the halogenation agent (e.g., Ph$_3$C(X)) in a suitable solvent;
  b. adding a hydrosilazane (e.g., TSA) and the solution of the halogenation agent in a suitable solvent into the flow reactor;
  c. recirculation of a reaction mixture consisting of the hydrosilazane and solution of the halogenation agent in a suitable solvent through the flow reactor, while monitoring degree of conversion to a product halosilazane (e.g., TSA-X (X=F, Cl, Br or I)) by means of Raman spectroscopy;

d. delivering the reaction mixture into a receiver, cooling the reaction mixture and deposition of unreacted halogenation agent;
e. filtration of the unreacted halogenation agent;
f. delivering the reaction mixture in a crude distillation setup;
g. isolating the product halosilazane by distillation that allows:
  1) isolating of the unreacted starting material(s);
  2) isolating of the halogenated silazane product (i.e., halosilazane);
  3) isolating of the byproducts (e.g., TSA-$X_2$), other aminosilanes; and
  4) recovering the solvent;
h. directing the halogenated silazane product (i.e., halosilazane) into UHP distillation setup that allows isolation of UHP products; and
i. alternatively, directing the halogenated silazane product(s) (i.e., halosilazane) into a reactor for synthesis of aminosilanes from the halogenated silazane product (i.e., halosilazane) and a suitable amine.

Figure 6:
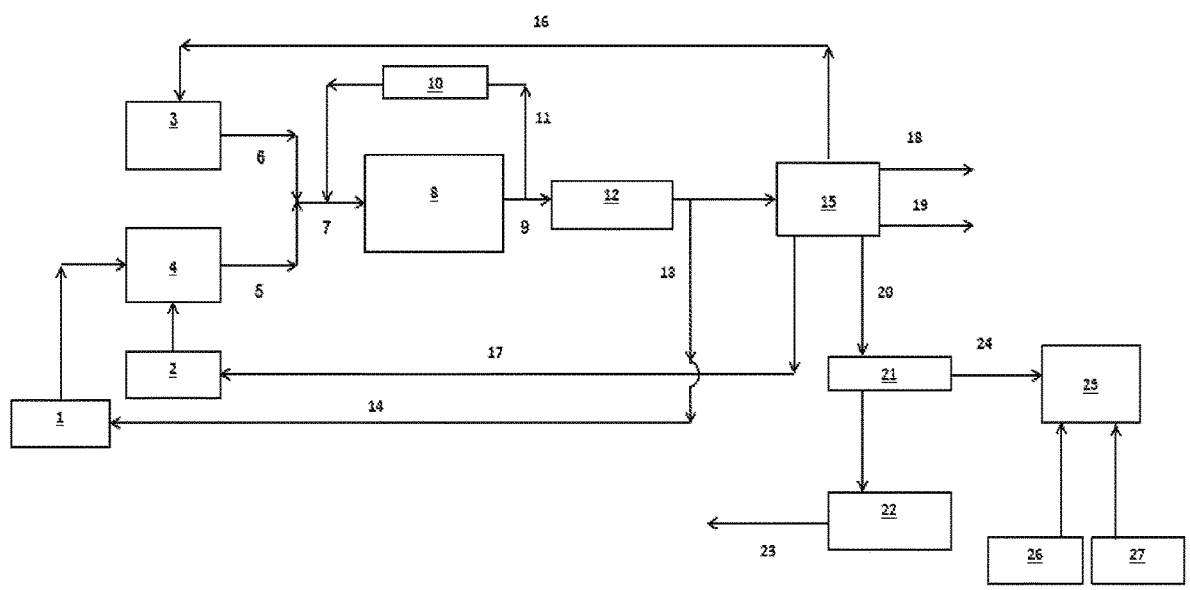
FIG. 6 is a diagram of the flow process for catalytic or non-catalytic preparation of TSA-X.

FIG. 6 is a diagram of a flow process for catalytic or non-catalytic conversion of the silazane, particularly TSA, and $Ph_3C(X)$ reactants to halogenated silazanes, in particular to TSA-Cl, TSA-Br. All of the contact components in the flow process need to be clean and air- and moisture-free. The flow process may be performed under an inert atmosphere, such as $N_2$, a noble gas (i.e., He, Ne, Ar, Kr, Xe), or combinations thereof. More specifically, a solution of halogenating agent $Ph_3C(X)$ 1 in suitable solvent 2 is prepared in mixing reactor 4. Silazane (e.g., TSA) reactant 3 and the solution of halogenating agent formed in mixing reactor 4 are added to flow reactor 8 via lines 5 and 6, respectively. Silazane reactant 3 and the solution of halogenating agent formed in mixing reactor 4 are then mixed in line 7 before introduction into flow reactor 8. Silazane reactant 3 and the solution of halogenating agent formed in mixing reactor 4 may be added to flow reactor 8 via a liquid metering pump (not shown), such as a diaphragm pump, peristaltic pump, or syringe pump or by pressure difference. Preferably, the mixing process is performed under an inert atmosphere at approximately atmospheric pressure. Flow reactor 8 may be a tubular reactor with or without inert media such a glass wool, glass beds or equipped with the catalyst (list of catalyst provided in the next section). Flow reactor 8 may be maintained without catalyst at a temperature ranging from approximately 25° C. to approximately 200° C., preferably from approximately 25° C. to approximately 120° C., or with catalyst from approximately 60° C. to approximately 100° C., preferably from approximately 40° C. to approximately 65° C. The temperature selection may depend upon the catalyst selection, as well as the target reaction products. Flow reactor 8 may be maintained at a pressure ranging from approximately 0.1 atm to approximately 10 atm, preferably from 1 atm to 5 atm. The flow of silazane reactant 3 and the solution of halogenating agent formed in mixing reactor 4 is selected to provide approximately 5 minutes to approximately 100 minutes of residence time in flow reactor 8, alternatively between approximately 5 minutes to approximately 20 minutes residence time. A flow of halogenated product 11 from reaction mixture 9 after flow reactor 8 is directed to Raman spectroscopy probe 10 and directed back in to flow reactor 8 if a yield of halogenated product is within approximately 1 to approximately 20%. When a yield of halogenated product 11 is within approximately 20% to approximately 100%, preferably from 20-60%, reaction mixture 9 is collected in receiver 12. Receiver 12 may be any sort of trap, including, but is not limited to, dry ice/isopropanol, dry ice/acetone, refrigerated ethanol, and/or liquid nitrogen traps.

Similar to the batch process, the reaction mixtures in receiver 12 may be collected in one or more containers and transported to a new location prior to performance of the next process steps. Alternatively, the reaction mixtures in receiver 12 may be filtered from unreacted halogenating agent 13, the halogenated product recovered, and then immediately directed to distillation unit 15 to further isolate the halogenated product from reactants and reaction by-products. Distillation unit 15 separates halogenated product 20 from solvent 17, volatile reaction by-products 18, such as $SiH_4$, $SiH_3Cl$, $SiH_2Cl_2$, and any unreacted silazane reactant 16 and heavier reaction products 19 such as $(H_3Si)_2N(SiHCl_2)$, $(H_3Si)N(SiHCl)_2$, $\{(H_3Si)_2N\}_2(SiH_2)$, other oligomeric aminosilanes. Unreacted silazane reactant 16 and solvent 17 may be recycled. Real time analysis and purification of unreacted silazane reactant 16 and solvent 17 may be provided to maintain quality of devices and monitoring equipment, during this continuous synthesis process, such as filters and/or in-situ GC, Raman spectroscopy analysis.

Similar to the batch process, halogenated product 20 in container 21 may be transported to a new location prior to performance of the next process steps. Alternatively, halogenated product 20 in container 21 may be directed to UHP fractional distillation unit 22 to separate the UHP halogenated product, whose purity is from 90 to 99.99% w/w, preferably from 95 to 99.99% w/w, more preferably from 99.0 to 99.99% w/w. A fractional distillation may be formed with a static column or a spinning band column. The spinning band distillation column length is much smaller than that of the static column and may be preferred for use in crowded facilities because it takes up less space. Alternatively, halogenated product 20 in container 21, whose purity is from approximately 40% to approximately 90%, preferably from approximately 70% to approximately 90%, may be directed to reactor 25 for synthesis of other compounds, particularly for synthesis of aminosilanes with amine 26 in suitable solvent 27. Amine 26 may be diethylamine, diisopropylamine, tert-butyl amine, dibutylamine, diisobutylamine, etc. solvent may be selected from above mentioned amines or toluene, hexane, heptane, etc.

The disclosed Si-containing film forming compositions also comprise mono-substituted TSA precursors having a Si—C bond free backbone and a single chemically functionalized site to enable a high surface reactivity. The mono-substituted TSA precursors having a number of silicon atoms higher than 1, and preferably higher than 2, without a direct Si—C bond, and being polar molecules may have an enhanced reactivity to a substrate surface to enable a fast deposition rate. The mono-substituted TSA precursors have the general formula:

wherein X is selected from a halogen atom selected from Cl, Br or I; an isocyanato group [—NCO]; an amino group [—$NR^1R^2$]; a N-containing $C_4$-$C_{10}$ saturated or unsaturated heterocycle; or an alkoxy group —O—R; each $R^1$, $R^2$ and R selected from a H; a silyl group ($SiR'_3$); or a $C_1$-$C_6$ linear or branched, saturated or unsaturated hydrocarbyl group; with each R' being independently selected from H; a halogen atom selected from Cl, Br, or I; a $C_1$-$C_4$ saturated or unsaturated hydrocarbyl group; a $C_1$-$C_4$ saturated or unsaturated alkoxy group; or an amino group [—$NR^3R^4$], with each $R^3$ and $R^4$ being independently selected from H or a $C_1$-$C_6$ linear or branched, saturated or unsaturated hydrocarbyl group; provided that if $R^1$=H, then $R^2 \neq$ H, Me, or Et.

The $C_1$-$C_6$ linear or branched, saturated or unsaturated hydrocarbyl group may contain amines or ethers. Alternatively, $R^1$ and $R^2$ may be independently selected from Me, Et, iPr, nPr, tBu, nBu, and secBu.

When X is a halide, exemplary Si-containing film forming compositions include $(SiH_3)_2$—N—$SiH_2Cl$, $(SiH_3)_2$—N—$SiH_2Br$, or $(SiH_3)_2$—N—$SiH_2I$. These compositions may be synthesized according to the reaction: $SnX_4$+$N(SiH_3)_3 \rightarrow N(SiH_3)_2(SiH_2X)$+$SnX_2\downarrow$+HXI, wherein X is Cl, Br, or I (see J. Chem. Soc. Dalton Trans. 1975, p. 1624). Alternatively, dihalosilane [$SiH_2X_2$, wherein X is Cl, Br, or I] and monohalosilane [$SiH_3X$, wherein X is Cl, Br, or I] may be introduced continuously in the gas phase in a 1/20 to 1/4 ratio and at room temperature with 400 sccm of $NH_3$ in a flow-through tubular reactor as described by Miller in U.S. Pat. No. 8,669,387. The reaction of $NH_3$ with 2 equivalents of monohalosilane produces mostly disilylamine (DSA). DSA then reacts with the dihalosilane to form $(SiH_3)_2$—N—$SiH_2X$ and HX, wherein X is Cl, Br, or I. One of ordinary skill in the art would recognize that the reaction may take place in one or two steps (first forming DSA from the monohalosilane and $NH_3$ and second adding dihalosilane) or in one step (combining the monohalosilane, dichlorosilane, and $NH_3$ in one step).

When X is an isocyanato group [—NCO], exemplary Si-containing film forming compositions include $(SiH_3)_2$—N—$SiH_2(NCO)$. This composition may be synthesized using dehydrogenerative coupling according to the method disclosed by Taniguchi et al. in Angewandte Communications, Angew. Chem. Int. Ed. 2013, 52, 1-5, the teachings of which are incorporated herein by reference. More particularly, $(SiH_3)_3N$ may be reacted with urea ($NH_2CONH_2$) to form $(SiH_3)_2$—N—$SiH_2(NCO)$+$H_2$ in the presence of gold nanoparticles supported on alumina.

When X is an amino group [—$NR^1R^2$], exemplary Si-containing film forming compositions include $(SiH_3)_2$—N—$SiH_2(NEt_2)$, $(SiH_3)_2$—N—$SiH_2(NiPr_2)$, $(SiH_3)_2$—N—$SiH_2(NHiPr)$, $(SiH_3)_2$—N—$SiH_2(NHtBu)$, $(SiH_3)_2$—N—$SiH_2[N(SiH_3)_2]$, $(SiH_3)_2$—N—$SiH_2[N(SiH_3)(SiH_2Cl)]$, $(SiH_3)_2$—N—$SiH_2[N(SiH_3)(SiH_2(NEt_2))]$, $(SiH_3)_2$—N—$SiH_2[N(SiH_3)(SiH_2(NiPr_2))]$, $(SiH_3)_2$—N—$SiH_2[N(SiH_3)(SiH_2(NHtBu))]$, $(SiH_3)_2$—N—$SiH_2[N(SiH_3)(SiH_2OEt)]$, $(SiH_3)_2$—N—$SiH_2[N(SiH_3)(SiH_2OiPr)]$, $(SiH_3)_2$—N—$SiH_2[N(SiMe_3)_2]$, $(SiH_3)_2$—N—$SiH_2[NH(SiMe_3)]$, $(SiH_3)_2$—N—$SiH_2[N(SiEt_3)_2)$, $(SiH_3)_2$—N—$SiH_2[N(SiMe_2Et)_2)$, $(SiH_3)_2$—N—$SiH_2[N(SiMe_2iPr)_2)$, $(SiH_3)_2$—N—$SiH_2[N(tBu)(SiH_3))$, $(SiH_3)_2$—N—$SiH_2[N(SiMe_2nPr)_2)$, $(SiH_3)_2N$—$SiH_2$ NEtMe, $(SiH_3)_2N$—$SiH_2$ $NMe_2$, $(SiH_3)_2N$—$SiH_2$ NMeiPr, or $(SiH_3)_2N$—$SiH_2$ NEtiPr.

The amino-substituted Si-containing film forming compositions may be synthesized similarly to the halo-substituted Si-containing film forming compositions disclosed above. More particularly, 200 sccm of monohalosilane and 50 sccm of dihalosilane may be introduced continuously in the gas phase and at room temperature with 400 sccm of $NH_3$ in a flow-through tubular reactor as described in U.S. Pat. No. 8,669,387, forming a stream consisting of various silylamines and ammonium halide, from which $(SiH_3)_2$—N—$SiH_2[N(SiH_3)_2]$ may be isolated by methods easily derived by a person having ordinary skill in the art, such as a method of fractional distillation.

More particularly, $(SiH_3)_2$—N—$SiH_2[N(SiMe_3)_2]$ may be synthesized from the reaction of $SiMe_3$-NH—$SiMe_3$ with tBuLi--> $(Me_3Si)_2NLi$, and reaction of $(Me_3Si)_2NLi$ with $(SiH_3)_2$—N—$SiH_2$—Cl-->$(SiH_3)_2$—N—$SiH_2$—$N(SiMe_3)_2$+LiCl).

Similarly, $(SiH_3)_2$—N—$SiH_2$—$NH(SiMe_3)$ may be synthesized from the reaction of $SiMe_3$-NH—$SiMe_3$+$(SiH_3)_2$—N—$SiH_2$—Cl-->$(SiH_3)_2$—N—$SiH_2$—NH—$SiMe_3$+$Me_3SiCl$.

$(SiH_3)_2$—N—$SiH_2$—$N(SiH_3)(SiH_2X)$ may be synthesized from the reaction of $(SiH_3)_2$—N—$SiH_2$—$N(SiH_3)_2$ with $SnX_3$, wherein X is Cl, Br, or I (see J. Chem. Soc. Dalton Trans. 1975, p. 1624). Further substitution of $(SiH_3)_2$—N—$SiH_2$—$N(SiH_3)_2$ may be achieved by increasing the reaction time and/or adjusting the stoichiometry.

$(SiH_3)_2$—N—$SiH_2$—$N(SiH_3)(SiH_2(NEt_2))$ may be synthesized from the reaction of $(SiH_3)_2$—N—$SiH_2$—$N(SiH_3)(SiH_2X)$ and $HNEt_2$. Further substitution of $(SiH_3)_2$—N—$SiH_2$—$N(SiH_3)(SiH_2(NEt_2))$ may be achieved by increasing the reaction time and/or adjusting the stoichiometry.

$(SiH_3)_2$—N—$SiH_2$—$N(SiH_3)(SiH_2(NiPr_2))$ may be synthesized from the reaction of $(SiH_3)_2$—N—$SiH_2$—$N(SiH_3)(SiH_2X)$ and $HNiPr_2$. Further substitution of $(SiH_3)_2$—N—$SiH_2$—$N(SH_3)(Si)(SiH_2(NiPr_2))$ may be achieved by increasing the reaction time and/or adjusting the stoichiometry.

$(SiH_3)_2$—N—$SiH_2$—$N(SiH_3)(SiH_2(NHtBu))$ may be synthesized from the reaction of $(SiH_3)_2$—N—$SiH_2$—$N(SiH_3)(SiH_2X)$ and $H_2NtBu$. Please note that a similar reaction using $H_2NEt$ may produce low yields of $(SiH_3)_2$—N—$SiH_2$—$N(SiH_3)(SiH_2(NHEt))$.

$(SiH_3)_2$—N—$SiH_2$—$N(SiH_3)(SiH_2(OEt))$ may be synthesized from the reaction of $(SiH_3)_2$—N—$SiH_2$—$N(SiH_3)(SiH_2X)$ and Ethanol (EtOH) in the presence of a HCl scavenger, like $NEt_3$ or pyridine.

$(SiH_3)_2$—N—$SiH_2$—$N(SiH_3)(SiH_2(OiPr))$ may be synthesized from the reaction of $(SiH_3)_2$—N—$SiH_2$—$N(SiH_3)(SiH_2X)$ and isopropanol (iPrOH) in the presence of a HCl scavenger, like $NEt_3$ or pyridine.

When X is a N-containing $C_4$-$C_{10}$ saturated or unsaturated heterocycle, exemplary Si-containing film forming compositions include $(SiH_3)_2$—N—$SiH_2$-pyrrolidine, $(SiH_3)_2$—N—$SiH_2$-pyrrole, or $(SiH_3)_2$—N—$SiH_2$-piperidine. Alternatively, the N-containing $C_4$-$C_{10}$ saturated or unsaturated heterocycle may also contain hetero-elements, such as P, B, As, Ge, and/or Si.

When X is an alkoxy group, exemplary Si-containing film forming compositions include $(SiH_3)_2$—N—$SiH_2(OEt)$, $(SiH_3)_2$—N—$SiH_2(OiPr)$, $(SiH_3)_2N$—$SiH_2$—$OSiMe_3$, $(SiH_3)_2$—N—$SiH_2$—$OSiMe_2OEt$, or $(SiH_3)_2$—N—$SiH_2$—$OSiHMe_2$.

$N(SiH_3)_2(SiH_2OEt)$ may also be synthesized from $(SiH_3)_2$—N—$SiH_2Cl$ and EtOH in the presence of an acid scavenger, such as $Et_3N$ or pyridine.

$N(SiH_3)_3$+EtOH$\rightarrow$$N(SiH_3)_2(SiH_2OEt)$.

Preferably, the disclosed Si-containing film forming compositions have suitable properties for vapor depositions methods, such as high vapor pressure, low melting point (preferably being in liquid form at room temperature), low sublimation point, and/or high thermal stability.

To ensure process reliability, the disclosed Si-containing film forming compositions may be purified by continuous or fractional batch distillation prior to use to a purity ranging from approximately 95% w/w to approximately 100% w/w, preferably ranging from approximately 98% w/w to approximately 100% w/w. One of ordinary skill in the art will recognize that the purity may be determined by H NMR or gas or liquid chromatography with mass spectrometry. The Si-containing film forming composition may contain any of the following impurities: halides ($X_2$), trisilylamine, monohalotrisilylamine, dihalotrisilylamine, $SiH_4$, $SiH_3X$, $SnX_2$, SnX$_4$, HX, NH$_3$, NH$_3$X, monochlorosilane, dichlorosilane, alcohol, alkylamines, dialkylamines, alkylimines, THF, ether, pentane, cyclohexane, heptanes, or toluene, wherein X is Cl, Br, or I. Preferably, the total quantity of these impurities is below 0.1% w/w. The purified composition may be produced by recrystallisation, sublimation, distillation, and/or passing the gas or liquid through a suitable adsorbent, such as a 4A molecular sieve or a carbon-based adsorbent (e.g., activated carbon).

The concentration of each solvent (such as THF, ether, pentane, cyclohexane, heptanes, and/or toluene), in the purified mono-substituted TSA precursor composition may range from approximately 0% w/w to approximately 5% w/w, preferably from approximately 0% w/w to approximately 0.1% w/w. Solvents may be used in the precursor composition's synthesis. Separation of the solvents from the precursor composition may be difficult if both have similar boiling points. Cooling the mixture may produce solid precursor in liquid solvent, which may be separated by filtration. Vacuum distillation may also be used, provided the precursor composition is not heated above approximately its decomposition point.

The disclosed Si-containing film forming composition contains less than 5% v/v, preferably less than 1% v/v, more preferably less than 0.1% v/v, and even more preferably less than 0.01% v/v of any of its mono-, dual- or tris-, analogs or other reaction products. This embodiment may provide better process repeatability. This embodiment may be produced by distillation of the Si-containing film forming composition.

Purification of the disclosed Si—Containing film forming composition may also produce concentrations of trace metals and metalloids ranging from approximately 0 ppbw to approximately 500 ppbw, and more preferably from approximately 0 ppbw to approximately 100 ppbw. These metal or metalloid impurities include, but are not limited to, Aluminum (Al), Arsenic (As), Barium (Ba), Beryllium (Be), Bismuth (Bi), Cadmium (Cd), Calcium (Ca), Chromium (Cr), Cobalt (Co), Copper (Cu), Gallium (Ga), Germanium (Ge), Hafnium (Hf), Zirconium (Zr), Indium (In), Iron (Fe), Lead (Pb), Lithium (Li), Magnesium (Mg), Manganese (Mn), Tungsten (W), Nickel (Ni), Potassium (K), Sodium (Na), Strontium (Sr), Thorium (Th), Tin (Sn), Titanium (Ti), Uranium (U), Vanadium (V) and Zinc (Zn). The concentration of X (where X=Cl, Br, I) in the purified mono-substituted TSA precursor composition may range between approximately 0 ppmw and approximately 100 ppmw and more preferably between approximately 0 ppmw to approximately 10 ppmw.

The disclosed Si-containing film forming compositions may be suitable for the deposition of Si-containing films by various ALD or CVD processes and may have the following advantages:
  liquid at room temperature or having a melting point lower than 50° C.;
  thermally stable to enable proper distribution (gas phase or direct liquid injection) without particles generation; and/or
  suitable reactivity with the substrate to permit a wide self-limited ALD window, allowing deposition of a variety of Si-containing films.

Silicon nitride and silicon oxide containing films (referred to as SiO$_x$N$_y$) may be deposited by CVD or ALD using one or a combination of reactants selected from the group comprising of N$_2$, H$_2$, NH$_3$, O$_2$, H$_2$O, H$_2$O$_2$, O$_3$, NO, NO$_2$, N$_2$O, a carboxylic acid, an alcohol, a diol, hydrazines (such as N$_2$H$_4$, MeHNNH$_2$, MeHNNHMe), organic amines (such as NMeH$_2$, NEtH$_2$, NMe$_2$H, NEt$_2$H, NMe$_3$, NEt$_3$, (SiMe$_3$)$_2$NH), pyrazoline, pyridine, diamines (such as ethylene diamine), a combination thereof, and the plasma product thereof.

Ternary or quaternary films may be deposited using the Si-containing film forming compositions with one or several other precursors containing elements selected from As, B, P, Ga, Ge, Sn, Sb, Al, In, or a transition metal precursor, and possibly one or more reactant listed above. Typical precursors that may be used along with the disclosed Si-containing film forming compositions are selected from the families of:
  Metal Halides (for example, TiCl$_4$, TiI$_4$, TaCl$_5$, HfCl$_4$, ZrCl$_4$, AlCl$_3$, NbF$_5$, etc.);
  Alkyls (Al, Ge, Ga, In, Sb, Sn, Zn), such as trimethylaluminum, diethylzinc, triethylgalium;
  Hydrides (GeH$_4$, alanes, etc.);
  Alkylamides (metals of group IV and V transition metals);
  Imido group (metals of group V and VI);
  Alkoxides (metals of group IV, V);
  Cyclopentadienyls (Ru, Co, Fe, Group IV transition metals, lanthanides etc.);
  Carbonyls (ex: Ru, Co, Fe, Ni);
  Amidinates and guanidinates (ex: Co, Mn, Ni, Cu, Sc, etc.);
  Beta-diketonates (ex: Sc, Cu, lanthanides);
  Beta-diketoimines (Cu, Ni, Co, etc.);
  Bis-trialkylsilylamides (Ni, Co, Fe, etc.);
  Oxo groups (RuO$_4$, WOCl4, PO(OEt)$_3$, AsO(OEt)$_3$, etc.);
  Or heteroleptic molecules having a combination of the above ligands.

The disclosed Si-containing film forming compositions may also be used in conjunction with another silicon source, such as a halosilane (possibly selected from SiH$_3$Cl, SiH$_2$Cl$_2$, SiHCl$_3$, SiCl$_4$, SiBr$_4$, SiI$_4$, SiHI$_3$, SiH$_2$I$_2$, SiH$_3$I, SiF$_4$), a polysilane SiH$_x$H$_{2x+2}$, or a cyclic polysilane SiH$_x$H$_{2x}$, a halo-polysilane (Si$_x$Cl$_{2x+2}$, Si$_x$H$_y$Cl$_{2x+2-y}$, such as HCDS, OCTS, PCDS, MCDS or DCDS, a carbosilane having a Si—(CH$_2$)$_n$—Si backbone, with n=1 or 2.

Also disclosed are methods of using the disclosed Si-containing film forming compositions for vapor deposition methods, including various CVD and ALD methods. The disclosed methods provide for the use of the disclosed Si-containing film forming compositions for deposition of silicon-containing films, preferably silicon nitride (SiN) films, silicon-oxide (SiO) films, and nitrogen doped silicon-oxide films. The disclosed methods may be useful in the manufacture of semiconductor, photovoltaic, LCD-TFT, flat panel type devices, refractory materials, or aeronautics.

The disclosed methods for forming a silicon-containing layer on a substrate include: placing a substrate in a reactor, delivering into the reactor a vapor including the Si-containing film forming composition, and contacting the vapor with the substrate (and typically directing the vapor to the substrate) to form a silicon-containing layer on the surface of the substrate. Alternatively, the substrate is moved to the chamber that contains the precursor vapors (spatial ALD) and then moved to another area that contains the reactant. Other physical treatment steps may be carried in between the exposure to precursor and reactants, such as a flash anneal, a UV cure, etc.

The methods may include forming a bimetal-containing layer on a substrate using the vapor deposition process and, more specifically, for deposition of SiMO$_x$ films wherein x is 4 and M is Ti, Hf, Zr, Ta, Nb, V, Al, Sr, Y, Ba, Ca, As, B, P, Sb, Bi, Sn, lanthanides (such as Er), or combinations thereof. The disclosed methods may be useful in the manufacture of semiconductor, photovoltaic, LCD-TFT, or flat panel type devices. An oxygen source, such as $O_3$, $O_2$, $H_2O$, NO, $H_2O_2$, acetic acid, formalin, para-formaldehyde, alcohol, a diol, oxygen radicals thereof, and combinations thereof, but preferably $O_3$ or plasma treated $O_2$, may also be introduced into the reactor.

The disclosed Si-containing film forming compositions may be used to deposit silicon-containing films using any deposition methods known to those of skill in the art. Examples of suitable deposition methods include chemical vapor deposition (CVD) or atomic layer deposition (ALD). Exemplary CVD methods include thermal CVD, pulsed CVD (PCVD), low pressure CVD (LPCVD), sub-atmospheric CVD (SACVD) or atmospheric pressure CVD (APCVD), hot-wire CVD (HWCVD, also known as cat-CVD, in which a hot wire serves as an energy source for the deposition process), radicals incorporated CVD, plasma enhanced CVD (PECVD) including but not limited to flowable CVD (FCVD), and combinations thereof. Exemplary ALD methods include thermal ALD, plasma enhanced ALD (PEALD), spatial isolation ALD, hot-wire ALD (HWALD), radicals incorporated ALD, and combinations thereof. Super critical fluid deposition may also be used. The deposition method is preferably FCVD, ALD, PE-ALD, or spatial ALD in order to provide suitable step coverage and film thickness control.

The Si-containing film forming compositions are delivered into a reactor in vapor form by conventional means, such as tubing and/or flow meters. The vapor form of the compositions may be produced by vaporizing the neat or blended composition solution through a conventional vaporization step such as direct vaporization, distillation, by bubbling. The composition may be fed in liquid state to a vaporizer where it is vaporized before it is introduced into the reactor. Prior to vaporization, the composition may optionally be mixed with one or more solvents. The solvents may be selected from the group consisting of toluene, ethyl benzene, xylene, mesitylene, decane, dodecane, octane, hexane, pentane, or others. The resulting concentration may range from approximately 0.05 M to approximately 2 M.

Alternatively, the Si-containing film forming compositions may be vaporized by passing a carrier gas into a container containing the precursor or by bubbling of the carrier gas into the precursor. The composition may optionally be mixed in the container with one or more solvents. The solvents may be selected from the group consisting of toluene, ethyl benzene, xylene, mesitylene, decane, dodecane, octane, hexane, pentane, or others. The resulting concentration may range from approximately 0.05 M to approximately 2 M. The carrier gas may include, but is not limited to, Ar, He, or $N_2$, and mixtures thereof. Bubbling with a carrier gas may also remove any dissolved oxygen present in the neat or blended composition. The carrier gas and composition are then introduced into the reactor as a vapor.

If necessary, the container may be heated to a temperature that permits the Si-containing film forming composition to be in liquid phase and to have a sufficient vapor pressure. The container may be maintained at temperatures in the range of, for example, 0 to 150° C. Those skilled in the art recognize that the temperature of the container may be adjusted in a known manner to control the amount of composition vaporized. The temperature is typically adjusted to reach a vapor pressure of 0.1-100 torr, preferably around 1-20 torr.

The vapor of the Si-containing film forming composition is generated and then introduced into a reaction chamber containing a substrate. The temperature and the pressure in the reaction chamber and the temperature of the substrate are held at conditions suitable for vapor deposition of at least part of the mono-substituted TSA precursor onto the substrate. In other words, after introduction of the vaporized composition into the reaction chamber, conditions within the reaction chamber are adjusted such that at least part of the vaporized precursor is deposited onto the substrate to form the Si-containing layer. One of ordinary skill in the art will recognize that "at least part of the vaporized compound is deposited" means that some or all of the compound reacts with or adheres to the substrate. Herein, a reactant may also be used to help in formation of the Si-containing layer. Furthermore, the Si-containing layer may be cured by UV and Electron beam.

The reaction chamber may be any enclosure or chamber of a device in which deposition methods take place, such as, without limitation, a parallel-plate type reactor, a cold-wall type reactor, a hot-wall type reactor, a single-wafer reactor, a multi-wafer reactor, or other such types of deposition systems. All of these exemplary reaction chambers are capable of serving as an ALD or CVD reaction chamber. The reaction chamber may be maintained at a pressure ranging from about 0.5 mTorr to about 20 Torr for all ALD and subatmospheric CVD. Subatmospheric CVD and atmospheric CVD pressures may range up to 760 Torr (atmosphere). In addition, the temperature within the reaction chamber may range from about 0° C. to about 800° C. One of ordinary skill in the art will recognize that the temperature may be optimized through mere experimentation to achieve the desired result.

The temperature of the reactor may be controlled by either controlling the temperature of the substrate holder or controlling the temperature of the reactor wall. Devices used to heat the substrate are known in the art. The reactor wall is heated to a sufficient temperature to obtain the desired film at a sufficient growth rate and with desired physical state and composition. A non-limiting exemplary temperature range to which the reactor wall may be kept from approximately 20° C. to approximately 800° C. When a plasma deposition process is utilized, the deposition temperature may range from approximately 0° C. to approximately 550° C. Alternatively, when a thermal process is performed, the deposition temperature may range from approximately 200° C. to approximately 800° C.

Alternatively, the substrate may be heated to a sufficient temperature to obtain the desired silicon-containing film at a sufficient growth rate and with desired physical state and composition. A non-limiting exemplary temperature range to which the substrate may be heated includes from 50° C. to 600° C. Preferably, the temperature of the substrate remains less than or equal to 500° C.

Alternatively, the ALD process may be carried at a substrate temperature being set below a self-decomposition of the precursor. One of ordinary skill in the art would recognize how to determine the self-decomposition temperature of the precursor.

The reactor contains one or more substrates onto which the films will be deposited. A substrate is generally defined as the material on which a process is conducted. The substrates may be any suitable substrate used in semiconductor, photovoltaic, flat panel, or LCD-TFT device manufacturing. Examples of suitable substrates include wafers, such as silicon, silica, glass, plastic or GaAs wafers. The wafer may have one or more layers of differing materials deposited on it from a previous manufacturing step. For example, the wafers may include silicon layers (crystalline, amorphous, porous, etc.), silicon oxide layers, silicon nitride layers, silicon oxy nitride layers, carbon doped silicon oxide (SiCOH) layers, photoresist layers, anti-reflective layers, or combinations thereof. Additionally, the wafers may include copper layers or noble metal layers (e.g. platinum, palladium, rhodium, or gold). The layers may include oxides which are used as dielectric materials in MIM, DRAM, STT RAM, PC-RAM or FeRam technologies (e.g., $ZrO_2$ based materials, $HfO_2$ based materials, $TiO_2$ based materials, rare earth oxide based materials, ternary oxide based materials such as strontium ruthenium oxide (SRO), etc.) or from nitride-based films (e.g., TaN) that are used as an oxygen barrier between copper and the low-k layer. The wafers may include barrier layers, such as manganese, manganese oxide, etc. Plastic layers, such as poly(3,4-ethylenedioxythiophene)poly(styrenesulfonate) (PEDOT:PSS) may also be used. The layers may be planar or patterned. For example, the layer may be a patterned photoresist film made of hydrogenated carbon, for example $CH_x$, wherein x is greater than zero. The disclosed processes may deposit the silicon-containing layer directly on the wafer or directly on one or more than one (when patterned layers form the substrate) of the layers on top of the wafer. Furthermore, one of ordinary skill in the art will recognize that the terms "film" or "layer" used herein refer to a thickness of some material laid on or spread over a surface and that the surface may be a trench or a line. Throughout the specification and claims, the wafer and any associated layers thereon are referred to as substrates. In many instances though, the preferred substrate utilized may be selected from copper, silicon oxide, photoresist, hydrogenated carbon, TiN, SRO, Ru, and Si type substrates, such as polysilicon or crystalline silicon substrates. For example, a silicon nitride film may be deposited onto a Si layer. In subsequent processing, alternating silicon oxide and silicon nitride layers may be deposited on the silicon nitride layer forming a stack of multiple $SiO_2$/SiN layers used in 3D NAND gates. Furthermore, the substrate may be coated with patterned or unpatterned organic or inorganic films.

In addition to the disclosed Si-containing film forming compositions, a reactant may also be introduced into the reactor. The reactant may be an oxidizing agent, such as one of $O_2$, $O_3$, $H_2O$, $H_2O_2$; oxygen containing radicals, such as O or OH, NO, $NO_2$; carboxylic acids such as formic acid, acetic acid, propionic acid, radical species of NO, $NO_2$, or the carboxylic acids; para-formaldehyde; and mixtures thereof. Preferably, the oxidizing agent is selected from the group consisting of $O_2$, $O_3$, $H_2O$, $H_2O_2$, oxygen containing radicals thereof such as $O^-$ or $OH^-$, and mixtures thereof. Preferably, when an ALD process is performed, the reactant is plasma treated oxygen, ozone, or combinations thereof. When an oxidizing agent is used, the resulting silicon containing film will also contain oxygen.

Alternatively, the reactant may be a nitrogen-containing reactant, such as one of $N_2$, $NH_3$, hydrazines (for example, $N_2H_4$, MeHNNH$_2$, MeHNNHMe), organic amines (for example, $N(CH_3)H_2$, $N(C_2H_5)H_2$, $N(CH_3)_2H$, $N(C_2H_5)_2H$, $N(CH_3)_3$, $N(C_2H_5)_3$, $(SiMe_3)_2NH$), pyrazoline, pyridine, diamine (such as ethylene diamine), radicals thereof, or mixtures thereof. When an N-containing source agent is used, the resulting silicon containing film will also contain nitrogen.

When a reducing agent is used, such as $H_2$, H radicals, but also other H-containing gases and precursors such as metal and metalloid hydrides, the resulting silicon containing film may be pure Si.

In summary, the reactant is selected from the group consisting of $O_2$, $O_3$, $H_2O$, $H_2O_2$, NO, $NO_2$, $N_2O$, alcohols, diols, carboxylic acids, ketones, ethers, O atoms, O radicals, O ions, ammonia, $N_2$, N atoms, N radicals, N ions, saturated or unsaturated hydrazine, amines, diamines, ethanolamine, $H_2$, H atoms, H radicals, H ions, and combinations thereof.

The reactant may be treated by plasma, in order to decompose the reactant into its radical form. $N_2$ may also be utilized when treated with plasma. For instance, the plasma may be generated with a power ranging from about 50 W to about 2000 W, preferably from about 00 W to about 500 W. The plasma may be generated or present within the reactor itself. Alternatively, the plasma may generally be at a location removed from the reactor, for instance, in a remotely located plasma system. One of skill in the art will recognize methods and apparatus suitable for such plasma treatment.

The Si-containing film forming compositions may also be used with a halosilane or polyhalodisilane, such as hexachlorodisilane, pentachlorodisilane, or tetrachlorodisilane, and one or more reactants to form Si, SiCN, or SiCOH films. PCT Publication Number WO2011/123792 discloses a SiN layer (not a Si or SiCOH layer), and the entire contents of which are incorporated herein in their entireties.

When the desired silicon-containing film also contains another element, such as, for example and without limitation, Ti, Hf, Zr, Ta, Nb, V, Al, Sr, Y, Ba, Ca, As, B, P, Sb, Bi, Sn, Ge lanthanides (such as Er), or combinations thereof, another precursor may include a metal-containing precursor which is selected from, but not limited to:

Metal Halides (e.g., $TiCl_4$, $TiI_4$, $TaCl_5$, $HfCl_4$, $ZrCl_4$, $AlCl_3$, $NbF_5$, etc.);
Alkyls (Al, Ge, Ga, In, Sb, Sn, Zn), such as trimethylaluminum, diethylzinc, triethylgalium;
Hydrides (GeH4, alanes, etc.); 8 Alkylamides (metals of group IV and V transition metals);
Imido group (metals of group V and VI);
Alkoxides (metals of group IV, V);
Cyclopentadienyls (Ru, Co, Fe, Group IV transition metals, lanthanides, etc.);
Carbonyls (ex: Ru, Co, Fe, Ni);
Amidinates and guanidinates (ex: Co, Mn, Ni, Cu, Sc, etc.);
Beta-diketonates (e.g., Sc, Cu, lanthanides);
Beta-diketoimines (Cu, Ni, Co, etc.);
Bis-trialkylsilylamides (Ni, Co, Fe, etc.); Oxo groups ($RuO_4$, $WOCl_4$, $PO(OEt)_3$, $AsO(OEt)_3$, etc.);
Heteroleptic molecules having a mixed set of ligands selected from the above families.

The Si-containing film forming compositions and one or more reactants may be introduced into the reaction chamber simultaneously (e.g., CVD), sequentially (e.g., ALD), or in other combinations. For example, the Si-containing film forming composition may be introduced in one pulse and two additional metal sources may be introduced together in a separate pulse (e.g., modified ALD). Alternatively, the reaction chamber may already contain the reactant prior to introduction of the Si-containing film forming composition. The reactant may be passed through a plasma system localized or remotely from the reaction chamber, and decomposed to radicals. Alternatively, the Si-containing film forming composition may be introduced to the reaction chamber continuously while other metal sources are introduced by pulse (e.g., pulsed-CVD). In each example, a pulse may be followed by a purge or evacuation step to remove excess amounts of the component introduced. In each example, the pulse may last for a time period ranging from about 0.01 s to about 20 s, alternatively from about 0.3 s to about 3 s, alternatively from about 0.5 s to about 2 s. In another alternative, the Si-containing film forming composition and one or more reactants may be simultaneously sprayed from a shower head under which a susceptor holding several wafers is spun (e.g., spatial ALD).

In a non-limiting exemplary ALD type process, the vapor phase of the Si-containing film forming composition is introduced into the reaction chamber, where it is contacted with a suitable substrate and forms a silicon-containing layer on the substrate. Excess composition may then be removed from the reaction chamber by purging and/or evacuating the reaction chamber. An oxygen source is introduced into the reaction chamber where it reacts with the silicon-containing layer in a self-limiting manner. Any excess oxygen source is removed from the reaction chamber by purging and/or evacuating the reaction chamber. If the desired film is a silicon oxide film, this two-step process may provide the desired film thickness or may be repeated until a film having the necessary thickness has been obtained.

Alternatively, if the desired film is a silicon metal oxide film (i.e., $SiMO_x$, wherein x may be 4 and M is Ti, Hf, Zr, Ta, Nb, V, Al, Sr, Y, Ba, Ca, As, B, P, Sb, Bi, Sn, Ge, lanthanides (such as Er), or combinations thereof), the two-step process above may be followed by introduction of a second vapor of a metal-containing precursor into the reaction chamber. The metal-containing precursor will be selected based on the nature of the silicon metal oxide film being deposited. After introduction into the reaction chamber, the metal-containing precursor is contacted with the silicon oxide layer on the substrate. Any excess metal-containing precursor is removed from the reaction chamber by purging and/or evacuating the reaction chamber. Once again, an oxygen source may be introduced into the reaction chamber to react with the metal-containing precursor. Excess oxygen source is removed from the reaction chamber by purging and/or evacuating the reaction chamber. If a desired film thickness has been achieved, the process may be terminated. However, if a thicker film is desired, the entire four-step process may be repeated. By alternating the provision of the Si-containing film forming compositions, metal-containing precursor, and oxygen source, a film of desired composition and thickness may be deposited.

Additionally, by varying the number of pulses, films having a desired stoichiometric M:Si ratio may be obtained. For example, a $SiMO_2$ film may be obtained by having one pulse of the mono-substituted TSA precursor and one pulses of the metal-containing precursor, with each pulse being followed by pulses of the oxygen source. However, one of ordinary skill in the art will recognize that the number of pulses required to obtain the desired film may not be identical to the stoichiometric ratio of the resulting film.

In a non-limiting exemplary PE-ALD type process, the vapor phase of the Si-containing film forming composition is introduced into the reaction chamber, where it is contacted with a suitable substrate, while a low reactivity oxygen source, such as $O_2$, is continuously flowing to the chamber. Excess composition may then be removed from the reaction chamber by purging and/or evacuating the reaction chamber. A plasma is then lit to activate the oxygen source to react with the absorbed mono-substituted TSA precursor in a self-limiting manner. The plasma is then switched off and the flow of the Si-containing film forming composition may proceed immediately after. This two-step process may provide the desired film thickness or may be repeated until a silicon oxide film having the necessary thickness has been obtained. The silicon oxide film may contain some C impurities, typically between 0.005% and 2%. The oxygen gas source and the substrate temperature may be selected by one of ordinary skill in the art so as to prevent reaction between the oxygen source and the mono-substituted TSA when the plasma is off. Dialkylamino-substituted TSA are particularly suitable for such a process, and are preferably $(SiH_3)_2N$—$SiH_2$—$NEt_2$, $(SiH_3)_2N$—$SiH_2$—$NiPr_2$ or $(SiH_3)_2N$—$SiH_2$—$NHR$, R being -tBu or —$SiMe_3$.

In another non-limiting exemplary PE-ALD type process, the vapor phase of the Si-containing film forming compositions is introduced into the reaction chamber, where it is contacted with a suitable substrate, while a low reactivity nitrogen source, such as $N_2$, is continuously flowing to the chamber. Excess composition may then be removed from the reaction chamber by purging and/or evacuating the reaction chamber. A plasma is then lit to activate the nitrogen source to react with the absorbed mono-substituted TSA precursor in a self-limiting manner. The plasma is then switched off and flow of the Si-containing film forming composition may proceed immediately after. This two-step process may provide the desired film thickness or may be repeated until a silicon nitride film having the necessary thickness has been obtained. The silicon nitride film may contain some C impurities, typically between 0.5% and 10%. The nitrogen gas source and the substrate temperature may be selected by one of ordinary skill in the art so as to prevent reaction between the nitrogen source and the mono-substituted TSA when the plasma is off. Amino-substituted TSA and mono-halo TSA are particularly suitable for such a process, and are preferably $(SiH_3)_2N$—$SiH_2$—$Cl$, $(SiH_3)_2N$—$SiH_2$—$NEt_2$, $(SiH_3)_2N$—$SiH_2$—$NiPr_2$, $(SiH_3)_2N$—$SiH_2$—$NHR$, R being -tBu or —$SiMe_3$, or $(SiH_3)_2N$—$SiH_2$—$N(SiH_3)_2$.

In a non-limiting exemplary LPCVD type process, the vapor phase of the Si-containing film forming compositions, preferably containing a mono-halo substituted TSA precursor, is introduced into the reaction chamber holding the substrates and kept at a pressure typically between 0.1 and 10 torr, and more preferably between 0.3 and 3 torr, and at a temperature between 250° C. and 800° C., preferably between 350° C. and 6000° C., where it is mixed with a reactant, typically $NH_3$. A thin conformal SiN film may thus be deposited on the substrate(s). One of ordinary skill in the art will recognize that the Si/N ratio in the film may be tuned by adjusting the mono-substituted TSA precursor and N-source flow rates.

In another alternative, dense SiN films may be deposited using an ALD method with hexachlorodisilane (HCDS), pentachlorodisilane (PCDS), monochlorodisilane (MCDS), dichlorodisilane (DCDS) or monochlorosilane (MCS), the disclosed Si-containing film forming compositions, and an ammonia reactant. The reaction chamber may be controlled at 5 Torr, 550° C., with a 55 sccm continuous flow of Ar. An approximately 10 second long pulse of the disclosed Si-containing film forming composition at a flow rate of approximately 1 sccm is introduced into the reaction chamber. The composition is purged from the reaction chamber with an approximately 55 sccm flow of Ar for approximately 30 seconds. An approximately 10 second pulse of HCDS at a flow rate of approximately 1 sccm is introduced into the reaction chamber. The HCDS is purged from the reaction chamber with an approximately 55 sccm flow of Ar for approximately 30 seconds. An approximately 10 second long pulse of $NH_3$ at a flow rate of approximately 50 sccm is introduced into the reaction chamber. The $NH_3$ is purged from the reaction chamber with an approximately 55 sccm flow of Ar for approximately 10 seconds. These 6 steps are repeated until the deposited layer achieves a suitable thickness. One of ordinary skill in the art will recognize that the introductory pulses may be simultaneous when using a spatial ALD device. As described in PCT Pub No WO2011/123792, the order of the introduction of the precursors may be varied and the deposition may be performed with or without the NH$_3$ reactant in order to tune the amounts of carbon and nitrogen in the SiCN film. One of ordinary skill in the art would further recognize that the flow rates and pulse times may vary amongst different deposition chambers and would be able to determine the necessary parameter for each device.

In a non-limiting exemplary process, the vapor phase of the disclosed Si-containing film forming compositions, preferably containing mono-halo substituted TSA, is introduced into the reaction chamber holding a substrate having a porous low-k film. A pore sealing film may be deposited in the conditions described in US 2015/0004806 (i.e., by introducing the disclosed silicon-containing film forming composition, an oxidant (such as ozone, hydrogen peroxide, oxygen, water, methanol, ethanol, isopropanol, nitric oxide, nitrous dioxide, nitrous oxide, carbon monoxide, or carbon dioxide), and a halogen free catalyst compound (such as nitric acid, phosphoric acid, sulfuric acid, ethylenediaminetetraacetic acid, picric acid, or acetic acid) to a reaction chamber and exposing the substrate to the process gases under conditions such that a condensed flowable film forms on the substrate).

In yet another alternative, a silicon-containing film may be deposited by the flowable PECVD method disclosed in U.S. Patent Application Publication No. 2014/0051264 using the disclosed compositions and a radical nitrogen- or oxygen-containing reactant. The radical nitrogen- or oxygen-containing reactant, such as NH$_3$ or H$_2$O respectively, is generated in a remote plasma system. The radical reactant and the vapor phase of the disclosed precursors are introduced into the reaction chamber where they react and deposit the initially flowable film on the substrate. Applicants believe that the nitrogen atoms of the (SiH$_3$)$_2$N—(SiH$_2$—X) structure helps to further improve the flowability of the deposited film, resulting in films having less voids, especially when X is an amino group, and more specifically when X is a disilylamino group like —N(SiH$_3$)$_2$.

The silicon-containing films resulting from the processes discussed above may include SiO$_2$, nitrogen doped silicon oxide, SiN, SiON, SiCN, SiCOH, or MSiN$_x$O$_y$, wherein M is an element such as Ti, Hf, Zr, Ta, Nb, V, Al, Sr, Y, Ba, Ca, As, B, P, Sb, Bi, Sn, Ge, and x, y may be from 0-4 and y+x=4, depending of course on the oxidation state of M. One of ordinary skill in the art will recognize that by judicial selection of the appropriate mono-substituted TSA precursor and reactants, the desired film composition may be obtained.

Upon obtaining a desired film thickness, the film may be subject to further processing, such as thermal annealing, furnace-annealing, rapid thermal annealing, UV or e-beam curing, and/or plasma gas exposure. Those skilled in the art recognize the systems and methods utilized to perform these additional processing steps. For example, the silicon-containing film may be exposed to a temperature ranging from approximately 200° C. and approximately 1000° C. for a time ranging from approximately 0.1 second to approximately 7200 seconds under an inert atmosphere, a H-containing atmosphere, a N-containing atmosphere, an O-containing atmosphere, or combinations thereof. Most preferably, the temperature is 600° C. for less than 3600 seconds under a reactive H-containing atmosphere. The resulting film may contain fewer impurities and therefore may have improved performance characteristics. The annealing step may be performed in the same reaction chamber in which the deposition process is performed. When the deposition process is a FCVD, the curing step is preferably an oxygen curing step, carried out at a temperature lower than 600° C. The oxygen containing atmosphere may contain H$_2$O or O$_3$. Alternatively, the substrate may be removed from the reaction chamber, with the annealing/flash annealing process being performed in a separate apparatus.

EXAMPLES

The following non-limiting examples are provided to further illustrate embodiments of the invention. However, the examples are not intended to be all inclusive and are not intended to limit the scope of the inventions described herein.

The examples described herein are TSA based precursors, i.e., halosilazane and mono-substituted TSA.

Experimental Procedure

Reaction mixtures, starting materials, solvents and products may be analyzed by any suitable means, such as by gas chromatography using part of the stream or aliquots. Gas Chromatographic analysis performed on Gas chromatographs (Agilent Technologies 7890A GC system equipped with thermal conductivity detector and mass spectrometer Agilent Technologies 5975C VL MSD system with triple axis detector and Agilent Technologies 6890N Network GC system equipped with thermal conductivity detector and mass spectrometer Agilent 5973 Network mass selective detector) equipped with Thermal Conductivity Detector (TCD). An injection port is under inert (N$_2$, Ar) atmosphere. Exemplary method: Column: Rtx-1 (Cross bond Dimethyl Polysiloxane) 105 m×0.53 mm×5 µm. Detector T=250° C.; Reference flow: 20 mL/min; Makeup flow: 5 mL/min; Carrier gas: 5 mL/imin (Helium); Oven: 35° C., 8 min, ramp 20° C./min, 200° C., 13 min; Injector: 200° C.; Splitless mode; Sample Size: 1.0 µL.

Raman spectroscopy were measured on a Kaiser RamanRxn2™ Multi-channel Raman Analyzer equipped with the non-contact probe and immersion probes. All measurements were performed for samples in the closed flask or quartz cell without any contact with the atmosphere.

Reagents: TSA (purity 99.8%, relative amount of TSA-Cl 0.09% w/w, ALAM), Diisopropylaminotrisilylamine (purity 99.1% w./w., ALAM), Hexachloroethane (99%, Sigma-Aldrich), Ph$_3$CCl(trityl chloride) (purity≥97.0%, Sigma-Aldrich), Bromotriphenylmethane (purity≥98.0%, Sigma-Aldrich) and BPh$_3$ (purity≥97.0%, Sigma-Aldrich, contains <2% H$_2$O) used as received. Ru/C (Johnson Matthey or Sigma-Aldrich Green Alternative, extent of labeling: 5 wt % loading, matrix activated carbon support), Pd/C, and Pt/C (Sigma-Aldrich Green Alternative, extent of labeling: 10 wt % loading, matrix activated carbon support) heated at 300° C. for 48 hours under vacuum to remove oxygen and moisture. Toluene (anhydrous, 99.8%, Sigma-Aldrich) used as received and operated only in glove box under nitrogen atmosphere with less than 0.5 ppm of O$_2$ and water.

The relative selectivity of halogenation process is expressed as a selectivity coefficient (r) from GC chromatogram, wherein:

$$r(\%) = I_{TSA\text{-}Cl}/(I_{TSA\text{-}Cl} + \Sigma I_{(all\ side\ products)}),$$

where $I_{TSA\text{-}Cl}$ is the intensity of TSA-Cl signal in GC chromatogram of products, $\Sigma I_{(all\ side\ products)}$ is sum of the intensities of all side products, which may include SiH$_4$, MCS, DCS, (H$_3$Si)$_2$N(SiHCl$_2$), (H$_3$Si)N(SiH$_2$Cl)$_2$, (H$_3$Si)N(SiH$_2$)N(SiH$_3$)$_3$, other chlorinated and non-chlorinated TSA oligomers.

The following comparative examples illustrate that the common approaches for halogenation of silanes are not applicable for halogenation of silazanes. Table 2 is a summary of the tests of the conventional approaches to halogenate TSA illustrated from Comparative Example 1 to 6.

Comparative Example 1: TSA Bromination with SnBr4

A mixture of 16.7 g (156 mmol) TSA in 10 ml Dodecane was prepared in a 300 cc glass flask. To the flask, a solution of 42.4 g (97 mmol) of $SnBr_4$ in 14.4 ml Dodecane was added dropwise while keeping the temperature between −7 and 3° C. The reaction mix turned milky white upon starting the addition. The volatiles from the reaction mix were collected in two consecutive (dry ice cooled and liquid $N_2$ cooled) traps. The content of the dry ice trap was a suspension of white solids, which continuously formed after filtration attempts. The GC analysis showed presence of 4.3% TSA-Br, 1.7% TSA-Br$_2$, 19.8% BDSASi, 13.8% Bromosilane. The estimated TSA-Br yield is 5.9%.

Comparative Example 2: TSA Chlorination with $PCl_3$

Inside a glove box, a 10 cc high pressure glass tube was charged with 0.35 g (2.5 mmol) $PCl_3$. The tube was connected to manifold and 0.92 g (8.6 mmol) TSA were cryotrapped into it. The content was warmed up to room temperature and stirred for 4 hrs. Yellow solid was formed and the pressure inside went up from 0 to 5 psig. Top of the tube was cooled down with dry ice and the volatiles were removed down to 65 T at −4° C. Only traces of TSA-Cl were detected in the residue by GC.

Comparative Example 3: TSA Chlorination with $pH_2PCl$

Experiment similar to Comparative example 2 was repeated with 1.01 g (4.6 mmol) $Ph_2PCl$ and 0.68 g (6.3 mmol) TSA. Intensive bubbling and solids formation was observed upon warming the reaction mixture. After the reaction subsided, the volatiles were removed to <1T at 23° C., in which ~0.4% TSA-Cl (estimated yield 0.2%) were detected by GC. No volatile products were found in a Toluene extract of the solid reaction residue.

Comparative Example 4: TSA Chlorination with $BCl_3$

Experiment similar to #2 was repeated with 0.36 g (3.1 mmol) $BCl_3$ and 0.96 g (8.9 mmol) TSA. Raman spectra did not detect signs of the reaction upon warming the mixture. After stirring the mix at 28° C. for 20 min, top of the tube was cooled with dry ice and the volatiles were removed down to 55 T at −4° C. and collected in two consecutive traps. The GC analysis of the dry ice trap showed 1% TSA-Cl (estimated yield 2.4%).

Comparative Example 5: TSA-Hal Via H/Hal Redistribution

Inside a glove box, three 2 cc vials were charged with TSA/SiBr$_4$, TSA/SiCl$_4$ and TSA/SiHCl$_3$ mixtures (~4:1 mol ratio) with AlBr$_3$ or AlCl$_3$ (~10% mol of the Halosilane amount). The contents were analyzed by GC. No TSA-Hal peaks were detected in the mixtures with SiHal$_4$. The SiHCl$_3$ containing mixture showed presence of 0.1% TSA-Cl, 1.9% TSA-Cl$_2$, 9.9% BDSASi and several heavier unidentified peaks.

Comparative Example 6: TSA-Cl from 2.5 Equiv. TSA and 1 Equiv. $S_2Cl_2$

Inside a glove box, a 20 mL vial was charged with TSA (4.0 g, 37.3 mmol) and $S_2Cl_2$ (2.0 g, 14.8 mmol). Moderate gas evolution continued for two hours, while some amount of solid formed. The resulted mixture was filtered and filtrate was analyzed by GC. GC, 2.5 h after reaction start: $H_3SiSH$ (3.3%), $(H_3Si)_3N$ (86.3%), $(H_3Si)_2N(SiH_2Cl)$ (8.8%). GC, 20 h after reaction start: $H_3SSH$ (6.6%), $(H_3Si)_3N$ (79.2%), $(H_3Si)_2N(SiH_2Cl)$ (11.9%), $(H_3Si)_2N(SiH_2)N(SiH_3)_2$ (0.9%).

TABLE 2

Summary of the tests of the conventional approaches to halogenate TSA

| Approach/ halogenating agent | Yield of TSA-X | Notes |
|---|---|---|
| SnBr$_4$ | <10% | TSA-X was detected in the products. HCl/HBr byproduct cleaved Si—N bond. Adding tertiary amines to the system caused desilylating coupling resulted in formation of polymers and highly volatile pyrophoric compounds. |
| Halophosphines: PCl$_3$/PBr$_3$, Ph$_2$PCl | <10% | Traces TSA-X were detected in the products. Side-reactions cause polymerization of the reaction mixture with formation of solid reaction product (extremely fast in case of Ph$_2$PCl). |
| BCl$_3$/BBr$_3$ | <10% | Traces TSA-X were detected in the products. Side-reactions cause polymerization of the reaction mixture. |
| SiBr$_4$, SiCl$_4$, HSiCl$_3$ | <10% | Traces TSA-X were detected in the products. Side-reactions cause polymerization of the reaction mixture. |
| S$_2$Cl$_2$, Cl$_3$CSCl | <10% | Side-reactions cause polymerization of the reaction mixture and Si—S coupling. |

While small amount of TSA-Cl was formed in the comparative examples, not all reactions were selective toward TSA-Cl and the yield of TSA-X in the above comparative examples 1-6 is not exceed 10%. Thus, low selectivity of reactions, formation of gaseous and solid byproducts preclude utilization of these reactions for industrial applications.

Comparative Example 7: Halogenation of TSA with $C_2Cl_6$ in TSA, Toluene, without and with Catalysts Pongkittiphan et al. ("Hexachloroethane: a Highly Efficient Reagent for the Synthesis of Chlorosilanes from Hydrosilanes"; V. Pongkittiphan, E. A. Theodorakis, W. Chavasiri; Tetrahedron Letters, v.50 (2009), p. 5080-5082) discloses an approach for halogenation of organic silanes with chlorocarbons such as $C_2Cl_6$, and with other chlorocarbons ether are not applicable for halogenation of silazanes or may not be used for industrial process. Chlorination of organic silane $^iPr_3SiH$ with $C_2Cl_6$ was suggested to perform most efficiently in the neat silane in Pongkittiphan et al.: $^iPr_3SiH$ chlorination was completed in ~1 h by $C_2Cl_6$ in presence of Pd/C.

Chlorination of TSA with $C_2Cl_6$ was attempted to demonstrate that the chlorination agent/catalyst suitable for organic silanes (Pongkittiphan et al.) is not applicable for the silazanes disclosed herein such as TSA.

TSA experiment disclosed herein was done as follows. Inside a glove box, $C_2Cl_6$ (2.67 g, 11.28 mmol) and Pd/C (0.43 g, 10% Pd load, 0.40 mmol Pd; predried under vacuum at 320° C. for 16 hours) were placed in a 20 mL vial. The vial was cooled to −36° C. and then precooled to −36° C. TSA (7.33 g, 68.29 mmol) was added. The vial was closed and the agitated mixture was allowed to warm up to room temperature and stirred at room temperature for 5 hours 40 minutes, then filtered. GC of filtrate: TSA 73.39%, TSA-Cl 1.13%, $(SiH_3)_2N$—$SiH_2$—O—$SiH_3$ 0.08%, $\{(H_3Si)_2N\}_2(SiH_2)$ 0.30%, $[(SiH_3)_2$—N—$SiH_2]_2$—O 0.01%, $[(SiH_3)_2NSiH_2]$ 2NH 0.09%, $C_2Cl_5H$ 1.18%, $C_2Cl_6$ 22.52%. Thus, TSA chlorination did not proceed with practically sufficient rate; the yield of TSA-Cl was less than 5%; reaction was not selective and produced TSA oligomers such as $\{(H_3Si)_2N\}_2$ $(SiH_2)$ and $[(SiH_3)_2NSiH_2]_2NH$.

This demonstrates that not any chlorocarbon/catalyst system may be utilized for selective chlorination of carbon-free silazanes.

More examples for interaction of TSA with $C_2Cl_6$ in the presence of various catalyst are given in Table 3 below. The presented data support the statement above.

TABLE 3

Results of TSA chlorination with $C_2Cl_6$

| Initial TSA:$C_2Cl_6$ | Solvent | Catalyst (mmol) | T (° C.) | Time | TSA-Cl yield (%) | TSA-Cl/TSA-Cl$_2$ | Selectivity for TSA-Cl (r) |
|---|---|---|---|---|---|---|---|
| 1.74 | toluene | no | r.t. | 66 h | 2.0 | No TSA-Cl$_2$ | 93 |
| 1.87 | toluene | Pd/C (0.58) | 49.1 ± 0.5 | 4 h 30 min | 1.2 | 1.43 | 40 |
| 1.68 | toluene | Pd/C (0.37) | r.t. | 17 h | 0.6 | 0.40 | 16 |
| 6.06 | TSA | Pd/C (0.40) | r.t. | 5 h 40 min | 4.0 | 2.63 | 49 |
| 1.74 | toluene | Pt/C (0.25) | r.t. | 17 h | 0.0 | 1.00 | 6 |
| 1.60 | toluene | B(Ph)$_3$ (0.35) | r.t. | 17 h | 1.7 | No TSA-Cl$_2$ | 92 |

Comparative Example 8. Halogenation of TSA by Chlorocarbon Solvents

Prior art (e.g., Sommer et al. ("Stereochemistry of asymmetric silicon. XVIII. Hydrogen-halogen exchange of R3SiH with trityl halides", L. H. Sommer, and D. L. Bauman, J. Am. Chem. Soc., 1969, vol. 91, p. 7076); Yanga et al. ("Reduction of Alkyl Halides by Triethylsilane Based on a Cationic Iridium Bis(phosphinite) Pincer Catalyst: Scope, Selectivity and Mechanism", J. Yanga and M. Brookhart, Adv. Synth. Catal., 2009, 351, p. 175-187); and J Yang ("Iridium-Catalyzed Reduction of Alkyl Halides by Triethylsilane", by J. Yang; Brookhart, Maurice, from Journal of the American Chemical Society (2007), 129(42), 12656-12657) disclosed approaches for halogenation of organic silanes with chlorocarbons such as $C_2Cl_6$, and with other chlorocarbons either are not applicable for halogenation of disclosed here silazanes or are not feasible for an industrial process.

TSA experiment disclosed herein was done as follows. In each of three 2 cc glass vials, TSA (0.2 ml) was blended with 1 ml of a chlorinated solvent: Methylene chloride ($CH_2Cl_2$), 1,1,1,2-Tetrachloroethane ($C_2H_2Cl_4$) and 1,2-Dichlorobenzene ($C_6H_4Cl_2$). The mixtures were analyzed by GC immediately and after 4 days.

The level of TSA-Cl in the first vial increased from 0.014 to 0.490%. No practically observable change in TSA-Cl concentration was detected in the other two mixtures. This indicated that Methylene chloride may exchange its Cl atom(s) for H with TSA but the rate of such reaction is not practical.

Example 1: Synthesis of $(SiH_3)_2N$—$SiH_2$—$NiPr_2$ and of $(SiH_3)_2N$—$SiH_2$—$NEt_2$ 300 g of diisopropylamine (3.0 mol) was charged to a 1-liter filter flask equipped with an overhead mechanical stirrer, a nitrogen bubbler, a chiller and a hydride scrubber as a reactor. 60 g (0.4 mol) of chlorotrisilylamine was charged to a dropping funnel. The dropping funnel was affixed to the reactor. A nitrogen sweep was added to the dropping funnel to prevent salt formation in the tip of the funnel. The chiller was set to 18° C. and the chlorotrisilylamine was added via dropping funnel over a 1.5 hr period. The reactor temperature was set at 22-23° C. during the addition. The reactor was allowed to stir for 0.5 hr after the addition was complete.

The amine hydrochloride salt was then filtered. The filter cake was rinsed with two 50 ml aliquots of diisopropylamine. The majority of the diisopropylamine was distilled off leaving 72 g of a crude product. The crude product was combined with other crude products from several smaller scale preparations of $(SiH_3)_2N$—$SiH_2$—$NiPr_2$ done in a similar fashion. $(SiH_3)_2N$—$SiH_2$—$NiPr_2$ was then distilled at 86° C. under a vacuum of −28 inches of mercury and 79 g of >99% pure product was collected. The overall yield was 56%. Table 4 shows vapor pressure data of $(SiH_3)_2N$—$SiH_2$—$NiPr_2$ estimated from the distillation and TSU data.

TABLE 4

Vapor pressure data of $(SiH_3)_2N$—$SiH_2$—$NiPr_2$

| Temperature (° C.) | Pressure (torr) |
|---|---|
| 86 | 38 |
| 100 | 72 |
| 150 | 140 |

The synthesis of $(SiH_3)_2N$—$SiH_2$—$NEt_2$ proceeds similarly with the same molar ratio, but replaces diisopropylamine with diethylamine.

Example 2: Synthesis of $(SiH_3)_2N$—$SiH_2$—$NHiPr$ 300 g of isopropylamine (3.0 mol) was charged to a 1-liter filter flask equipped with an overhead mechanical stirrer, a nitrogen bubbler, a chiller and a hydride scrubber as a reactor. 60 g (0.4 mol) of chlorotrisilylamine was charged to a dropping funnel. The dropping funnel was affixed to the reactor. A nitrogen sweep was added to the dropping funnel to prevent salt formation in the tip of the funnel. The chiller was set to 18° C. and the chlorotrisilylamine was added via dropping funnel over a 1.5 hr period. The reactor temperature was set at 22-23° C. during the addition. The reactor was allowed to stir for 0.5 hr after the addition was complete.

The amine hydrochloride salt was then filtered. The filter cake was rinsed with two 50 mL aliquots of isopropylamine. The majority of the isopropylamine was distilled off leaving 72 g of a crude product. The crude product was combined with other crude products from several smaller scale preparations of $(SiH_3)_2N$—$SiH_2$—NHiPr done in a similar fashion. $(SiH_3)_2N$—$SiH_2$—NHiPr was then distilled at 86° C. under a vacuum of −28 inches of mercury and 79 g of >99% pure product was collected.

Example 3: Synthesis of $(SiH_3)_2N$—$SiH_2$—Br and of $(SiH_3)_2N$—$SiH_2$—$N(SiH_3)_2$ $(SiH_3)_2N$—$SiH_2$—Br and $(SiH_3)_2N$—$SiH_2$—$N(SiH_3)_2$ may be obtained by SnBr4 reacts with TSA: $SnBr_4+H_3SiN(SiH_3)_2=BrH_2SiN(SiH_3)_2+(SiH_3)_2N$—$SiH_2$—$N(SiH_3)_2$+ $SnBr2+HBr$. A side product of the above reaction, HBr, may then be removed by a reaction with the starting material TSA, i.e., $N(SiH_3)_3+4HBr=NH_4Br+3BrSiH_3$. The synthesis process is as follows.

A round bottom flask with a PTFE-coated magnetic stir egg was charged with stoichiometric excess of TSA. If necessary, a solvent (e.g., dodecane) and an HBr scavenger (e.g., tributylamine) may be added to the flask prior to adding TSA. The flask was fitted with a cold finger condenser or a distillation head. A liquid addition funnel was attached to the flask and charged with a solution of $SnBr_4$ in a solvent (such as, anisole or dodecane). The flask may then be cooled down and the $SnBr_4$ solution was added dropwise to the flask. The headspace of the flask may be kept under atmospheric pressure of nitrogen or at a reduced pressure in order to remove HBr as it forms.

After the addition was finished, the volatile products may be collected by pulling vacuum through trap(s). The collected volatile products may then be analyzed by GCMS. It was found that $(SiH_3)_2N(SiH_2Br)$ and $(SiH_3)_2N(SiH_2N(SiH_3)_2)$ were formed upon treating TSA with $SnBr_4$. The following byproducts were also identified: silane, bromosilane, dibromotrisilylamine. The solvents and unreacted $SnBr_4$ (in some cases) were also found.

The resulting $(SiH_3)_2N$—$SiH_2$—$N(SiH_3)_2$ was liquid at room temperature (~22° C.), with a melting point of approximately −106° C. and a boiling point of approximately 131° C. The vapor pressure was calculated to be ~8 hPa at 27° C.

Example 4

The following PEALD testing was performed using a Picosun R200 PEALD 8" deposition tool with a 4" wafer. The vapor of the mono-substituted TSA precursor was delivered to the Picosun tool as shown in FIG. 1.

Figure 2:
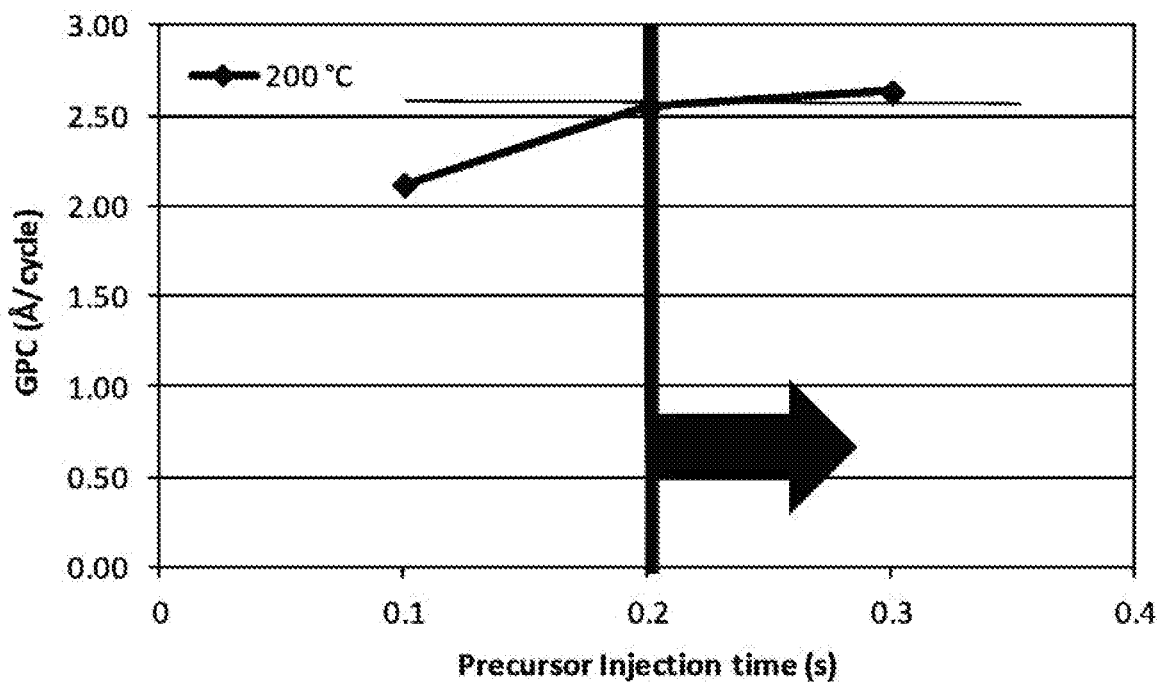
FIG. 2 is a graph the ALD growth rate of silicon oxide films as a function of the number of precursor pulses using the precursor $(SiH_3)_2N—SiH_2—NiPr_2$.

ALD tests were performed using the $(SiH_3)_2N$—$SiH_2$—$NiPr_2$, which was placed in an ampoule heated to 700° C. and O2 plasma as oxidizing reactant. Typical ALD conditions were used with the reactor pressure fixed at ~9 hPa (1 hPa=100 Pa=1 mbar). Two 0.1-second pulses of the precursor vapor were introduced into the deposition chamber via overpressure in the ampoule using the 3-way pneumatic valve. The 0.1-second pulses were separated by a 0.5 second pause. A 4-second $N_2$ purge removed any excess precursor. A 16-second plasma O2 pulse was followed by a 3-second $N_2$ purge. The process was repeated until a minimum thickness of 300 Angstrom was obtained. Depositions were performed with the substrate heated to 70° C., 1500° C., and 300° C. Real self-limited ALD growth behavior was validated as shown in FIG. 2 by increasing the number of precursor pulses within a given cycle.

Figure 3:
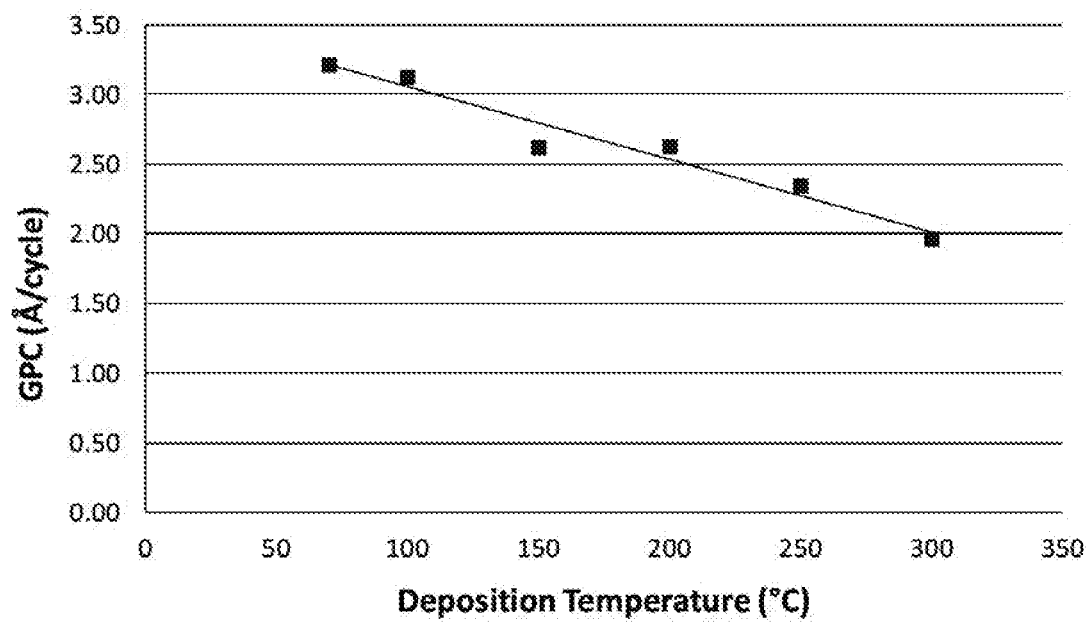
FIG. 3 is a graph of the ALD growth rate of silicon oxide thin film as a function of the temperature using the precursor $(SiH_3)_2N—SiH_2—NiPr_2$.

ALD tests were also performed using the prior art $SiH_2(NEt_2)_2$ precursor, which was placed in an ampoule heated to 60° C. and $O_2$ plasma as oxidizing reactant. Applicants believe that $SiH_2(NEt_2)_2$ is currently used to deposit $SiO_2$ in several commercial processes. Typical ALD conditions were used with the reactor pressure fixed at ~9 hPa (1 hPa=100 Pa=1 mbar). Two 0.1-second pulses of the precursor vapor were introduced into the deposition chamber via overpressure in the ampoule using the 3-way pneumatic valve. The 0.1-second pulses were separated by a 0.5 second pause. A 4-second $N_2$ purge removed any excess precursor. A 16-second plasma $O_2$ pulse was followed by a 3-second $N_2$ purge. The process was repeated until a minimum thickness of 300 Ang was reached. Depositions were performed at 700° C., 150° C., 200° C., and 300° C. As shown in FIG. 3, the growth per cycle decreased with increasing temperature. Table 5 summarizes the ALD results of $SiH_2(NEt_2)_2$ and $(SiH_3)_2N$—$SiH_2$—$NiPr_2$.

TABLE 5

Summarizes ALD results

|  | $SiH_2(NEt_2)_2$ | $(SiH_3)_2N$—$SiH_2$—$NiPr_2$ |
| --- | --- | --- |
| Growth rate 70° C.[1] | 1.42 Ang/cycle | 3.10 Ang/cycle |
| Growth rate 300° C.[1] | 0.98 Ang/cycle | 2.05 Ang/cycle |
| Wet Etch Rate 70° C.[2] | 9.4 Ang/sec | 8.8 Ang/sec |
| Wet Etch Rate 150° C.[2] | 7.2 Ang/sec | 6.7 Ang/sec |
| Wet Etch Rate 300° C.[2] | 6.6 Ang/sec | 6.7 Ang/sec |
| Refractive Index 70° C.[3] | 1.432 | 1.460 |
| Atomic % Carbon 70° C.[4] | 0.05% | TBD |
| Atomic % Carbon 150° C.[4] | 0.045% | 0.015-0.03% |
| Atomic % Hydrogen 150° C.[4] | ~10% | ~10% |
| Atomic % Nitrogen 150° C.[4] | 0.015% | 0.1% |
| Within Wafer Non Uniformity[5] | 2.84% | 2.90% |

[1]Growth rate for films deposited at the stated temperatures
[2]Wet Etch Rate for films deposited at the stated temperatures
[3]Refractive index for film deposited at 70° C.
[4]Atomic percentage in a film deposited at the stated temperature as determined by Secondary Ion Mass Spectrometry (SIMS). Hydrogen content is subject to uncertainty when measured by SIMS, as one skilled in the art would recognize.
[5]Within Wafer Non Uniformity of a film deposited at 200° C. as determined by ellipsometer over a 6 inch silicon wafer. This parameter was not optimized and better uniformity would be expected from an industrial tool.

As can be seen, the growth rate for films produced by $(SiH_3)_2N$—$SiH_2$—$NiPr_2$ is much better than those of $SiH_2(NEt_2)_2$ at both 70° C. and 300° C. At 70° C., $(SiH_3)_2N$—$SiH_2$—$NiPr_2$ has a much better wet etch rate and refractive index than $SiH_2(NEt_2)_2$. which both indicate formation of a much better, denser oxide film.

Example 5

ALD tests to deposit N-doped silicon oxide were performed using the $(SiH_3)_2N$—$SiH_2$—$NiPr_2$, which was placed in an ampoule heated to 70° C., $O_2$ plasma as oxidizing reactant and $NH_3$ plasma as an additional reactant. Typical ALD conditions were used with the reactor pressure fixed at ~9 hPa. Two 0.1-second pulses of the precursor vapor were introduced into the deposition chamber via overpressure in the ampoule using the 3-way pneumatic valve. The 0.1-second pulses were separated by a 0.5 second pause. A 4-second $N_2$ purge removed any excess precursor. A 16-second plasma O2 pulse was followed by a 3-second $N_2$ purge. Two 0.1-second pulses of the precursor vapor were introduced into the deposition chamber via overpressure in the ampoule using the 3-way pneumatic valve. The 0.1-second pulses were separated by a 0.5 second pause. A 4-second $N_2$ purge removed any excess precursor. An 11-second plasma $NH_3$ pulse was followed by a 3-second purge. The entire process (precursor-plasma $O_2$-precursor-plasma $NH_3$) was repeated until the thickness reached at least 300 Ang. Depositions were performed at 150° C.

The resulting $SiO_2$ film had a wet etch rate of 3.2 Ang/sec and N concentration of ~1%. Such a low etch rate is found to be beneficial for spacer-based double patterning to enable a low edge roughness in the transfer layer when the ALD-deposited silicon oxide film is used as a mask. The person ordinary skilled in the art would recognize that the Oxygen to Nitrogen content in the obtained film can be tuned by adjusting the number, sequence or/and duration of the O containing reactant and N containing reactant pulses. Applicant believes that a N concentration of approximately 0.5% to approximately 5% in an $SiO_2$ film is beneficial for the spacer-defined patterning applications.

Example 6

Figure 4:
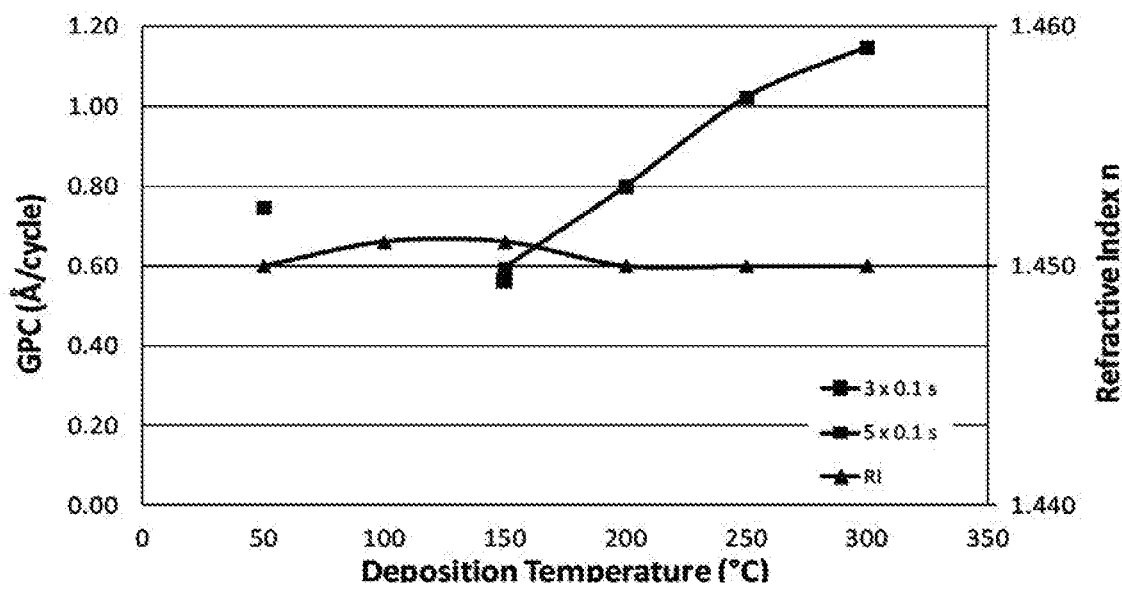
FIG. 4 is a graph the ALD growth rate of silicon oxide films as a function of the number of precursor pulses and the temperature using the precursor $(SiH_3)_2N—SiH_2—N(SiH_3)_2$.

ALD tests were performed using the $(SiH_3)_2N\text{—}SiH_2\text{—}N(SiH_3)_2$, which was placed in an ampoule heated to 26° C. and $O_2$ plasma as oxidizing reactant. Typical ALD conditions were used with the reactor pressure fixed at 9 hPa. Three 0.1-second pulses of the precursor vapor were introduced into the deposition chamber via overpressure in the ampoule using the 3-way pneumatic valve. The 0.1-second pulses were separated by a 0.5 second pause. A 4-second $N_2$ purge removed any excess precursor. A 16-second plasma $O_2$ pulse was followed by a 3-second $N_2$ purge. The entire process (precursor-plasma O2-) was repeated until the thickness reached at least 300 Ang. As shown in FIG. 4, the growth per cycle increased with increasing deposition temperatures from 150° C. to 300° C. FIG. 4 also shows comparative growth per cycle results of five 0.1-second pulses versus three 0.1-second pulses. Both were approximately 0.6 A/cycle, indicating true ALD saturation because the larger amounts of precursor introduced via 5 pulses do not result in a higher growth rate than the film produced by 3 pulses.

The growth rate was approximately 0.58 Ang/cycle at 150° C. and resulted in a film having a refractive index of 1.45. For comparison, attempts to grow an $SiO_2$ film by ALD using pure TSA in similar conditions have not yielded any films, thus proving the benefit of the chemical functionalization to enhance the reactivity with the surface hydroxyl groups.

Example 7. Halogenation of TSA with pH$_3$CCl with Catalysts

Reactions with catalysts were performed at the similar conditions and loads to show the effect of catalysts on the reaction rate. Reactions without any catalyst are also presented at the same conditions for comparison. Amounts of starting compounds, temperatures, reaction times are shown Table 6. All reactions were performed in a glove box under nitrogen with less than 0.5 ppm of oxygen.

TABLE 6

Results of TSA chlorination with the catalysts

| Reaction N | Amounts of TSA:Ph$_3$CCl (mmol) | Catalyst (mmol) | T (° C.) | Reaction Time | TSA-Cl yield (%) | TSA-Cl/TSA-Cl$_2$ in products | Selectivity (r, %) |
|---|---|---|---|---|---|---|---|
| 1 | 12.6:7.5 | No | r.t. | 17 h | 1 | 44 | 69* |
| 1a | 52.4:29.6 | No | 48.6 ± 0.5 | 4 h 20 min | 2 | 61 | 78* |
| 2 | 12.2:6.9 | Pt(10%)/C, 0.30 | r.t. | 17 h | 17 | 15 | 85 |
| 2a | 25.3:14.4 | Pt(10%)/C, 0.63 | 48.4 ± 0.8 | 4 h 20 min | 31 | 7 | 83 |
| 3 | 11.7:7.0 | Pd(10%)/C, 0.40 | r.t. | 17 h | 43 | 7 | 78 |
| 3a | 21.1:12.9 | Pd(10%)/C, 0.61 | 49.3 ± 2.4 | 4 h 20 min | 41 | 7 | 74 |
| 4 | 12.6:6.9 | BPh$_3$, 0.33 | r.t. | 17 h | 19 | 76 | 97 |
| 4a | 23.4:14.0 | BPh$_3$, 0.70 | 49.1 ± 1.2 | 4 h 15 min | 19 | 67 | 97 |
| 5 | 13.14:7.68 | Ru(5%)/C (0.23) | r.t. | 17 h | 16 | 28 | 86 |
| 6 | 27.5:14.7 | Ru(5%)/C (0.47) | 64.6 ± 1.0 | 2 h 10 min | 37 | 8 | 80 |
| 7 | 26.8:13.9 | Ru(5%)/C (0.45) | 80.0 ± 1.0 | 1 h 25 min | 48 | 8 | 78 |

Note herein:
Yield of TSA-Cl calculated from Ph$_3$CCl by reaction: Ph$_3$CCl + (H$_3$Si)$_3$N = (H$_3$Si)$_2$N(SiH$_2$Cl) + Ph$_3$CH from GC data and applying equation:
Yield (%) = 100 · $\eta_{TSA\ (mmol)}/\{(I_{TSA}/I_{TSA-Cl} \cdot M_{TSA-Cl}/M_{TSA} + 1) \cdot \eta_{Ph3CCl\ (mmol)}\}$, where $\eta_{TSA\ (mmol)}$ and $\eta_{Ph3CCl\ (mmol)}$ are amounts in mmol of TSA and Ph$_3$CCl taken for reaction, $I_{TSA}/I_{TSA-Cl}$ ratio of relative intensities of TSA and TSA-Cl in GC of reaction mixture, $M_{TSA-Cl}/M_{TSA}$ ratio of molar weights of TSA and TSA-Cl.
*high error in selectivity is possible due to low intensity of signals.

Activity of catalysts is as follows: Pd/C>Pt/C≈Ru/C>BPh$_3$>>reaction no catalyst in toluene. Selectivity of catalysts is BPh$_3$>Pt/C≈Ru/C>Pd/C. Application of Pd(10%) on carbon allows to prepare TSA-Cl with nearly 40% yield in 4 hours 20 min. Reaction accelerates with the catalyst by moderate heating without loss of selectivity. Table 7 shows GC data for TSA chlorination in Example 7.

TABLE 7

GC data for TSA chlorination in Example 7

| Reaction N | TSA (% in GC) | TSA-Cl (% in GC) | TSA-Cl$_2$* (% in GC) | Other Impurities (%) |
|---|---|---|---|---|
| 1 | 14.735 | 0.131 | 0.003 | 0.06 |
| 1a | 13.374 | 0.183 | 0.003 | 0.05 |
| 2 | 11.454 | 1.597 | 0.11 | 0.17 |
| 2a | 9.551 | 2.716 | 0.37 | 0.19 |
| 3 | 7.253 | 3.359 | 0.50 | 0.46 |
| 3a | 4.687 | 2.048 | 0.29 | 0.41 |
| 4 | 14.145 | 2.136 | 0.03 | 0.06 |
| 4a | 9.41 | 1.599 | 0.02 | 0.04 |
| 5 | 8.75 | 1.19 | 0.04 | 0.15 |

TABLE 7-continued

GC data for TSA chlorination in Example 7

| Reaction N | TSA (% in GC) | TSA-Cl (% in GC) | TSA-Cl$_2$* (% in GC) | Other Impurities (%) |
|---|---|---|---|---|
| 6 | 11.01 | 3.58 | 0.45 | 0.44 |
| 7 | 8.94 | 3.92 | 0.47 | 0.65 |

Figure 7:
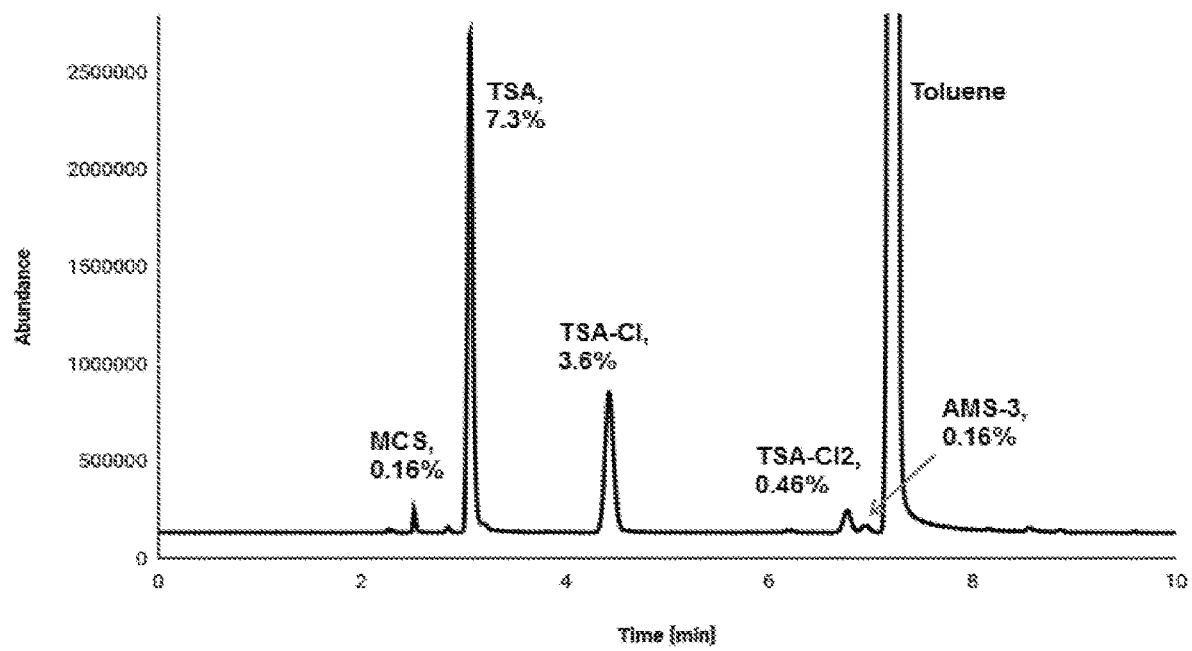
FIG. 7 is a GC chromatogram of solution $Ph_3CCl$-TSA and Pd/C, 4 h 20 min heating illustrating selectivity of chlorination toward the TSA-Cl.
Figure 8:
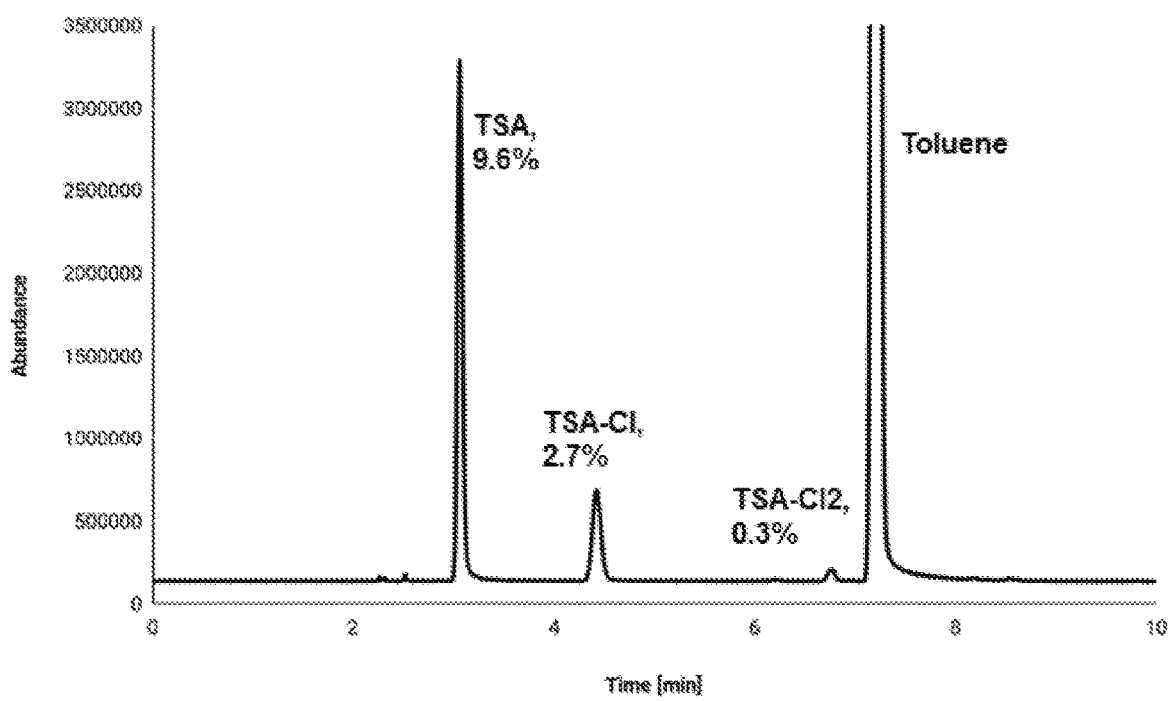
FIG. 8 is a GC chromatogram of solution $Ph_3CCl$-TSA and Pt/C, 4 h 20 min heating illustrating selectivity of chlorination toward the TSA-Cl.
Figure 9:
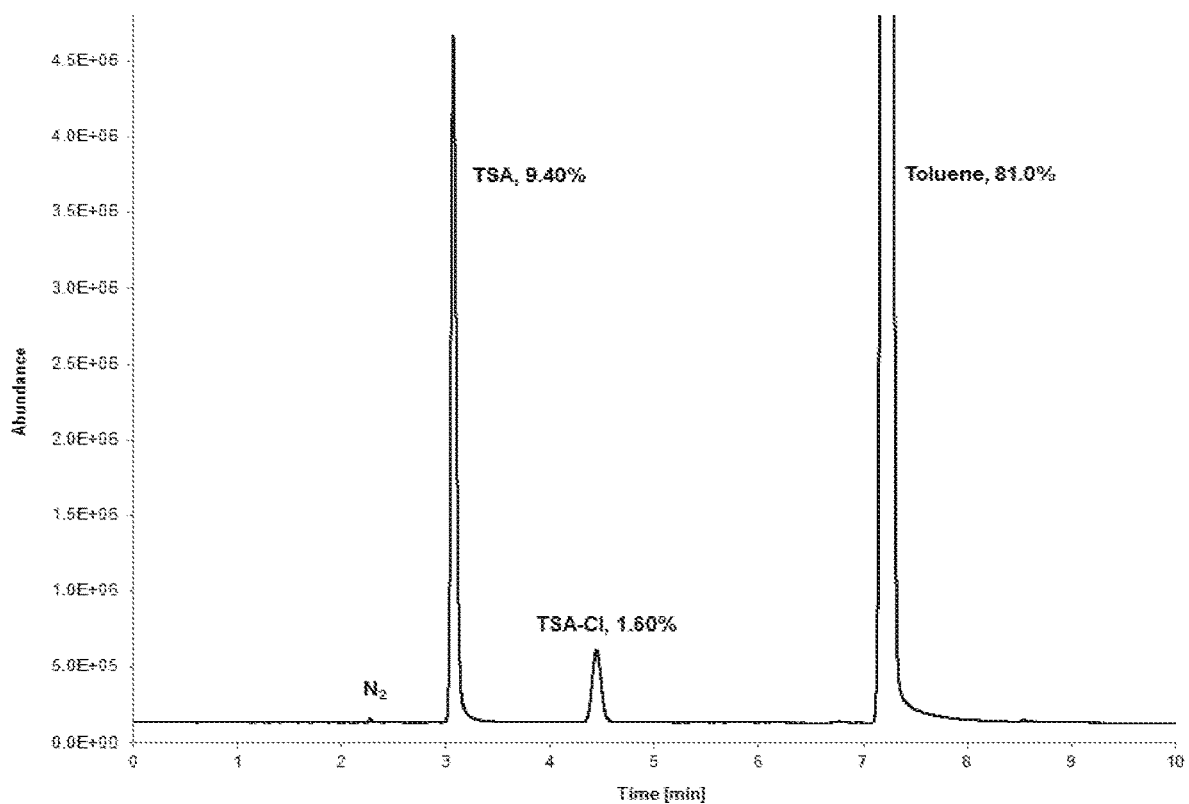
FIG. 9 is a GC chromatogram of solution $Ph_3CCl$-TSA and $BPh_3$, 4 h 15 min heating illustrating selectivity of chlorination toward the TSA-Cl.

Note herein:
*For TSA-Cl$_2$, given in Table 7 is a total amount of two isomers (H$_3$Si)$_2$N(SiHCl$_2$) and (H$_3$Si)N(SiHCl)$_2$, relative amount of one (H$_3$Si)N(SiHCl)$_2$ is significantly higher than that of (H$_3$Si)$_2$N(Si elative amount of one (H$_3$Si)N(SiHCl)$_2$ is significantly higher than that of (H$_3$Si)HCl$_2$) in all examples shown herein. Other impurities are SiH$_4$, SiH$_3$Cl, SiH$_2$Cl$_2$, {(H$_3$Si)$_2$N}$_2$(SiH$_2$) and oligonmeric aminosilanes.

a) Procedure for room temperature reaction 1 (comparative reaction without catalyst): Ph$_3$CCl was placed in a 20 mL vial and dissolved in Toluene (7.1 g). Then TSA was added, the vial was closed and the reaction mixture was stirred for 17 hours at room temperature. After that, an aliquot was taken for GC analysis.

b) Procedure for reaction 1a: Ph$_3$CC placed in a 100 mL three necked flask equipped with a thermocouple and a reflux condenser with cooling set to −30° C. Toluene (34 g) was added and Ph$_3$CCl was dissolved. TSA was added and the reaction mixture was stirred at 1 atm N$_2$ for 4 hours 20 min by heating at 48.6±0.5° C. with the oil bath. Then the flask was removed from oil bath, closed with a glass stopper and quickly cooled to room temperature. An aliquot was taken for GC analysis.

c) Procedure for room temperature reactions 2, 3 and 5 (Pt/C, Pd/C and Ru/C catalysts): Ph$_3$CCl and the required amount of the catalyst were placed in a 20 mL vial. Toluene (7.2-7.6 g) was added to dissolve Ph$_3$CCl. TSA was added, the vial was closed and the reaction mixture was stirred for 17 hours at room temperature. After that, the mixture was quickly filtered through a 0.2 μ-M PTFE filter and an aliquot of the filtrate was taken for GC analysis. GC of products with Pd/C catalyst is shown in FIG. 7. Keeping reaction mixture several days with Pt/C or Pd/C catalysts resulted in loss of selectivity, e.g. GC of the mixture with Pd/C catalyst after 9 days contained: SiH$_4$, 0.17%, MCS, 0.38%, DCS 0.03%, TSA, 0.77%, TSA-Cl, 1.62%, TSA-Cl2, 0.04 & 0.55%, AMS-3, 2.9%, Toluene, 76.1%, mixture of TSA oligomers (chlorinated & non chlorinated) 2.4%, Ph$_3$CR (R=H, Cl) 15.9%. AMS-3={(H$_3$Si)$_2$N}$_2$(SiH$_2$), MCS=SiH$_3$Cl, DCS=SiH$_2$Cl$_2$, TSA-Cl$_2$=two isomers (H$_3$Si)$_2$N(SiHCl$_2$) and (H$_3$Si)N(SiH$_2$Cl)$_2$. FIG. 7 is a GC chromatogram of solution Ph$_3$CCl-TSA and Pd/C, 4 h 20 min heating illustrating selectivity of chlorination toward the TSA-Cl.

d) Procedure for reactions 2a, 3a (Pt/C, Pd/C catalysts): Ph$_3$CCl was placed in a 100 mL three necked flask equipped with a thermocouple and a reflux condenser with cooling set to −30° C. The required amount of the catalyst was introduced and toluene (17-25 g) was added to dissolve Ph$_3$CCl. TSA was added, the flask was closed with the stopper and the reaction mixture was stirred at 1 atm N$_2$ for 4 hours 20 min while heated by an oil bath. Then the flask was removed from the oil bath, closed with the glass stopper and quickly cooled to room temperature. The content was quickly filtered through the 0.2 μ-M PTFE filter and an aliquot of the filtrate was taken for GC analysis. GC of products with Pt/C catalyst is shown in FIG. 8, which is a GC chromatogram of solution Ph$_3$CCl-TSA and Pt/C, 4 h 20 min heating illustrating selectivity of chlorination toward the TSA-Cl.

e) Procedure for room temperature reaction 4 (BPh$_3$ catalyst): Ph$_3$CCl (1.92 g, 6.89 mmol) was placed in a 20 mL vial and dissolved in toluene (4.4 g). Then TSA (1.35 g, 12.58 mmol) was added, the mixture was stirred for 15 min and then a solution of BPh$_3$ (0.08 g, 0.33 mmol) in 2.8 g of toluene was added to the mixture. The vial was closed and the reaction mixture was stirred for 17 hours at room temperature. An aliquot is taken for GC analysis.

f) Procedure for reaction 4a: Ph$_3$CCl (3.90 g, 13.99 mmol) was placed in a 100 mL three necked flask equipped with a thermocouple and a reflux condenser with cooling set to −30° C. Toluene (15.7 g) was added to dissolve Ph$_3$CCl. TSA (2.51 g, 23.39 mmol) was added, the mixture was stirred for 15 min at room temperature and then a solution of BPh$_3$ (0.17 g, 0.70 mmol) in 4.7 g of toluene was added to the mixture. The flask was closed with the stopper and the reaction mixture was stirred at 1 atm N$_2$ for 4 hours 15 min while heated at 49.1±1.2° C. by an oil bath. Then the flask was removed from oil bath, closed with glass stopper and quickly cooled to room temperature. An aliquot was taken for GC analysis. The results of reactions 4 and 4a are provided in Table 7. The major reaction product is TSA-Cl, the minor product is TSA-Cl$_2$ (H$_3$Si)N(SiH$_2$Cl)$_2$. FIG. 9 is a GC chromatogram of solution Ph$_3$CCl-TSA and BPh$_3$, 4 h 15 min heating illustrating selectivity of chlorination toward the TSa-Cl.

g) Procedure for reactions 6, 7 (Ru/C catalyst): In the glove box, Ph$_3$CCl (all amounts see Table 7) was placed in a 100 mL pressure rated glass tube equipped with a thermocouple and a pressure gauge. The required amount of the catalyst was introduced and toluene (13.4, 13.6 g) added. Then TSA added (all amounts see Table 7), the tube was closed and the reaction mixture was stirred/heated in an oil bath at 65° C. for 2 h 10 min (reaction 6) and 80° C. for 1 h 25 min (reaction 7). The pressure was monitored by the gauge. Then the tube was taken out from the oil bath, quickly cooled down to room temperature and placed in the freezer at −36° C. for 1 h 30 min. The cold solution was filtered through the 0.45 μ-M PTFE filter and an aliquot of the filtrate was taken for GC analysis. GC of products with Ru/C catalyst, reactions 6 and 7 is presented in Table 7.

Part of solution (14.87 g) obtained after filtration of the reaction mixture 6 was placed in a 100 mL two necked flask and the volatiles were collected in the cold trap (−80° C.) under the static vacuum. Remained in the pot: 2.93 g of a non-volatile material. Collected in the trap: 11.94 g of volatiles. The GC analysis: SiH$_3$Cl (0.02%), SiH$_2$Cl$_2$ (0.01%), TSA (12.12%), (SiH$_3$)$_2$N—SiH$_2$—O—SiH$_3$ (0.02%), TSA-Cl (3.95%), (H$_3$Si)$_2$N(SiHCl$_2$) (0.09%), (H$_3$Si)N(SiHCl)$_2$ (0.35%), {(H$_3$Si)$_2$N}$_2$(SiH$_2$) 0.01%, toluene (83.25%), heavier aminosilanes in total (0.12%). Yield of TSA-Cl in volatile fraction is 32%. For reaction 6, reacted TSA not forming TSA-Cl, TSA-Cl2: 11%, implying a high selectivity of reaction.

The examples disclosed in Example 7 clearly illustrate that the presented catalysts selectively accelerate chlorination of TSA. The summary of the catalysts used in the disclosed examples herein is as follows.

1) BPh$_3$ has never been suggested/reported as a catalyst for chlorination of silazanes and silanes. Application of BPh$_3$ may not be an obvious step because a related compound B(C$_6$F$_5$)$_3$ is known to polymerize TSA with previously suggested chlorination catalyst. Yet, as it is proved in these examples listed herein, BPh$_3$ does not polymerizes TSA, but promotes a selective chlorination.

2) Pd/C has been suggested for chlorination only for substituted silane $^i$Pr$_3$SiH with hexachloroethane, but not for TSA with Ph$_3$CCl. Selectivity of Pd/C is lowest among presented catalysts.

3) Pt/C and Ru/C have never been suggested before for chlorination of silazanes. Both heterogeneous catalysts are active and selectively chlorinate TSA producing TSA-Cl and TSA-Cl$_2$. These are thus preferred for a large-scale process based on a flow through or pot reaction.

4) Selectivity of the reaction may depend on relative amounts of the reagents and on the degree of conversion, e.g. if the reaction is pushed to full consumption of Ph$_3$CCl, the resulted long exposure of TSA/TSA-Cl to the catalyst leads to loss of selectivity.

Example 8. Halogenation of TSA with pH$_3$CCl in Various Solvents

Inside a glove box, five 20 ml glass vials were charged with 1 g (3.6 mmol) of Ph$_3$CCl, each. 3.6 ml of a solvent was added to each vial to dissolve the solids. Here the solvent is selected from PhCl, PhCl$_2$, C$_2$Cl$_4$H$_2$, PhCF$_3$* or CH$_2$Cl$_2$. Then 0.69-0.75 g (6.4-7.0 mmol) of TSA were added to each vial. The progress of the reaction was monitored by GC. Note: *as Trityl Chloride solubility in PhCF$_3$ was not sufficient, in this case, 7.2 ml of PhCF$_3$ was used.

Figure 10:
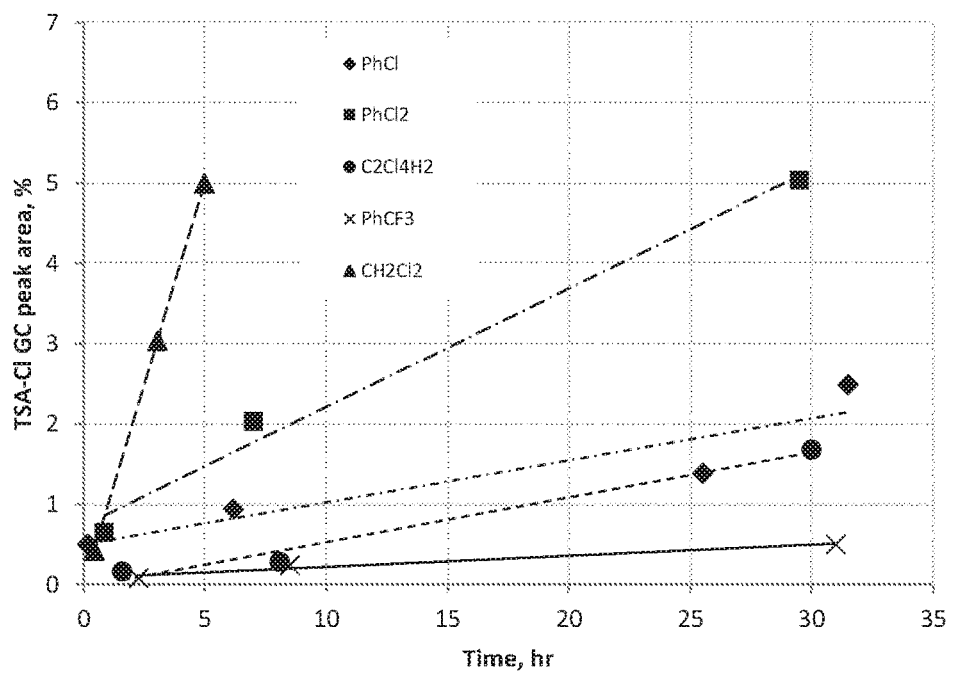
FIG. 10 is Kinetic of TSA-Cl accumulation in reaction mixtures in various solvents.

The rate and selectivity of the halogenation are illustrated in FIG. 10 and Table 8. FIG. 10 is Kinetic of TSA-Cl accumulation in the reaction mixture in various solvents, i.e., TSA-Cl concentration vs time in various solvents.

TABLE 8

Selectivity of TSA chlorination in various solvents

| Solvent | Conversion (by TSA-Cl/TSA peak ratio) | Selectivity (by TSA-Cl$_2$/ TSA peak ratio) | Selectivity Coefficient γ, % |
|---|---|---|---|
| PhCl | 0.26 | 7.9 | 74 |
| PhCl$_2$ | 0.52 | 23 | 78 |
| C$_2$Cl$_2$H$_2$ | 0.14 | 22.3 | 49 |
| PhCF$_3$ | 0.06 | 0.7 | 30 |
| CH$_2$Cl$_2$ | 1.04 | 64.8 | 86 |

The results in Table 8 show that the rate of TSA chlorination and reaction selectivity depend strongly on the solvent. The rate of reaction goes down in the sequence: CH$_2$Cl$_2$>PhCl$_2$>C$_2$Cl$_4$H$_2$~PhCl>PhCF$_3$. CH$_2$Cl$_2$ (methylene chloride) and PhCl$_2$ (o-dichlorobenzene) media offer the best selectivity of the process.

Example 9 Halogenation of TSA with pH$_3$CCl in Toluene at High Temperature and High Pressure Inside a glove box, a 150 mL pressure rated glass flask equipped with a magnetic stirring bar, a thermocouple and a pressure gauge was charged with 12.42 g (44.6 mmol) of Trityl chloride, 41.15 g of Toluene (anhydrous toluene from Aldrich) and 11.43 g (106.5 mmol) of TSA. The flask sealed and heated under stirring in an oil bath to 90° C., then kept 7 hours at 90° C. Pressure initially reached 15 psig at 90° C., then dropped to 14 psig during 3 hours and was stable at 14 psig to the end of experiment. After 7 hrs, the reaction mixture was cooled to room temperature, while pressure dropped to 0 psig, then placed in the freezer, Ph$_3$CH crystallized, aliquote of liquid analyzed by GC: SiH$_3$Cl (0.11%), TSA (14.13%), TSA-Cl (10.02%), TSA-C$_2$ (0.03%), TSA-Cl$_2$ (0.47%), Toluene (74.07%). Ph$_3$CH (1.00%). TSA-Cl yield: 76%.

TSA chlorination by Ph$_3$CCl in toluene at 52° C. and below and at normal pressure is slow (yield of TSA-Cl is 2% at 48.6±0.5° C. for 4 h 20 min) and is not suitable for industrial synthesis. However, the selective chlorination may be accomplished within several hours at 87-90° C./above atmospheric pressure (higher than boiling point of TSA 53° C.) with substantial TSA-Cl yield. This solution is not obvious since 1) syntheses are not normally considered above boiling point of reagents if reactions are not proceeding up to boiling point, 2) aminosilanes tend to decompose at higher temperatures and hence temperatures higher than boiling point in aminosilane chemistry are normally avoided.

Example 10. Halogenation of TSA with pH$_3$CCl in Xylene at High Temperature and High Pressure, Followed by Separation of pH$_3$CH and Distillation of Reaction Products Inside a glove box, a 150 mL pressure rated glass flask equipped with a magnetic stirring bar, a thermocouple and a pressure gauge was charged with 30.02 g (0.11 mol) of Ph$_3$CCl, 40.3 g of xylenes (pre dried over molecular sieves) and 13.06 g (0.12 mol) of TSA. The flask sealed and heated under stirring in an oil bath to 90° C., then kept 5.5 hours at 90° C. Pressure initially reached 14.2 psig at 90° C., then dropped to 10 psig during 3 hours and was stable at 10 psig to the end of experiment. After 6 hrs, the reaction mixture was cooled to room temperature, while pressure dropped to 0 psig, and placed in the freezer at −35° C. for 18 hours. Solid deposited at low temperature (46.14 g) separated by filtration and the obtained liquid stripped under vacuum in the trap cooled with liquid nitrogen. Collected in the trap 30.53 g of liquid, remaining undistilled 6.73 g.

GC of deposited solid (0.09 g of solid in 0.42 g of toluene): TSA (0.08%), TSA-Cl (0.53%), TSA-Cl2 (0.07%), toluene (90.93%), xylenes (2.61%), Ph$_3$CH (5.76%). GC of stripped liquid: SiH$_3$Cl (0.21%), SiH$_2$Cl$_2$ (0.13%), TSA (8.86%), TSA-Cl (22.82%), TSA-Cl$_2$ (0.20%), TSA-Cl$_2$ (2.95%), (H$_3$Si)$_2$N(SiH$_2$)N(SiH$_3$)$_2$ (0.05%), Xylenes (64.68%). TSA-C isolated yield: 45%. GC of liquid remaining undistilled during stripping: TSA-Cl$_2$ (0.22%), Xylenes (73.96%), Ph$_3$CH (25.69%).

This example illustrates that the reaction could be scaled up. Almost all formed triphenyl methane could be crystallized and separated by filtration, while all TSA and TSA-Cl stripped from the reaction mixture (from filtrate obtained after separation of triphenylmethane). TSA-Cl isolated yield: 45% at the presented ratio of starting compound and presented process pathway.

Example 11. Halogenation of TSA with pH$_3$CCl in Xylene at High Temperature and High Pressure Followed by Distillation of Reaction Products Directly from the Reaction Mixture Inside a glove box, a 440 mL pressure rated glass flask equipped with a magnetic stirring bar, a thermocouple and a pressure gauge was charged with 91.38 g (0.33 mol) of Trityl chloride, 120.48 g of Xylenes (pre dried over molecular sieves) and 50.05 g (0.47 mol) of TSA. The flask sealed and heated under stirring in an oil bath to 90° C., then kept 5 hours at 90° C. Pressure initially reached 18 psig at 90° C., then dropped to 13 psig during 3 hours and was stable at 13 psig to the end of experiment. After 5 hrs, the reaction mixture was stripped during 30 min in the trap cooled with liquid nitrogen under a static vacuum. Temperature during the stripping initially dropped to 80.8° C. and then gradually increased to 85.5° C., while pressure gradually decreased to 160 Torr during the stripping. After 30 min stripping stopped, reaction mixture cooled to room temperature, collected distillate in the trap was warmed to room temperature, weighted and analyzed by GC.

Weight of reaction mixture after stripping is 207.9 g. GC of reaction mixture after stripping: TSA (0.17%), TSA-Cl (6.51%), TSA-Cl$_2$ (0.09%), TSA-Cl$_2$ (1.63%), (H$_3$Si)$_2$N(SiH$_2$)N(SiH$_3$)$_2$ (0.05%), Xylenes (65.41%), Ph$_3$CH (26.00%). More TSA-Cl and TSA-Cl$_2$ was obtained from this mixture by stripping at vacuum below 160 torr.

Weight of stripped liquid is 51.3 g. GC of reaction mixture after stripping: SiH$_3$Cl (0.65%), SiH$_2$Cl$_2$ (0.26%), TSA (39.61%), TSA-Cl (42.50%), TSA-Cl$_2$ (0.13%), iso-TSA-Cl$_2$ (1.36%), (H$_3$Si)$_2$N(SiH$_2$)N(SiH$_3$)$_2$ (0.05%), Xylenes (15.38%). TSA-Cl isolated yield in stripped liquid: 47%. Total yield of TSA-Cl 75.5%. Reacted Ph$_3$CCl not forming TSA-Cl & TSA-Cl$_2$: 31.5 mmol. Selectivity: 90.5%.

This example illustrates scalability of the process. All TSA, TSA-Cl may be directly stripped from the hot reaction mixture illustrating efficiency of the presented approach.

Example 12. Bromination of BDSASi with pH$_3$CBr in Methylene Chloride

Inside a glove box, a 2 cc glass vial was charged with 0.9 mmol of Ph$_3$CBr. To the vial, 0.9 ml of Methylene Chloride was added followed by 1.45 equivalents of BDSASi.

GC analysis shown BDSASi bromination was complete after 22 hours. The estimated yield of BDSASi-Br was 12%. GC of reaction mixture (1.45 BDSASi: Ph$_3$CBr):SiH$_3$Br (0.15%), TSA (0.33%), CH$_2$Cl$_2$ (81.64%), (H$_3$Si)$_2$N(SiH$_2$Br) (0.77%), (H$_3$Si)$_2$N(SiH$_2$)N(SiH$_3$)$_2$ (8.03%). ((H$_3$Si)$_2$N(SiH$_2$))$_2$NH (0.06%), BDSASi-Br (0.35%), iso-BDSASi-Br (1.28%), ((H$_3$Si)$_2$N)$_3$SiH (0.55%), oligomeric aminosilanes [Si$_8$N$_4$H$_{22}$](0.09%), [Si$_9$H$_{24}$N$_4$] (0.19%), Ph$_3$CH (6.05%).

i. Compound (H$_3$Si)$_2$N(SiH$_2$Br).

Figure 11:
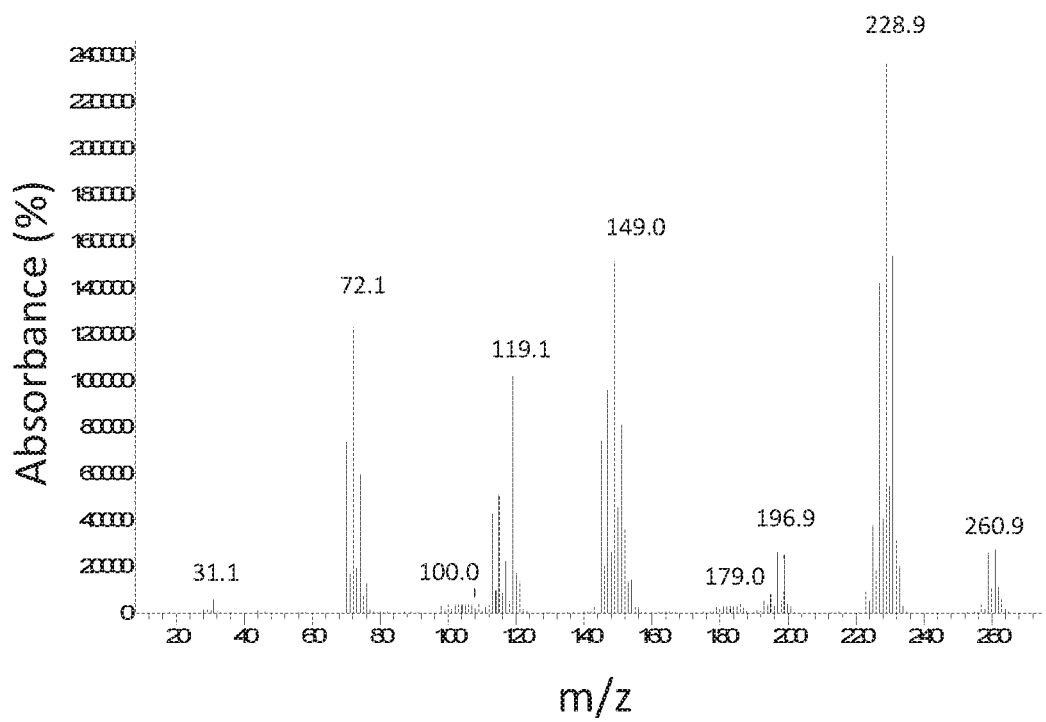
FIG. 11 is Mass Spectra of BDSASi-Br main isomer.

Observed in mass spectrum multiplet with maximum at m/z=184, is formed mostly by [M-H]$^+$ (Si$_3$H$_7$NBr) overlapped with weak [M]$^+$ and [M-H$_2$]$^+$. Observed patterns for [M-H]$^+$ (Si$_3$H$_7$NBr) are similar to calculated ones for [Si$_3$H$_7$NBr]$^+$ (m/z=184). MS (H$_3$Si)$_2$N(SiH$_2$Br): multiplet m/z=182-190 with maximum at m/z=184 [M-H]$^+$ overlapped with weak [M]$^+$, [M-H$_2$], [M-3H]$^+$ (100%), multiplet m/z=150-156 [M-SiH$_3$], [M-SiH$_4$]$_+$, [M-H—SiH$_4$]$^+$ (40%). Mass spectra of two isomers BDSASI-Br are similar. FIG. 11 is the mass spectra of the BDSASi-Br (bis-Disilylaminosilyl bromide, (SiH$_3$)$_2$N—SiH$_2$—N(SiH$_3$)(SiH$_2$Br)).

ii. Compound BDSASI-Br.

Figure 12:
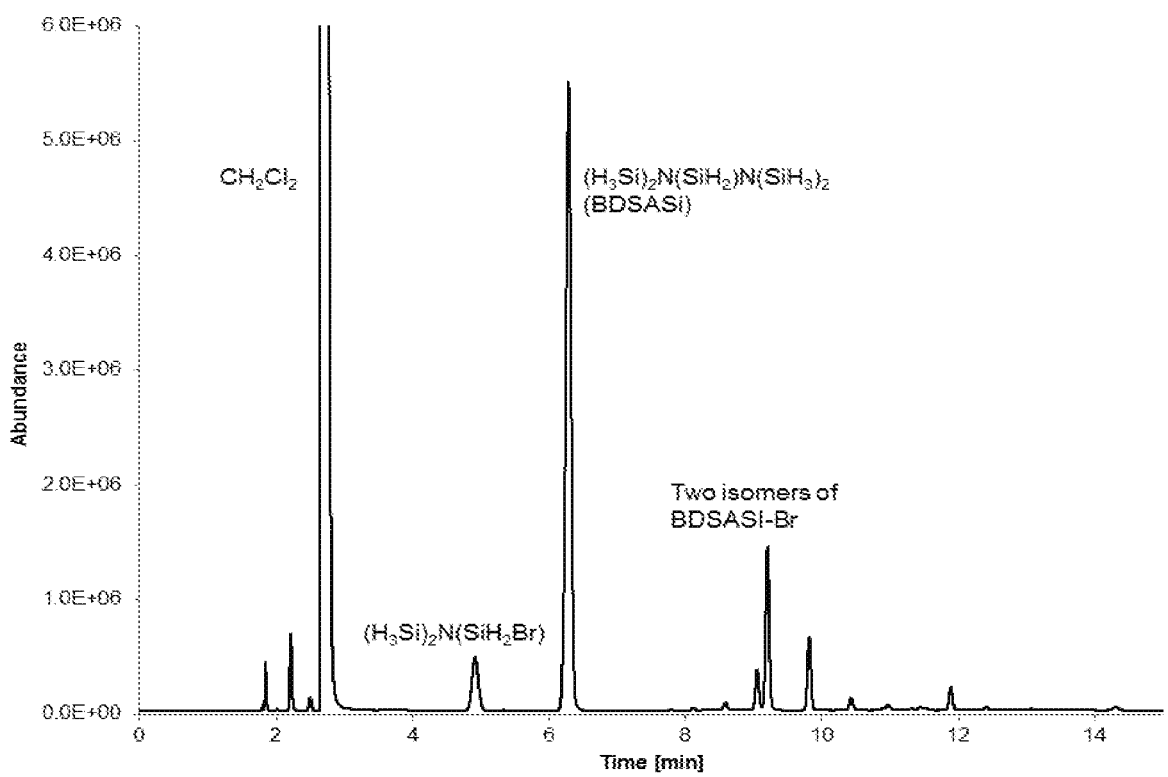
FIG. 12 is a GC chromatogram of BDSASi reaction mixture of 1M $Ph_3CBr/CH_2Cl_2$+1.45 eq.

Observed in mass spectrum multiplet with maximum at m/z=261 is from [M-H]$^+$ (Si$_5$H$_{12}$N$_2$Br). Observed patterns for [M-H]$^+$ (Si$_5$H$_{12}$N$_2$Br) are similar to calculated ones for [Si$_5$H$_{12}$N$_2$Br]$^+$ (m/z=261). MS BDSASI-Br: 261 [M-H]$^+$ (15%), 229 overlapped with 227 [M-SiH$_3$]$^+$, [M-SiH$_4$—H]$^+$ (100%), 197 [M-SiH$_4$—SiH$_3$]$^+$ (10%), overlapped multiplet 145-151 [M-SiH$_4$—Br]$^+$, [M-SiH$_3$—Br]$^+$, [M-SiH$_3$—HBr]+, [M-SiH$_4$—HBr]$^+$ (70%). FIG. 12 GC Chromatogram of 1M Ph$_3$CBr/CH$_2$Cl$_2$+1.45 eq. BDSASi reaction mixture Example 13 Chlorination of BDSASi with pH$_3$CCl in Methylene Chloride Reaction mixture with Ph$_3$CCl was prepared as in example 12.1. BDSASi chlorination was not detected after 24 hrs and 0.01 g of BPh$_3$ catalyst was added to the solution. GC showed completion of the reaction within 2 hours. The estimated yield of BDSASi-Cl was 47%. The ratio of BDSASi-Cl to BDSASi-Cl2 peaks is 6.0.

Figure 13:
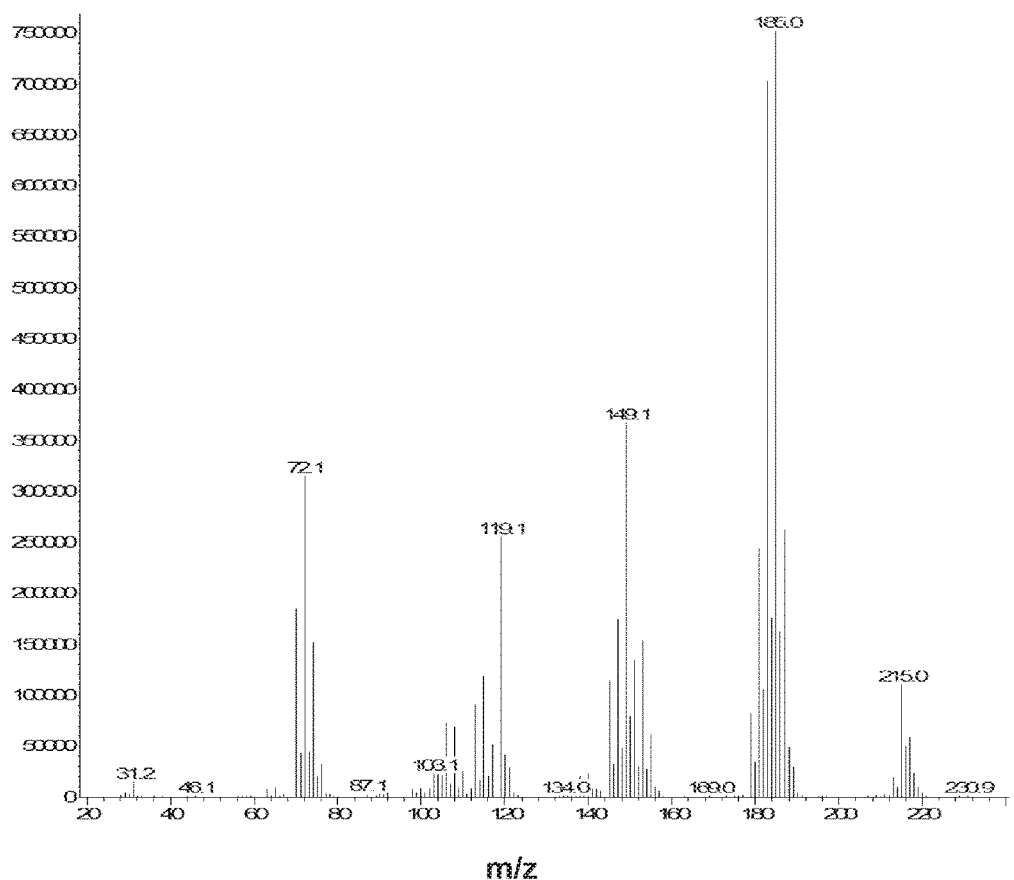
FIG. 13 is Mass Spectra of BDSASi-Cl main isomer.

(H$_3$Si)$_2$N(SiH$_2$)N(SiH$_3$)$_2$ (BDSASi) chlorination with initial ratio BDSASi:Ph$_3$CCl=3:1 proceeded with the BDSASi-Cl yield 66% and the ratio of BDSASi-Cl to BDSASi—Cl2 12.6. GC of reaction mixture (3BDSASi:1Ph$_3$CCl):CH$_2$Cl$_2$ (66.04%), (H$_3$Si)$_2$N(SiH$_2$)N(SiH$_3$)$_2$ (18.07), BDSASi-Cl (2.46%), iso-BDSASI-Cl (4.58%), BDSASi-Cl$_2$ (0.27%), iso-BDSASI-Cl$_2$ (0.28%), oligomeric aminosilanes Si$_9$H$_{24}$N$_4$ (0.50%), Si$_9$H$_{23}$N$_4$Cl (0.32%), Ph$_3$CH (6.68%), BPh$_3$ (0.04%). Mass spectra of two isomers BDSASi-Cl are similar. FIG. 13 is one of the mass spectra of BDSASi-Cl (bis-Disilylaminosilyl chloride, (SiH$_3$)$_2$N—SiH$_2$—N(SiH$_3$)(SiH$_2$Cl)).

i. Compound BDSASI-Cl.

Figure 14:
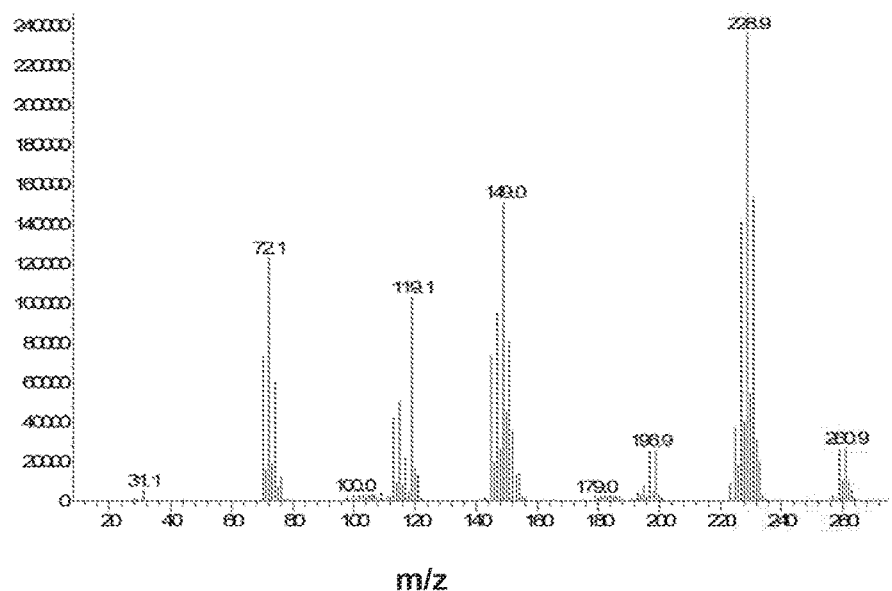
FIG. 14 is Mass Spectra of $BDSASi-Cl_2$ main isomer.

Observed in mass spectrum multiplet with maximum at m/z=215 is mostly by [M-H]$^+$ (Si$_5$H$_2$N$_2$Cl) with a small impact of [M]$^+$. Observed patterns for [M-H]$^+$ (Si$_5$H$_{12}$N$_2$Cl) are similar to calculated ones for [Si$_5$H$_2$N$_2$Cl]$^+$ (m/z=215). MS BDSASi-Cl: 216 [M]$^+$ overlapped with 215 [M-H]$^+$ (20%), 185 [M-SiH$_3$] overlapped with 183 [M-SiH$_4$]$^+$, 181 [M-Cl]$^+$, 179 [M-HCl] (100%), 145-153 multiplet (50%). Mass spectra of two isomers of BDSASi-Cl$_2$ are similar. FIG. 14 is one of the mass spectra of BDSASi-Cl$_2$ (bis-disilylaminosilyl dichloride, (SiH$_3$)$_2$N—SiH$_2$—N(SiH$_2$Cl)$_2$)).

ii. Compound BDSASI-Cl$_2$.

Figure 15:
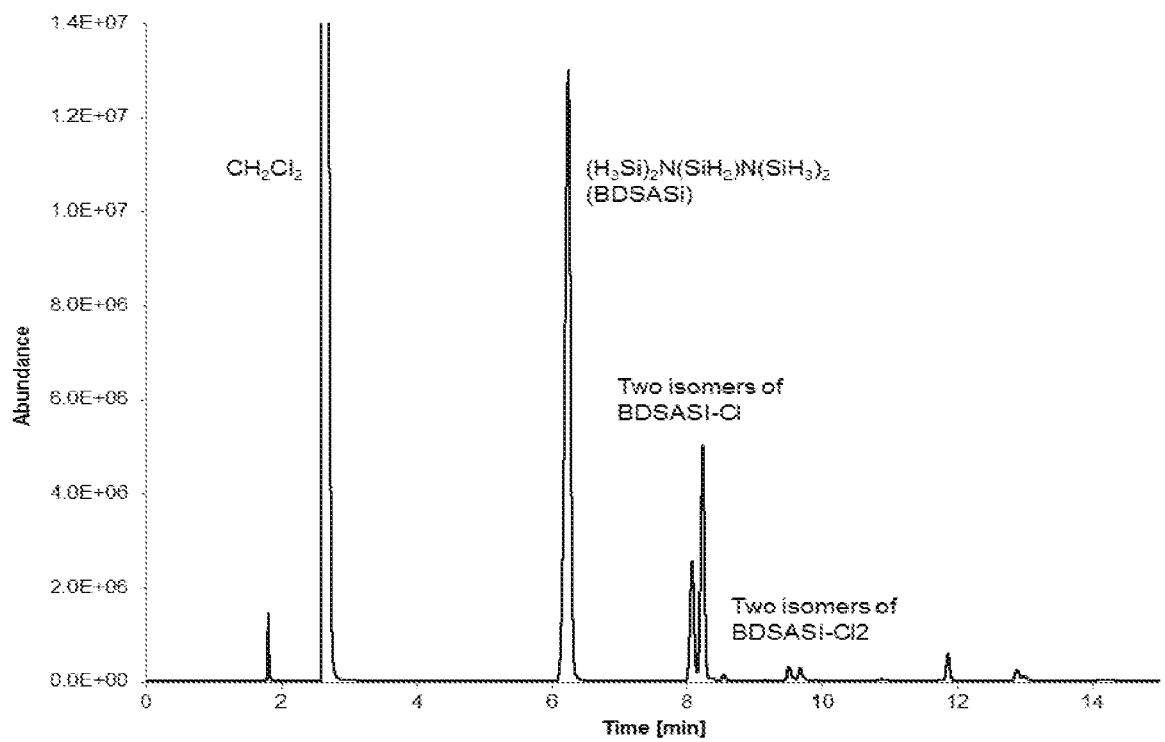
FIG. 15 is a GC chromatogram of BDSASi reaction mixture of 1M $Ph_3CCl/CH_2Cl_2$+1.45 eq.

Observed in mass spectrum multiplet with maximum at m/z=249 is formed by [M-H]$^+$ (Si$_5$H$_{11}$N$_2$Cl$_2$). Observed patterns for [M-H]$^+$ (Si$_5$H$_{11}$N$_2$Cl$_2$) are similar to calculated ones for [Si$_5$H$_{11}$N$_2$Cl$_2$]$^+$ (m/z=249). MS BDSASi-Cl$_2$: 249 [M-H]$^+$ (20%), multiplet with m/z=213-221 due to [M-SiH$_3$], [M-SiH$_4$]$^+$, [M-Cl], [M-HCl]$^+$ (100%), multiplet with m/z=179-185 due to [M-2SiH$_3$]$^+$, [M-SiH$_3$—Cl]$^+$, [M-SiH$_3$—HCl]$^+$, etc. (80%). FIG. 15 GC Chromatogram of 1M Ph$_3$CCl/CH$_2$Cl$_2$+1.45 eq. BDSASi reaction mixture Example 14. Halogenation of TSA-Cl with pH$_3$CBr in Methylene Chloride Inside a glove box, a 2 cc glass vial was charged with 0.9 mmol of Ph$_3$CBr, 0.9 ml of Methylene Chloride and 1.45 equivalents of TSA-Cl. GC analysis showed that TSA-Cl bromination was complete after 48 hours since signal of Ph$_3$CC was absent on the chromatogram. The estimated yield of TSA-Br was 17%.

Based on the GC data reaction may proceed by the following equation:

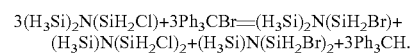

CG of reaction mixture after 48 h (1.45BDSASi:PhsCBr): SiH$_3$Cl (0.05%), SiH$_2$Cl$_2$ (0.12%), CH$_2$Cl$_2$ (80.45%), (H$_3$Si)$_2$N(SiH$_2$Cl) (8.08%), (H$_3$Si)$_2$N(SiH$_2$Br) (1.70%), (H$_3$Si)$_2$N(SiH$_2$Cl$_2$) (0.17%), (H$_3$Si)N(SiH$_2$Cl)$_2$ (2.03%), (H$_3$Si)N(SiH$_2$Br)$_2$ (1.15%), Ph$_3$CH (5.90%). MS of (H$_3$Si)$_2$N(SiH$_2$Br) refers to Example 10.

Compound (H$_3$Si)N(SiH$_2$Br)$_2$.

Figure 16:
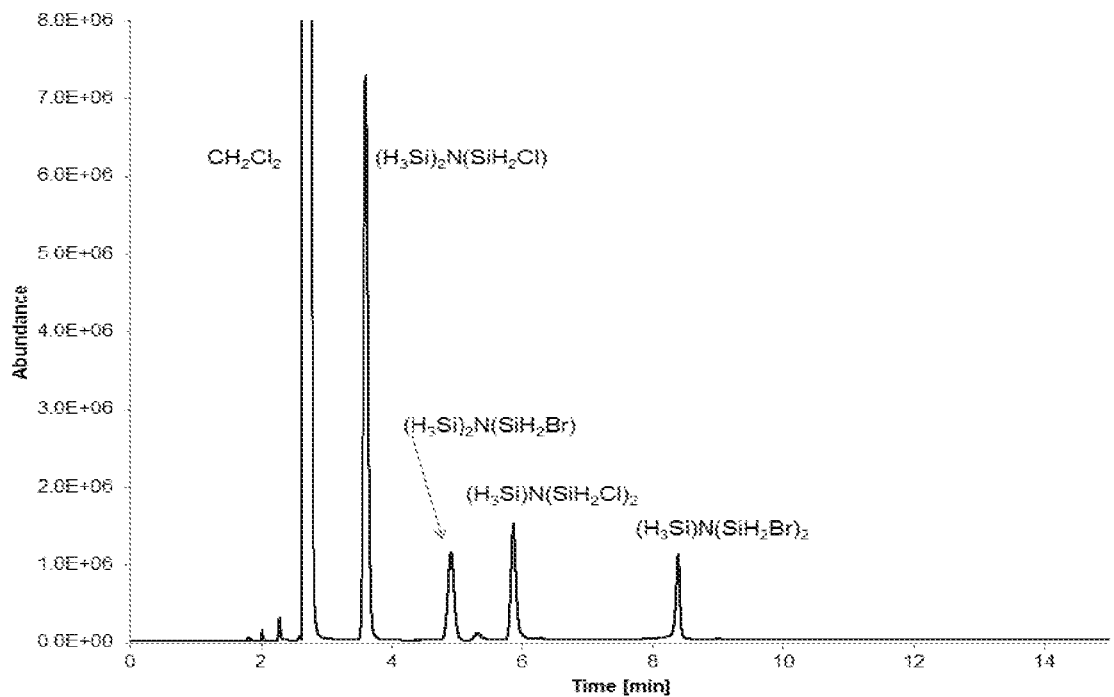
FIG. 16 is a GC chromatogram of TSA-Cl reaction mixture of 1M $Ph_3CBr/CH_2Cl_2$+1.45 eq.

Observed in mass spectrum multiplet with maximum at m/z=264 is formed by [M-H]$^+$ (Si$_3$H$_6$NBr$_2$). Observed patterns for [M-H]$^+$ (Si$_3$H$_6$NBr$_2$) are similar to calculated ones for [Si$_3$H$_6$NBr$_2$]$^+$ (m/Z=264). MS (H$_3$Si)N(SiH$_2$Br)$_2$: 264 [M-H]$^+$ (100%), 232 [M-H—SiH$_4$]$^+$ (15%), 184 [M-HBr]$^+$ (70%), 152 [M-HBr—SiH$_4$] (70%). FIG. 16 GC Chromatogram of 1 M Ph$_3$CBr/CH$_2$Cl$_2$+1.45 eq. TSA-Cl reaction mixture.

Five compounds, $(H_3Si)_2N(SiH_2Br)$, BDSASi-Br, BDSASi-Cl, BDSASi-C$_2$ and $(H_3Si)N(SiH_2Br)_2$, are synthesized in Examples 12 to 14 as a result of application of the disclosed method for selective chlorination of aminosilanes with i) Ph$_3$CCl or ii) Ph$_3$CCl without and with a catalyst.

Examples 15. Chlorination of $(H_3Si)_2N(SiH_2(N^iPr_2))$

Preparation followed the procedure shown in Example 7.2. New compounds, $(H_3Si)(H_2SiCl)N(SiH_2(N^iPr_2))$, $(H_2SiC)_2N(SiH_2(N^iPr_2))$, $(H_3SiCl)N(SiH_2(N^iPr_2))_2$, are synthesized herein as a result of application of the disclosed method for selective chlorination of aminosilanes with Ph$_3$CCl and applying a catalyst.

Reactions started with mixing $(H_3Si)_2N(SiH_2(N^iPr_2))$ (2.0 g, 9.7 mmol), Ph$_3$CCl (2.12 g, 7.6 mmol), Pd/C (0.54 g, 10% Pd, 0.5 mmol), toluene (7 g). CG of filtered reaction mixture: $(H_3Si)_2N(SiH_2Cl)$ (1.23%), toluene (78.70%), $(H_3Si)_2N(SiH_2(N_2Pr_2))$ (6.44%), $(H_3Si)(H_2SiCl)N(SiH_2(N^iPr_2))$ (3.02%), $(H_2SiCl)_2N(SiH_2(N^iPr_2))$ (0.16%), $(H_3Si)N(SiH_2(N^iPr_2))_2$ (1.28%), $(H_3SiC)N(SiH_2(N^iPr_2))_2$ (0.36%), Ph$_3$CH (7.93%). The yield of $(H_3Si)(H_2SiCl)N(SiH_2(N^iPr_2))$ is 77% from Ph$_3$CCl assuming that chlorination proceeds by equation: $3(H_3Si)_2N(SiH_2(N^iPr_2))+2Ph_3CCl=(H_3Si)(H_2SiCl)N(SiH_2(N^iPr_2))+(H_3Si)_2N(SiH_2Cl)+(H_3Si)N(SiH_2(N^iPr_2))_2+Ph_3CH$.

i. Compound $(H_3Si)(H_2SiCl)N(SiH_2(N^iPr_2))$.

Observed in mass spectrum patterns of molecular ion assigned to $(H_3Si)(H_2SiCl)N(SiH_2(N^iPr_2))$ are similar to calculated ones for $[C_6H_{21}N_2Si_3Cl]+$ (m/z=240). MS $(H_3Si)(H_2SiCl)N(SiH_2(N^iPr_2))$: 240 [M]$^+$ overlapped with 239 [M-H]$^+$ (10%), 225 [M-Me]$^+$ (100%), 195 [M-Me-SiH$_3$]$^+$ (15), 181 [M-HPr—CH$_4$]$^+$ overlapped with 183 [M-$^i$Pr-Me]+(80%), 155 [M-C$_6$H$_{13}$] overlapped with 153 [M-H$^i$Pr-$^i$Pr]$^+$ overlapped with 151 [M-SiH$_3$-$^i$Pr-Me]$^+$ (15), 140 [M-N$^i$Pr]$^+$ (30%).

ii. Compound $(H_2SiCl)_2N(SiH_2(N^iPr_2))$.

Observed in mass spectrum patterns of molecular ion assigned to $(H_2SiCl)_2N(SiH_2(N^iPr_2))$ are similar to calculated ones for $[C_6H_{20}N_2Si_3Cl_2]^+$ (m/Z=274). MS $(H_2SiCl)_2N(SiH_2(N^iPr_2))$: 274 [M]$^+$ (5%), 259 [M-Me] (100%), 229 [M-H$_2$-$^i$Pr] overlapped with 231 [M-$^i$Pr]+ (10%), 215 [M-CH$_4$-$^i$Pr]$^+$ overlapped with [M-N$^i$Pr]$^+$ (80%), 174 [M-N$^i$Pr$_2$] (40%).

iii. Compound $(H_3SiCl)N(SiH_2(N^iPr_2))_2$.

Figure 17:
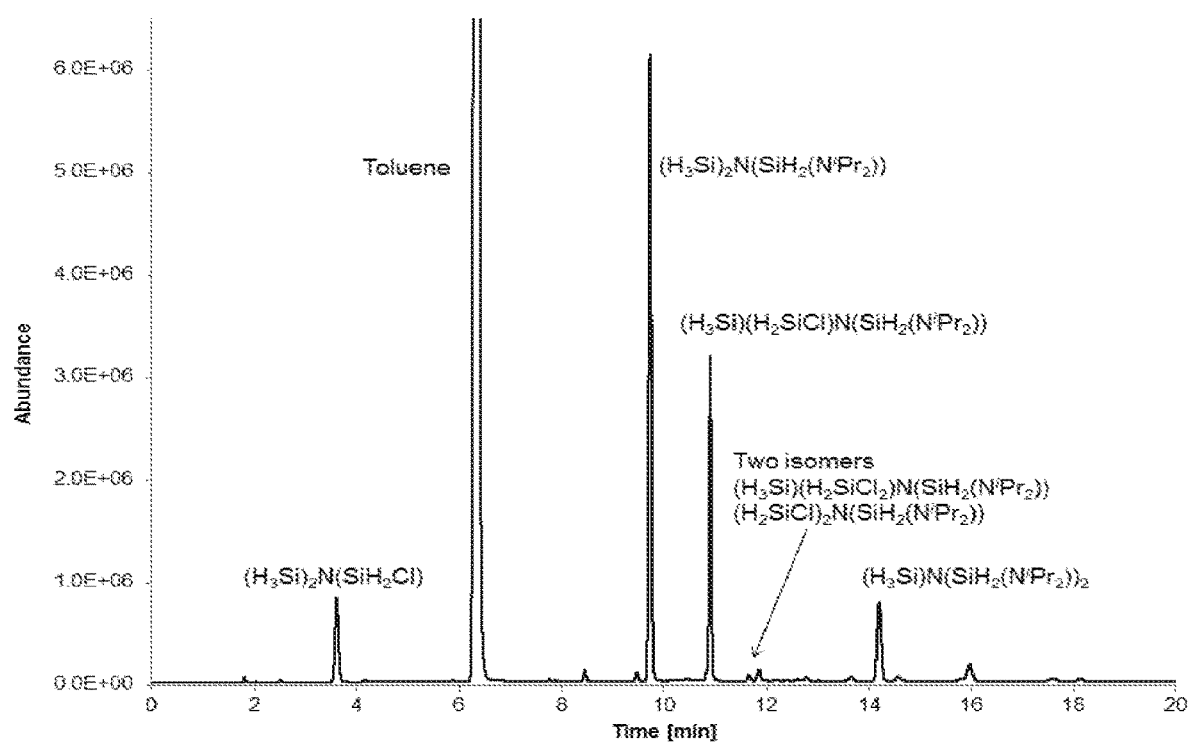
FIG. 17 is a GC chromatogram of reaction mixture after chlorination of $(H_3Si)_2N(SiH_2(N^iPr_2))$.

Observed in mass spectrum patterns of molecular ion assigned to $(H_3SiCl)N(SiH_2(N^iPr_2))_2$ are similar to calculated ones for $[Cl_2H_{34}N_3Si_3C_1]^+$ (m/Z=339). MS $(H_3SiCl)N(SiH_2(N^iPr_2))_2$: 339 [M]$^+$ (1%), 324 [M-Me]$^T$(1%), 296 [M-$^i$Pr]$^+$ (1%), 239 [M-NiPr$_2$]$^+$ (70%), 223 [M-CH$_4$—NiPr$_2$]$^+$ overlapped with 225 [M-NC$_7$H$_{16}$]$^+$ (30), 195 [M-N$^i$Pr$_2$—H$^i$Pr]$^+$ (100), 181 [M-N$^i$Pr$_2$-$^i$Pr-Me]$^+$ (40). FIG. 17 GC Chromatogram of reaction mixture after chlorination of $(H_3Si)_2N(SiH_2(N^iPr_2))$.

Example 16. Chlorination of $(H_3Si)_2N(SiH_2(NEt_2))$

Preparation followed the procedure shown in Example 7.2. New compounds, $(H_3Si)(H_2SiCl)N(SiH_2(NEt_2))$, $(H_2SiCl)_2N(SiH_2(NEt_2))$ and $(H_2SiCl)N(SiH_2(NEt_2))_2$, are synthesized herein as a result of application of the disclosed method for selective chlorination of aminosilanes with Ph$_3$CCl and applying a catalyst.

Reactions started with mixing $(H_3Si)_2N(SiH_2(NEt_2))$ (1.98 g, 11.1 mmol), Ph$_3$CCl (2.16 g, 7.75 mmol), Pd/C (0.42 g, 10% Pd, 0.4 mmol), toluene (7 g). CG of the filtered reaction mixture is $(H_3Si)_3N$ (0.13%), $(H_3Si)_2N(SiH_2Cl)$ (3.83%), toluene (82.02%), $(H_3Si)_2N(SiH_2(NEt_2))$ (7.87%), $(H_3Si)(H_2SiCl)N(SiH_2(NEt_2))$ (1.92%), $(H_2SiCl)_2N(SiH_2(NEt_2))$ (0.17%), $(H_3Si)N(SiH_2(NEt_2))_2$ (0.41%), $(H_2SiCl)N(SiH_2(NEt_2))_2$ (0.19%) and Ph$_3$CH (3.05%). The yield of $(H_3Si)(H_2SiCl)N(SiH_2(NEt_2))$ is 21% from $(H_3Si)_2N(SiH_2(NEt_2))$ assuming that chlorination proceeds by equation: $3(H_3Si)_2N(SiH_2(NEt_2))+2Ph_3CCl=(H_3Si)(H_2SiCl)N(SiH_2(NEt_2))+(H_3Si)_2N(SiH_2Cl)+(H_3Si)N(SiH_2(NEt_2))_2+Ph_3CH$.

i. Compound $(H_3Si)(H_2SiC)N(SiH_2(NEt_2))$.

Observed in mass spectrum patterns of molecular ion assigned to $(H_3Si)(H_2SiCl)N(SiH_2(NEt_2))$ are similar to calculated ones for $[C_4H_{17}N_2Si_3Cl]^+$ (m/z=212). MS $(H_3Si)(H_2SiCl)N(SiH_2(NEt_2))$: 212 [M]$^+$ overlapped with 211 [M-H]$^+$ (15%), 197 [M-Me]$^+$ (100%), 183 [M-Et]$^+$ (8%), 167 [M-CH$_4$-Et]$^+$ (10) and 140 [M-NEt$_2$]$^+$ (30).

ii. Compound $(H_2SiCl)_2N(SiH_2(NEt_2))$.

Observed in mass spectrum patterns of molecular ion assigned to $(H_2SiCl)_2N(SiH_2(NEt_2))$ are similar to calculated ones for $[C_4H_{17}N_2Si_3Cl]^+$ (m/z=246). MS $(H_2SiCl)_2N(SiH_2(NEt_2))$: 246 [M]$^+$ overlapped with 245 [M-H]$^+$ (11%), 231 [M-Me]$^+$ (100%), 217 [M-Et]$^+$ (10), 208 [M-H—HCl]$^+$ (15), 203 [M-NEt$_2$]$^+$ (15), 174 [M-NEt$_2$]$^+$ (35) and 134 [M-SiH$_3$Cl—C$_3$H$_8$—H$_2$]$^+$ (50).

iii. Compound $(H_2SiCl)N(SiH_2(NEt_2))_2$.

Observed in mass spectrum patterns of molecular ion assigned to $(H_2SiCl)N(SiH_2(NEt_2))_2$ are similar to calculated ones for $[C_8H_{26}N_3Si_3Cl]^+$ (m/z=283). MS $(H_2SiCl)N(SiH_2(NEt_2))_2$: 283 [M]$^+$ overlapped with 282 [M-H]$^+$ (10%), 211 [M-NEt$_2$]+(100), 197 [M-2NEt]$^+$ overlapped with 195 [M-CH$_4$-NEt$_2$]$^+$ (35%), 181 [M-HEt-NEt$_2$]$^+$ (30), 167 [M-Me-Et-NEt$_2$]$^+$ (30) and 140 [M-NC$_4$H$_9$-NEt$_2$]$^+$ (20).

It will be understood that many additional changes in the details, materials, steps, and arrangement of parts, which have been herein described and illustrated in order to explain the nature of the invention, may be made by those skilled in the art within the principle and scope of the invention as expressed in the appended claims. Thus, the present invention is not intended to be limited to the specific embodiments in the examples given above and/or the attached drawings.

While embodiments of this invention have been shown and described, modifications thereof may be made by one skilled in the art without departing from the spirit or teaching of this invention. The embodiments described herein are exemplary only and not limiting. Many variations and modifications of the composition and method are possible and within the scope of the invention. Accordingly the scope of protection is not limited to the embodiments described herein, but is only limited by the claims which follow, the scope of which shall include all equivalents of the subject matter of the claims.

What is claimed is:

1. A Si-containing film forming composition comprising a halosilazane precursor selected from the group consisting of $(H_3Si)N(SiH_2Br)_2$, $(H_3Si)N(SiH_2Cl)_2$, $(H_3Si)(H_2SiCl)N(SiH_2(N^iPr_2))$, $(H_3Si)(H_2SiBr)N(SiH_2(N^iPr_2))$, $(H_3Si)(H_2SiI)N(SiH_2(N^iPr_2))$, $(H_3Si)(H_2SiCl)N(SiH_2(NEt_2))$, $(H_3Si)(H_2SiBr)N(SiH_2(NEt_2))$, $(H_3Si)(H_2SiI)N(SiH_2(NEt_2))$, $(H_2SiCl)_2N(SiH_2(N^iPr_2))$, $(H_3SiCl)N(SiH_2(N^iPr_2))_2$, $(H_2SiCl)N(SiH_2(NEt_2))_2$, $(H_3Si)_2N(SiH_2)N(SiH_3)(SiH_2Cl)$, $(H_3Si)_2N(SiH_2)N(SiH_3)(SiH_2Br)$ and $(H_3Si)_2N(SiH_2)N(SiH_3)(SiH_2I)$.

2. A method for forming a Si-containing film, the method comprising the steps of:
introducing into a reactor containing a substrate a vapor including a halosilazane precursor selected from the group consisting of $(H_3Si)N(SiH_2Br)_2$, $(H_3Si)N(SiH_2Cl)_2$, $(H_3Si)(H_2SiCl)N(SiH_2(N^iPr_2))$, $(H_3Si)(H_2SiBr)N(SiH_2(N^iPr_2))$, $(H_3Si)(H_2SiI)N(SiH_2(N^iPr_2))$, $(H_3Si)(H_2SiCl)N(SiH_2(NEt_2))$, $(H_3Si)(H_2SiBr)N(SiH_2(NEt_2))$, $(H_3Si)(H_2SiI)N(SiH_2(NEt_2))$, $(H_2SiCl)_2N(SiH_2(N^iPr_2))$, $(H_3SiCl)N(SiH_2(N^iPr_2))_2$, $(H_2SiCl)N(SiH_2(NEt_2))_2$, $(H_3Si)_2N(SiH_2)N(SiH_3)(SiH_2Cl)$, $(H_3Si)_2N(SiH_2)N(SiH_3)(SiH_2Br)$ or $(H_3Si)_2N(SiH_2)N(SiH_3)(SiH_2I)$; and depositing at least part of the halosilazane precursor onto the substrate to form the silicon-containing film on the substrate using a vapor deposition process.

3. The method of claim 2, further comprising the step of delivering into the reactor a co-reactant, wherein the co-reactant is selected from the group consisting of $O_2$, $O_3$, $H_2O$, $H_2O_2$, NO, $NO_2$, $N_2O$, alcohols, diols, carboxylic acids, ketones, ethers, O atoms, O radicals, O ions, ammonia, $N_2$, N atoms, N radicals, N ions, saturated or unsaturated hydrazine, amines, diamines, ethanolamine, $H_2$, H atoms, H radicals, H ions, and combinations thereof.

4. The method of claim 2, further comprising the step of delivering into the reactor a second vapor including a second precursor, wherein an element of the second precursor is selected from the group consisting of Ti, Hf, Zr, Ta, Nb, V, Al, Sr, Y, Ba, Ca, As, B, P, Sb, Bi, Sn, Ge, and combinations thereof.

5. A method for halogenation of a hydrosilazane to produce a halosilazane, the methods comprising the step of
  contacting the hydrosilazane with a halogenating agent in a liquid phase to produce the halosilazane, the halosilazane having a formula

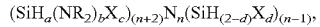

wherein each a, b, c is independently 0 to 3; a+b+c=3; d is 0 to 2 and n≥1; wherein X is selected from a halogen atom selected from F, Cl, Br or I; each R is selected from H, a $C_1$-$C_6$ linear or branched, saturated or unsaturated hydrocarbyl group, or a silyl group $[SiR'_3]$; further wherein each R' of the $[SiR'_3]$ is independently selected from H, a halogen atom selected from F, Cl, Br or I, a $C_1$-$C_4$ saturated or unsaturated hydrocarbyl group, a $C_1$-$C_4$ saturated or unsaturated alkoxy group, or an amino group $[-NR^1R^2]$ with each $R^1$ and $R^2$ being further selected from H or a $C_1$-$C_6$ linear or branched, saturated or unsaturated hydrocarbyl group, provided that when c=0, d≠0; or d=0, c≠0;
  wherein the contacting step includes the steps of
    adding the halogenating agent into a solvent to form a solution of the halogenating agent;
    adding a catalyst to the solution of the halogenation agent, wherein the catalyst is a homogeneous catalyst selected from $BPh_3$ or $B(SiMe_3)_3$ or a heterogeneous catalyst selected from Ru, Pt or Pd in elemental form or deposited on an inert support surface.

6. The method of claim 5, further comprising the steps of mixing the solution of the halogenating agent with the hydrosilazane to form a mixture; and
  separating the halosilazane from the mixture, wherein the halosilazane is produced by selective halogenation of the hydrosilazane that has a general formula $(SiH_a(NR_2)_b)_{(n+2)}N_n(SiH_2)_{(n-1)}$, wherein each a, b, c is independently 0 to 3; a+b+c=3; d is 0 to 2 and n≥1; wherein X is selected from a halogen atom selected from F, Cl, Br or I; each R is selected from H, a $C_1$-$C_6$ linear or branched, saturated or unsaturated hydrocarbyl group, or a silyl group $[SiR'_3]$; further wherein each R' of the $[SiR'_3]$ is independently selected from H, a halogen atom selected from F, Cl, Br or I, a $C_1$-$C_4$ saturated or unsaturated hydrocarbyl group, a $C_1$-$C_4$ saturated or unsaturated alkoxy group, or an amino group $[-NR^1R^2]$ with each $R^1$ and $R^2$ being further selected from H or a $C_1$-$C_6$ linear or branched, saturated or unsaturated hydrocarbyl group.

7. The method of claim 6, further comprising the step of stirring the mixture while monitoring the halogenation.

8. The method of claim 5, wherein the molar ratio of the halogenating agent relative to the hydrosilazane is from 1 to 100% for selective synthesis of the halosilazane.

9. The method of claim 8, wherein the halogenating agent is a trityl halide selected from $Ph_3CX$ (X=F, Cl, Br or I).

10. The method of claim 6, wherein the solvent is selected from methylene chloride, chloroform, chloroethanes, chlorobenzenes, toluene, xylene, mesitylene, anisole, pentane, hexane, heptane, octane or mixtures thereof.

11. The method of claim 5, wherein the temperature of the halogenation ranges from approximately 20° C. to approximately 200° C.

12. The method of claim 5, wherein the pressure of the halogenation is from approximately 0 psig to approximately 50 psig.

13. The method of claim 5, wherein a yield of halogenation of the hydrosilazane ranges from approximately 30% to approximately 90%.

14. The method of claim 5, wherein a selectivity of halogenation of the hydrosilazane is up to approximately 97%.

15. The method of claim 5, wherein each R is H and therefore the halosilazanes precursors are carbon-free halosilazanes precursors have a formula

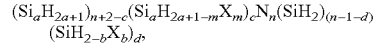

where X is selected from a halogen atom selected from F, Cl, Br or I; a, n 1, 0<m<2a+1 and b=0-2, 0<c<n+2 and 0 d<n−1.

16. The method of claim 5, wherein the halosilazane is selected from $(H_3Si)_2N(SiH_2Cl)$, $(H_3Si)N(SiH_2Br)_2$, $(H_3Si)_2N(SiH_2I)$, $(H_3Si)N(SiH_2Cl)_2$, $(H_3Si)(H_2SiCl)N(SiH_2(N^iPr_2))$, $(H_3Si)(H_2SiBr)N(SiH_2(N^iPr_2))$, $(H_3Si)(H_2SiI)N(SiH_2(N^iPr_2))$, $(H_3Si)(H_2SiCl)N(SiH_2(NEt_2))$, $(H_3Si)(H_2SiBr)N(SiH_2(NEt_2))$, $(H_3Si)(H_2SiI)N(SiH_2(NEt_2))$, $(H_2SiCl)_2N(SiH_2(N^iPr_2))$, $(H_2SiCl)N(SiH_2(NEt_2))_2$, $(H_3Si)_2N(SiH_2)N(SiH_3)(SiH_2Cl)$, $(H_3Si)_2N(SiH_2)N(SiH_3)(SiH_2Br)$ or $(H_3Si)_2N(SiH_2)N(SiH_3)(SiH_2I)$.

* * * * *